US008330555B2

(12) United States Patent
Yoshikawa et al.

(10) Patent No.: US 8,330,555 B2
(45) Date of Patent: Dec. 11, 2012

(54) BANDPASS FILTER, AND WIRELESS COMMUNICATION MODULE AND WIRELESS COMMUNICATION APPARATUS WHICH EMPLOY THE BANDPASS FILTER

(75) Inventors: Hiromichi Yoshikawa, Kirishima (JP); Shinji Isoyama, Setagaya-ku (JP); Katsuro Nakamata, Kirishima (JP)

(73) Assignee: Kyocera Corporation, Kyoto (JP)

( * ) Notice: Subject to any disclaimer, the term of this patent is extended or adjusted under 35 U.S.C. 154(b) by 473 days.

(21) Appl. No.: 12/675,729

(22) PCT Filed: Aug. 29, 2008

(86) PCT No.: PCT/JP2008/065600
§ 371 (c)(1),
(2), (4) Date: Feb. 26, 2010

(87) PCT Pub. No.: WO2009/028691
PCT Pub. Date: Mar. 5, 2009

(65) Prior Publication Data

US 2010/0219915 A1 Sep. 2, 2010

(30) Foreign Application Priority Data

| | | |
|---|---|---|
| Aug. 29, 2007 | (JP) | 2007-222976 |
| Oct. 29, 2007 | (JP) | 2007-279856 |
| Oct. 29, 2007 | (JP) | 2007-279857 |
| Mar. 26, 2008 | (JP) | 2008-080827 |
| Mar. 26, 2008 | (JP) | 2008-080828 |
| Mar. 26, 2008 | (JP) | 2008-080829 |

(51) Int. Cl.
*H01P 1/20* (2006.01)
*H03H 7/00* (2006.01)

(52) U.S. Cl. .................................... 333/185; 333/204

(58) Field of Classification Search .................. 333/185, 333/202, 203, 204, 205
See application file for complete search history.

(56) References Cited

U.S. PATENT DOCUMENTS

| | | | | |
|---|---|---|---|---|
| 5,191,305 | A | 3/1993 | Frost et al. | 333/202 |
| 5,608,364 | A * | 3/1997 | Hirai et al. | 333/204 |
| 5,926,466 | A | 7/1999 | Ishida et al. | 370/280 |
| 6,147,571 | A | 11/2000 | Kitazawa et al. | 333/126 |
| 6,294,967 | B1 * | 9/2001 | Hirai et al. | 333/202 |
| 6,437,665 | B1 * | 8/2002 | Kato | 333/185 |
| 7,348,868 | B2 * | 3/2008 | Urano et al. | 333/204 |
| 7,679,475 | B2 * | 3/2010 | Yoshikawa | 333/204 |
| 7,902,944 | B2 * | 3/2011 | Fukunaga | 333/203 |
| 2009/0140827 | A1 | 6/2009 | Yoshikawa | 333/176 |

FOREIGN PATENT DOCUMENTS

| | | |
|---|---|---|
| JP | 05-055809 | 3/1993 |
| JP | 08-321738 | 12/1996 |
| JP | 2000-516060 | 11/2000 |
| JP | 2004-180032 | 6/2004 |
| JP | 2007-318661 | 12/2007 |
| JP | 2008-118615 | 5/2008 |

* cited by examiner

*Primary Examiner* — Dean O Takaoka
*Assistant Examiner* — Alan Wong
(74) *Attorney, Agent, or Firm* — DLA Piper LLP (US)

(57) ABSTRACT

An ultra-wideband bandpass filter having two adequately-wide pass bands, and a wireless communication module and a wireless communication apparatus which employ the band-pass filter are provided. In a bandpass filter, first resonant electrodes are arranged on a first interlayer of a multilayer body in an interdigital form; a plurality of second resonant electrodes are arranged on a second interlayer in an interdigital form; and an input coupling electrode and an output coupling electrode are arranged on a third interlayer located between the first interlayer and the second interlayer. The input coupling electrode faces an input-stage first resonant electrode and an input-stage second resonant electrode in an interdigital form. The output coupling electrode faces an output stage first resonant electrode and an output-stage second resonant electrode in an interdigital form.

24 Claims, 45 Drawing Sheets

BANDPASS FILTER, AND WIRELESS COMMUNICATION MODULE AND WIRELESS COMMUNICATION APPARATUS WHICH EMPLOY THE BANDPASS FILTER

CROSS-REFERENCE TO THE RELATED APPLICATIONS

This application is a national stage of international application No. PCT/JP2008/065600, filed on Aug. 29, 2008, and claims the benefit of priority under 35 USC 119 to Japanese Patent Application No. 2007-222976, filed on Aug. 29, 2007, Japanese Patent Application No. 2007-279856, filed on Oct. 29, 2007, Japanese Patent Application No. 2007-279857, filed on Oct. 29, 2007, Japanese Patent Application No. 2008-080827, filed on Mar. 26, 2008, Japanese Patent Application No. 2008-080828, filed on Mar. 26, 2008 and Japanese Patent Application No. 2008-080829, filed on Mar. 26, 2008, the entire contents of all of which are incorporated herein by reference

TECHNICAL FIELD

The present invention relates to a bandpass filter, and a wireless communication module and a wireless communication apparatus which employ the bandpass filter, and more particularly relates to a bandpass filter having two extremely wide pass bands suitable for use in UWB (Ultra Wide Band) system, and a wireless communication module and a wireless communication apparatus which employ the bandpass filter.

BACKGROUND ART

Attention has recently been given to the UWB as new means of communication. The UWB allows transmission of large-volume data by exploiting a wide range of frequencies in a distance as short as approximately 10 m. For example, according to the definition specified by the FCC (Federal Communication Commission) of the United States, the planned usable frequency band falls in a range of from 3.1 Ghz to 10.6 Ghz. That is, the OWE is characterized by using an extremely wide frequency band.

Recent years have seen active studies and researches on ultra-wideband filters applicable to such an UWB. For example, there is a report saying that a bandpass filter based on the principle of a directional coupler has succeeded in obtaining broadband characteristics of providing a pass band width which exceeds 100% in terms of fractional bandwidth (bandwidth/center frequency) (for example, refer to the nonpatent literature "Ultra-wideband Bandpass Filters Using Microstrip-CPW Broadside-Coupled Structure" excerpted from the collection of conference papers dated March, 2005 (C-2-114 p. 147) published by the Institute of Electronics, Information and Communication Engineers).

Meanwhile, as a commonly-used conventional filter, there is known a bandpass filter constructed by coupling together a plurality of juxtaposed quarter-wavelength strip line resonators (for example, refer to Japanese Unexamined Patent Publication JP-A 2004-180032).

However, both of the bandpass filter proposed in the nonpatent literature and the bandpass filter proposed in JP-A 2004-180032 pose some problems and are thus unsuitable for use as a bandpass filter for the UWB.

For example, a problem encountered in the bandpass filter proposed in the nonpatent literature is that the pass band width is too wide. More specifically, the UWB basically utilizes frequency bands ranging from 3.1 Ghz to 10.6 Ghz, and this has led the ITU-R (International Telecommunication Union Radiocommunications Sector) to devise a plan to divide the UWB bandwidth into "Low Band" using bandwidths ranging from 3.1 Ghz to approximately 4.7 Ghz and "High Band" using bandwidths ranging from approximately 6 Ghz to 10.6 Ghz in order to avoid the use of "5.3 Ghz" adopted in the IEEE 802.11.a standard. Hence, in a filter for use in each of the Low Band and the High Band of the UWB, it is required that there be both a pass band width of approximately 40% to 50% in terms of fractional bandwidth and occurrence of attenuation at 5.3 GHz. After all, the bandpass filter proposed in the nonpatent literature 1 having the characteristics of offering a pass band width which exceeds 100% in terms of fractional bandwidth is too wide in pass band width to be suitably used.

On the other hand, a conventional quarter-wavelength resonator-using bandpass filter has a too narrow pass band width. Even in the bandpass filter disclosed in JP-A 2004-180032 that has been devised to achieve widening of bandwidth, the pass band width is less than 10% in terms of fractional bandwidth. After all, this bandpass filter is also unsuitable for use as a UWB-adaptive bandpass filter which is required to offer a pass band width as wide as 40% to 50% in terms of fractional bandwidth.

DISCLOSURE OF INVENTION

The invention has been devised in view of the aforestated problems associated with the conventional art, and accordingly its object is to provide an ultra-wideband bandpass filter having two adequately wide pass bands that allows the shared use of a single filter between the Low Band and the High Band of the UWB, as well as to provide a wireless communication module and a wireless communication apparatus which employ the bandpass filter.

Another object of the invention is to provide a bandpass filter allowing the shared use of a single filter between the Low Band and the High Band of the UWB while achieving satisfactory input impedance matching with a low insertion loss over an entire regions of two extremely wide pass bands, as well as to provide a wireless communication module and a wireless communication apparatus which employ the bandpass filter.

Still another object of the invention is to provide a bandpass filter having two extremely wide pass bands allowing the shared use of a single filter between the Low Band and the High Band of the UWB and formation of an attenuation pole in the vicinity of the pass band, s well as to provide a wireless communication module and a wireless communication apparatus which employ the bandpass filter.

A bandpass filter of the invention comprises a multilayer body, a first ground electrode, a second ground electrode, a plurality of strip-like first resonant electrodes, a plurality of strip-like second resonant electrodes, a strip-like input coupling electrode, and a strip-like output coupling electrode. The multilayer body has a stack of a plurality of dielectric layers on top of each other. The first ground electrode is disposed on a lower face of the multilayer body and is connected to a ground potential. The second ground electrode is disposed on an upper face of the multilayer body and is connected to a ground potential. The plurality of first resonant electrodes are arranged side by side on a first interlayer of the multilayer body for mutual electromagnetic-field coupling, with their one ends connected to a ground potential so as to serve as a quarter-wavelength resonator. The plurality of second resonant electrodes are arranged side by side on a second interlayer of the multilayer body different from the first interlayer for mutual electromagnetic-field coupling, with their one ends connected to a ground potential so as to serve as a quarter-wavelength resonator which resonates at a frequency higher than a frequency at which the first resonant electrode resonates. The input coupling electrode is disposed on a third interlayer of the multilayer body located between the first interlayer and the second interlayer. The input coupling electrode faces an input-stage first resonant electrode of the plurality of first resonant electrodes, over more than half of an entire longitudinal area thereof for electromagnetic-field coupling, faces an input-stage second resonant electrode of the plurality of second resonant electrodes, over more than half of an entire longitudinal area thereof for electromagnetic-field coupling, and has an electric signal input point for receiving input of an electric signal from an external circuit. The output coupling electrode is disposed on the third interlayer of the multilayer body. The output coupling electrode faces an output-stage first resonant electrode of the plurality of first resonant electrodes, over more than half of an entire longitudinal area thereof for electromagnetic-field coupling, faces an output-stage second resonant electrode of the plurality of second resonant electrodes, over more than half of an entire longitudinal area thereof for electromagnetic-field coupling, and has an electric signal output point for producing output of an electric signal toward the external circuit. The one end of the input-stage first resonant electrode and the one end of the input-stage second resonant electrode are located on a same side. The one end of the output-stage first resonant electrode and one end of the output-stage second resonant electrode are located on a same side. In the input coupling electrode as seen in its longitudinal direction, the electric signal input point is disposed at a part that lies nearer the other end of the input-stage first resonant electrode than a center of a part facing the input-stage first resonant electrode and also lies nearer the other end of the input-stage second resonant electrode than a center of a part facing the input-stage second resonant electrode. In the output coupling electrode as seen in its longitudinal direction, the electric signal output point is disposed at a part that lies nearer the other end of the output-stage first resonant electrode than a center of a part facing the output-stage first resonant electrode and also lies nearer the other end of the output-stage second resonant electrode than a center of a part facing the output-stage second resonant electrode.

A bandpass filter of the invention comprises a multilayer body, a first ground electrode, a second ground electrode, a plurality of strip-like first resonant electrodes, a plurality of strip-like second resonant electrodes, a composite input coupling electrode, and a composite output coupling electrode. The multilayer body has a stack of a plurality of dielectric layers on top of each other. The first ground electrode is disposed on a lower face of the multilayer body. The second ground electrode is disposed on an upper face of the multilayer body. The plurality of first resonant electrodes are arranged side by side on a first interlayer of the multilayer body for mutual electromagnetic-field coupling, with their one ends connected to ground so as to serve as a quarter-wavelength resonator. The plurality of second resonant electrodes are arranged side by side on a second interlayer of the multilayer body different from the first interlayer for mutual electromagnetic-field coupling, with their one ends connected to ground so as to serve as a quarter-wavelength resonator which resonates at a frequency higher than a frequency at which the first resonant electrode resonates. The composite input coupling electrode comprises: a strip-like first input coupling electrode which is disposed on a third interlayer of the multilayer body located between the first interlayer and the second interlayer, and faces an input-stage first resonant electrode of the plurality of first resonant electrodes, over more than half of an entire longitudinal area thereof; a strip-like second input coupling electrode which is disposed on a fourth interlayer of the multilayer body located between the second interlayer and the third interlayer, and faces an input-stage second resonant electrode of the plurality of second resonant electrodes, over more than half of an entire longitudinal area thereof; and an input-side connection conductor for providing connection between the first input coupling electrode and the second input coupling electrode. The composite input coupling electrode makes electromagnetic-field coupling with the input-stage first resonant electrode and the input-stage second resonant electrode, and has an electric signal input point for receiving input of an electric signal from an external circuit. The composite output coupling electrode comprises: a strip-like first output coupling electrode which is disposed on the third interlayer of the multilayer body, and faces an output-stage first resonant electrode of the plurality of first resonant electrodes, over more than half of an entire longitudinal area thereof; a strip-like second output coupling electrode which is disposed on the fourth interlayer of the multilayer body, and faces an output-stage second resonant electrode of the plurality of second resonant electrodes, over more than half of an entire longitudinal area thereof; and an output-side connection conductor for providing connection between the first output coupling electrode and the second output coupling electrode. The composite output coupling electrode makes electromagnetic-field coupling with the output-stage first resonant electrode and the output-stage second resonant electrode, and has an electric signal output point for producing output of an electric signal from the external circuit. The one end of the input-stage first resonant electrode and the one end of the input-stage second resonant electrode are located on a same side. The one end of the output-stage first resonant electrode and the one end of the output-stage second resonant electrode are located on a same side. In the composite input coupling electrode as seen in its longitudinal direction, the electric signal input point and the input-side connection conductor are located at a part that lies nearer the other end of the input-stage first resonant electrode than a center of a part facing the input-stage first resonant electrode and also lies nearer the other end of the input-stage second resonant electrode than a center of a part facing the input-stage second resonant electrode. In the composite output coupling electrode as seen in its longitudinal direction, the electric signal output point and the output-side connection conductor are located at a part that lies nearer the other end of the output-stage first resonant electrode than a center of a part facing the output-stage first resonant electrode and also lies nearer the other end of the output-stage second resonant electrode than a center of a part facing the output-stage second resonant electrode.

A bandpass filter of the invention comprises a multilayer body, a first ground electrode, a second ground electrode, four or more strip-like first resonant electrodes, four or more strip-like second resonant electrodes, a strip-like input coupling electrode, a strip-like output coupling electrode, and a first resonant electrode coupling conductor. The multilayer body has a stack of a plurality of dielectric layers on top of each other. The first ground electrode is disposed on a lower face of the multilayer body. The second ground electrode is disposed on an upper face of the multilayer body. The first resonant electrodes are arranged side by side on a first interlayer of the multilayer body, with their one ends as well as the other ends displaced in relation to each other in a staggered manner, have their one ends connected to ground so as to serve as a quarter-wavelength resonator, and make electromagnetic-field coupling with each other. The second resonant electrodes are arranged side by side on a second interlayer of the multilayer body different from the first interlayer, with their one ends as well as the other ends displaced in relation to each other in a staggered manner, have their one ends connected to ground so as to serve as a quarter-wavelength resonator which resonates at a frequency higher than a frequency at which the first resonant electrode resonates, and make electromagnetic-field coupling with each other. The input coupling electrode is disposed on a third interlayer of the multilayer body located between the first interlayer and the second interlayer. The input coupling electrode faces an input-stage first resonant electrode of the four or more first resonant electrodes, over more than half of an entire longitudinal area thereof for electromagnetic-field coupling, faces an input-stage second resonant electrode of the four or more second resonant electrodes, over more than half of an entire longitudinal area thereof for electromagnetic-field coupling, and has an electric signal input point for receiving input of an electric signal from an external circuit. The output coupling electrode is disposed on the third interlayer of the multilayer body. The output coupling electrode faces an output-stage first resonant electrode of the four or more first resonant electrodes, over more than half of an entire longitudinal area thereof for electromagnetic-field coupling, faces an output-stage second resonant electrode of the four or more second resonant electrodes, over more than half of an entire longitudinal area thereof for electromagnetic-field coupling, and has an electric signal output point for producing output of an electric signal toward the external circuit. The first resonant electrode coupling conductor is disposed on a fourth interlayer of the multilayer body which is arranged on an opposite side of the third interlayer with the first interlayer interposed therebetween. The first resonant electrode coupling conductor has its one end connected to ground close to one end of a frontmost-stage first resonant electrode constituting a first resonant electrode group composed of adjoining first resonant electrodes, the sum of which is an even number greater than or equal to four, and has its other end connected to ground close to one end of a rearmost-stage first resonant electrode constituting the first resonant electrode group, and also includes a region facing the one end side of the frontmost-stage first resonant electrode for electromagnetic-field coupling and a region facing the one end side of the rearmost-stage first resonant electrode for electromagnetic-field coupling. The one end of the input-stage first resonant electrode and the one end of the input-stage second resonant electrode are located on a same side. The one end of the output-stage first resonant electrode and the one end of the output-stage second resonant electrode are located on a same side. In the input coupling electrode as seen in its longitudinal direction, the electric signal input point is disposed at a part that lies nearer the other end of the input-stage first resonant electrode than a center of a part facing the input-stage first resonant electrode and also lies nearer the other end of the input-stage second resonant electrode than a center of a part facing the input-stage second resonant electrode. In the output coupling electrode as seen in its longitudinal direction, the electric signal output point is disposed at the part that lies nearer the other end of the output-stage first resonant electrode than a center of a part facing the output-stage first resonant electrode and also lies nearer the other end of the output-stage second resonant electrode than a center of the part facing the output-stage second resonant electrode.

A bandpass filter of the invention comprises a multilayer body, a first ground electrode, a second ground electrode, four or more strip-like first resonant electrodes, four or more strip-like second resonant electrodes, a strip-like input coupling electrode, a strip-like output coupling electrode, and a second resonant electrode coupling conductor. The multilayer body has a stack of a plurality of dielectric layers on top of each other. The first ground electrode is disposed on a lower face of the multilayer body. The second ground electrode is disposed on an upper face of the multilayer body. The first resonant electrodes are arranged side by side on a first interlayer of the multilayer body, with their one ends as well as the other ends displaced in relation to each other in a staggered manner, have their one ends connected to ground so as to serve as a quarter-wavelength resonator, and make electromagnetic-field coupling with each other. The second resonant electrodes are arranged side by side on a second interlayer of the multilayer body different from the first interlayer, with their one ends as well as the other ends displaced in relation to each other in a staggered manner, have their one ends connected to ground so as to serve as a quarter-wavelength resonator which resonates at a frequency higher than a frequency at which the first resonant electrode resonates, and make electromagnetic-field coupling with each other. The input coupling electrode is disposed on a third interlayer of the multilayer body located between the first interlayer and the second interlayer. The input coupling electrode faces an input-stage first resonant electrode of the four or more first resonant electrodes, over more than half of an entire longitudinal area thereof for electromagnetic-field coupling, faces an input-stage second resonant electrode of the four or more second resonant electrodes, over more than half of an entire longitudinal area thereof for electromagnetic-field coupling, and has an electric signal input point for receiving input of an electric signal from an external circuit. The output coupling electrode is disposed on the third interlayer of the multilayer body. The output coupling electrode faces, an output-stage first resonant electrode of the four or more first resonant electrodes, over more than half of an entire longitudinal area thereof for electromagnetic-field coupling, faces an output-stage second resonant electrode of the four or more second resonant electrodes, over more than half of an entire longitudinal area thereof for electromagnetic-field coupling, and has an electric signal output point for producing output of an electric signal toward the external circuit. The second resonant electrode coupling conductor is disposed on a fifth interlayer of the multilayer body which is arranged on an opposite side of the third interlayer with the second interlayer interposed therebetween. The second resonant electrode coupling conductor has its one end connected to ground close to one end of a frontmost-stage second resonant electrode constituting a second resonant electrode group composed of adjoining second resonant electrodes, the sum of which is an even number greater than or equal to four, and has its other end connected to ground close to one end of a rearmost-stage second resonant electrode constituting the second resonant electrode group, and also includes a region facing the one end side of the frontmost-stage second resonant electrode for electromagnetic-field coupling and a region facing the one end side of the rearmost-stage second resonant electrode for electromagnetic-field coupling. The one end of the input-stage first resonant electrode and the one end of the input-stage second resonant electrode are located on a same side. The one end of the output-stage first resonant electrode and the one end of the output-stage second resonant electrode are located on a same side. In the input coupling electrode as seen in its longitudinal direction, the electric signal input point is disposed at a part that lies nearer the other end of the input-stage first resonant electrode than a center of a part facing the input-stage first resonant electrode and also lies nearer the other end of the input-stage second resonant electrode than a center of a part facing the input-stage second resonant electrode. In the output coupling electrode as seen in its longitudinal direction, the electric signal output point is disposed at a part that lies nearer the other end of the output-stage first resonant electrode than a center of a part facing the output-stage first resonant electrode and also lies nearer the other end of the output-stage second resonant electrode than a center of a part facing the output-stage second resonant electrode.

A bandpass filter of the invention comprises a multilayer body, a first ground electrode, a second ground electrode, four or more strip-like first resonant electrodes, four or more strip-like second resonant electrodes, a strip-like input coupling electrode, a strip-like output coupling electrode, a first resonant electrode coupling conductor, and a second resonant electrode coupling conductor. The multilayer body has a stack of a plurality of dielectric layers on top of each other. The first ground electrode is disposed on a lower face of the multilayer body. The second ground electrode is disposed on an upper face of the multilayer body. The first resonant electrodes are arranged side by side on a first interlayer of the multilayer body, with their one ends as well as the other ends displaced in relation to each other in a staggered manner, have their one ends connected to ground so as to serve as a quarter-wavelength resonator, and make electromagnetic-field coupling with each other. The second resonant electrodes are arranged side by side on a second interlayer of the multilayer body different from the first interlayer, with their one ends as well as the other ends displaced in relation to each other in a staggered manner, have their one ends connected to ground so as to serve as a quarter-wavelength resonator which resonates at a frequency higher than a frequency at which the first resonant electrode resonates, and make electromagnetic-field coupling with each other. The input coupling electrode is disposed on a third interlayer of the multilayer body located between the first interlayer and the second interlayer. The input coupling electrode faces an input-stage first resonant electrode of the four or more first resonant electrodes, over more than half of an entire longitudinal area thereof for electromagnetic-field coupling, faces an input-stage second resonant electrode of the four or more second resonant electrodes, over more than half of an entire longitudinal area thereof for electromagnetic-field coupling, and has an electric signal input point for receiving input of an electric signal from an external circuit. The output coupling electrode is disposed on the third interlayer of the multilayer body. The output coupling electrode faces an output-stage first resonant electrode of the four or more first resonant electrodes, over more than half of an entire longitudinal area thereof for electromagnetic-field coupling, faces an output-stage second resonant electrode of the four or more second resonant electrodes, over more than half of an entire longitudinal area thereof for electromagnetic-field coupling, and has an electric signal output point for producing output of an electric signal toward the external circuit. The first resonant electrode coupling conductor is disposed on a fourth interlayer of the multilayer body which is arranged on an opposite side of the third interlayer with the first interlayer interposed therebetween. The first resonant electrode coupling conductor has its one end connected to ground close to one end of a frontmost-stage first resonant electrode constituting a first resonant electrode group composed of adjoining first resonant electrodes, the sum of which is an even number greater than or equal to four, and has its other end connected to ground close to one end of a rearmost-stage first resonant electrode constituting the first resonant electrode group, and also includes a region facing the one end side of the frontmost-stage first resonant electrode for electromagnetic-field coupling and a region facing the one end side of the rearmost-stage first resonant electrode for electromagnetic-field coupling. The second resonant electrode coupling conductor is disposed on a fifth interlayer of the multilayer body which is arranged on an opposite side of the third interlayer with the second interlayer interposed therebetween. The second resonant electrode coupling conductor has its one end connected to ground close to one end of a frontmost-stage second resonant electrode constituting a second resonant electrode group composed of adjoining second resonant electrodes, the sum of which is an even number greater than or equal to four, and has its other end connected to ground close to one end of a rearmost-stage second resonant electrode constituting the second resonant electrode group, and also includes a region facing the one end side of the frontmost-stage second resonant electrode for electromagnetic-field coupling and a region facing the one end side of the rearmost-stage second resonant electrode for electromagnetic-field coupling. The one end of the input-stage first resonant electrode and the one end of the input-stage second resonant electrode are located on a same side. The one end of the output-stage first resonant electrode and the one end of the output-stage second resonant electrode are located on a same side. In the input coupling electrode as seen in its longitudinal direction, the electric signal input point is disposed at a part that lies nearer the other end of the input-stage first resonant electrode than a center of a part facing the input-stage first resonant electrode and also lies nearer the other end of the input-stage second resonant electrode than a center of a part facing the input-stage second resonant electrode. In the output coupling electrode as seen in its longitudinal direction, the electric signal output point is disposed at a part that lies nearer the other end of the output-stage first resonant electrode than a center of a part facing the output-stage first resonant electrode and also lies nearer the other end of the output-stage second resonant electrode than a center of a part facing the output-stage second resonant electrode.

A wireless communication module of the invention includes any one of the bandpass filters of the invention having the respective aforestated structures.

A wireless communication apparatus of the invention comprises an RF section including any one of the bandpass filters of the invention having the respective aforestated structures, a baseband section connected to the RF section, and an antenna connected to the RF section.

BRIEF DESCRIPTION OF DRAWINGS

Other and further objects, features, and advantages of the invention will be more explicit from the following detailed description taken with reference to the drawings wherein.

BEST MODE FOR CARRYING OUT THE INVENTION

Figure 1:
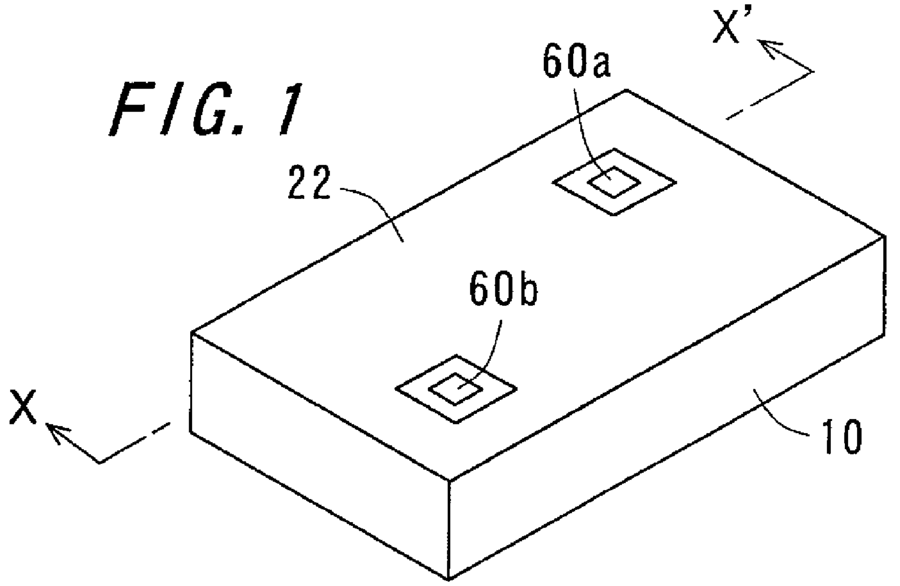
FIG. 1 is an external perspective view schematically showing a bandpass filter in accordance with a first embodiment of the invention.

Now referring to the drawings, a bandpass filter and a wireless communication module and wireless communication apparatus which employ the bandpass filter of the invention will be described in detail.

(First Embodiment)

Figure 2:
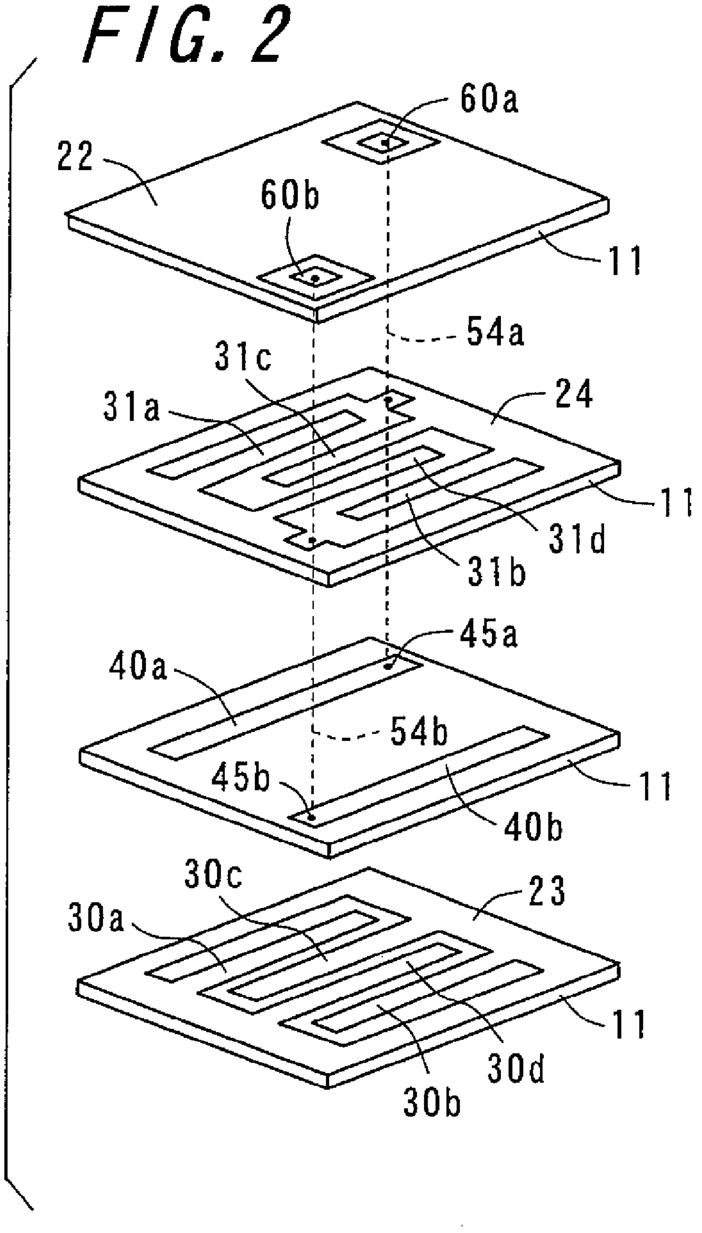
FIG. 2 is a schematic exploded perspective view of the bandpass filter shown in FIG. 1.
Figure 3:
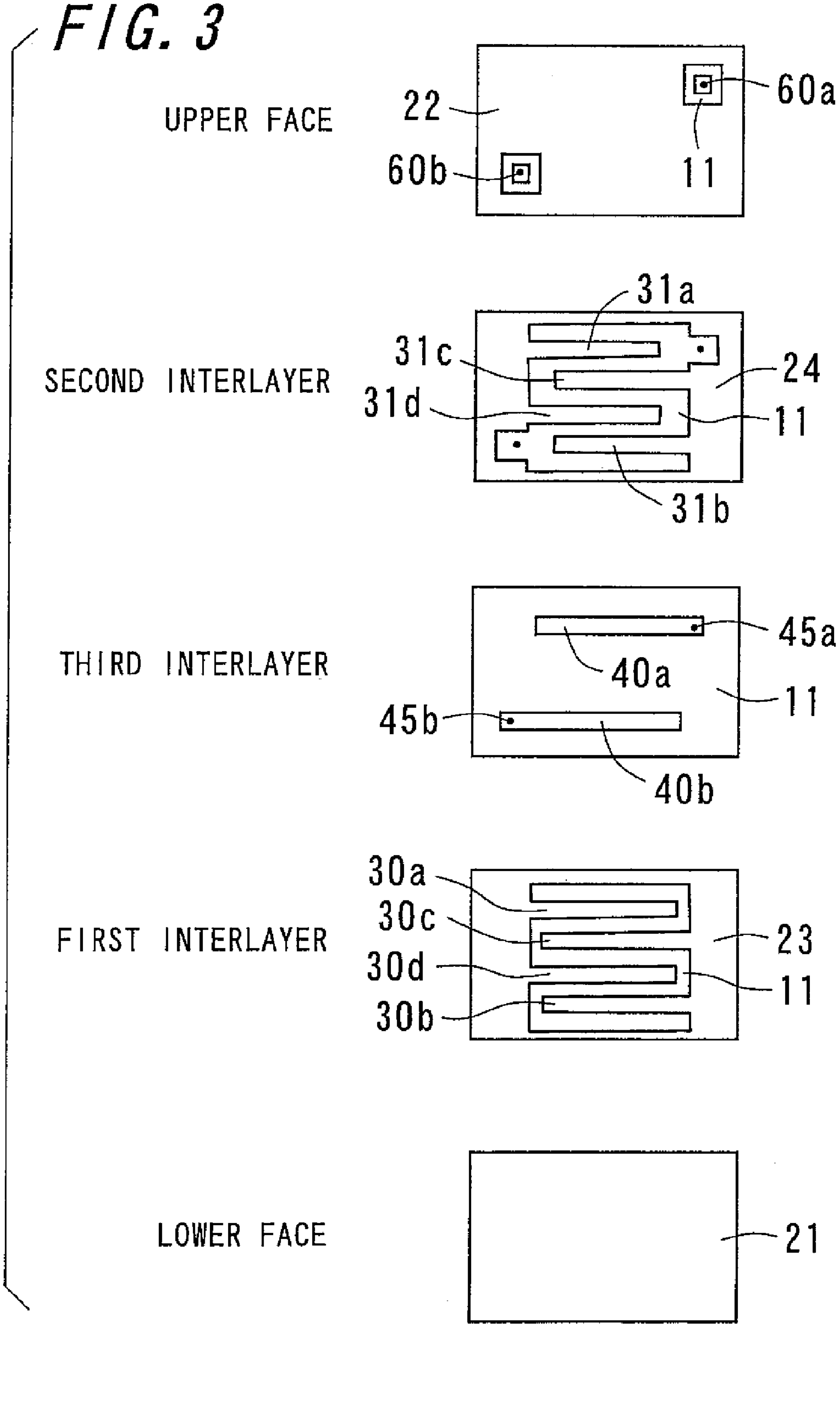
FIG. 3 is a plan view schematically showing upper and lower faces and interlayers of the bandpass filter shown in FIG. 1.
Figure 4:
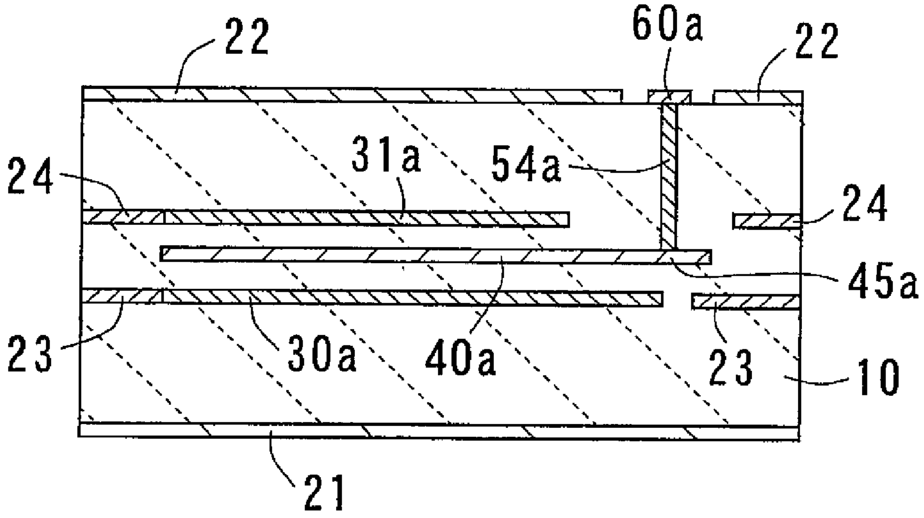
FIG. 4 is a sectional view of the bandpass filter taken along the line X-X' of FIG. 1.

FIG. 1 is an external perspective view schematically showing a bandpass filter in accordance with a first embodiment of the invention. FIG. 2 is a schematic exploded perspective view of the bandpass filter shown in FIG. 1. FIG. 3 is a plan view schematically showing upper and lower faces and interlayers of the bandpass filter shown in FIG. 1. FIG. 4 is a sectional view of the bandpass filter taken along the line X-X' of FIG. 1.

As shown in FIGS. 1 through 4, the bandpass filter of this embodiment includes a multilayer body 10, a first ground electrode 21, a second ground electrode 22, a plurality of strip-like first resonant electrodes 30*a*, 30*b*, 30*c*, and 30*d*, and a plurality of strip-like second resonant electrodes 31*a*, 31*b*, 31*c*, and 31*d*. The multilayer body 10 has a stack of a plurality of dielectric layers 11 on top of each other. The first ground electrode 21 is disposed on a lower face of the multilayer body 10 and is connected to a ground potential. The second ground electrode 22 is disposed on an upper face of the multilayer body 10 and is connected to a ground potential. The plurality of first resonant electrodes 30*a*, 30*b*, 30*c*, and 30*d* are arranged side by side on a first interlayer of the multilayer body 10, with their one ends as well as the other ends displaced in relation to each other in a staggered manner. The first resonant electrodes have their one ends connected to a ground potential so as to serve as a quarter-wavelength resonator and make electromagnetic-field coupling with each other. The plurality of second resonant electrodes 31*a*, 31*b*, 31*c*, and 31*d* are arranged side by side on a second interlayer of the multilayer body 10 located above the first interlayer, with their one ends as well as the other ends displaced in relation to each other in a staggered manner. The second resonant electrodes have their one ends connected to a ground potential so as to serve as a quarter-wavelength resonator which resonates at a frequency higher than a frequency at which the first resonant electrode resonates, and make electromagnetic-field coupling with each other.

Moreover, the bandpass filter of the present embodiment includes a strip-like input coupling electrode 40*a* and a strip-like output coupling electrode 40*b*. The input coupling electrode 40*a* is disposed on a third interlayer of the multilayer body 10 located between the first interlayer and the second interlayer. The input coupling electrode 40*a* faces an input-stage first resonant electrode 30*a* of the plurality of first resonant electrodes 30*a*, 30*b*, 30*c*, and 30*d*, over more than half of the entire longitudinal area thereof for electromagnetic-field coupling, faces an input-stage second resonant electrode 31*a* of the plurality of second resonant electrodes 31*a*, 31*b*, 31*c*, and 31*d*, over more than half of the entire longitudinal area thereof for electromagnetic-field coupling, and has an electric signal input point 45*a* for receiving input of an electric signal from an external circuit. The output coupling electrode 40*b* is disposed on the third interlayer of the multilayer body 10. The output coupling electrode 40*b* faces an output-stage first, resonant electrode 30*b* of the plurality of first resonant electrodes, over more than half of the entire longitudinal area thereof for electromagnetic-field coupling, faces an output-stage second resonant electrode 31*b* of the plurality of second resonant electrodes 31*a*, 31*b*, 31*c*, and 31*d*, over more than half of the entire longitudinal area thereof for electromagnetic-field coupling, and has an electric signal output point 45*b* for producing output of an electric signal toward the external circuit.

Further, the bandpass filter of the present embodiment includes a first annular ground electrode 23 and a second annular ground electrode 24. The first annular ground electrode 23 is formed in an annular shape on the first interlayer of the multilayer body 10 so as to surround the plurality of first resonant electrodes 30*a*, 30*b*, 30*c*, and 30*d*, is connected with the one ends of, respectively, the plurality of first resonant electrodes 30*a*, 30*b*, 30*c*, and 30*d*, and is connected to aground potential. The second annular ground electrode 24 is formed in an annular shape on the second interlayer so as to surround the plurality of second resonant electrodes 31*a*, 31*b*, 31*c*, and 31*d*, is connected with the one ends of, respectively, the plurality of second resonant electrodes 31*a*, 31*b*, 31*c*, and 31*d*, and is connected to a ground potential.

In the bandpass filter of the present embodiment, the one end of the input-stage first resonant electrode 30*a* and the one end of the input-stage second resonant electrode 31*a* is located on the same side. Moreover, the one end of the output-stage first resonant electrode 30*b* and the one end of the output-stage second resonant electrode 31*b* are located on the same side. In the input coupling electrode 40*a* as seen in its longitudinal direction, the electric signal input point 45*a* is disposed at a part that lies nearer the other end of the input-stage first resonant electrode 30*a* than a center of a part facing the input-stage first resonant electrode 30*a* and also lies nearer the other end of the input-stage second resonant electrode 31*a* than a center of a part facing the input-stage second resonant electrode 31*a*. Also, in the output coupling electrode 40*b* as seen in its longitudinal direction, the electric signal output point 45*b* is disposed at a part that lies nearer the other end of the output-stage first resonant electrode 30*b* than a center of a part facing the output-stage first resonant electrode 30*b* and also lies nearer the other end of the output-stage second resonant electrode 31*b* than a center of a part facing the output-stage second resonant electrode 31*b*.

Moreover, in the bandpass filter of the present embodiment, the input coupling electrode 40*a* is connected to an input terminal electrode 60*a* disposed on the upper face of the multilayer body 10 through a sixth through conductor 54*a*, and the output coupling electrode 40*b* is connected to an output terminal electrode 60*b* disposed on the upper face of the multilayer body 10 through a seventh through conductor 54*b*. Thus, a point of connection between the input coupling electrode 40*a* and the sixth through conductor 54*a* corresponds to the electric signal input point 45*a* of the input coupling electrode 40*a*, and a point of connection between the output coupling electrode 40*b* and the seventh through conductor 54*b* corresponds to the electric signal output point 45*b* of the output coupling electrode 40*b*.

In the bandpass filter of the present embodiment thereby constructed, an electric signal from the external circuit is inputted via the input terminal electrode 60*a* and the sixth through conductor 54*a* to the electric signal input point 45*a* of the input coupling electrode 40*a*. Upon the input, the input-stage first resonant electrode 30*a* which makes electromagnetic-field coupling with the input coupling electrode 40*a* is excited, so that the electric signal can be outputted, through the plurality of first resonant electrodes 30*a*, 30*b*, 30*c*, and 30*d* that make electromagnetic-field coupling with each other, to the output coupling electrode 40*b* which makes electromagnetic-field coupling with the output-stage first resonant electrode 30*b*. At this time, signals in frequencies at which the plurality of first resonant electrodes 30*a*, 30*b*, 30*c*, and 30*d* resonate are selectively passed, thereby forming a first pass band.

Moreover, in the bandpass filter of the present embodiment, when an electric signal from the external circuit is inputted via the input terminal electrode 60*a* and the sixth through conductor 54*a* to the electric signal input point 45*a* of the input coupling electrode 40*a*, then the input-stage second resonant electrode 31*a* which makes electromagnetic-field coupling with the input coupling electrode 40*a* is excited, so that the electric signal can be outputted, through the plurality of second resonant electrodes 31*a*, 31*b*, 31*c*, and 31*d* that make electromagnetic-field coupling with each other, to the output coupling electrode 40*b* which makes electromagnetic-field coupling with the output-stage second resonant electrode 31*b*. At this time, signals in frequencies at which the plurality of second resonant electrodes 31*a*, 31*b*, 31*c*, and 31*d* resonate are selectively passed, thereby forming a second pass band.

Accordingly, the bandpass filter of the present embodiment serves as a bandpass filter having two pass bands that differ in frequency from each other.

In the bandpass filter of the present embodiment, the first ground electrode 21 is so disposed as to extend all over the lower face of the multilayer body 10, and the second ground electrode. 22 is so disposed as to extend substantially all over the upper face of the multilayer body 10, except for the region around the input terminal electrode 60*a* and the region around the output terminal electrode 60*b*. The first and second ground electrodes 21 and 22 are each connected to a ground potential and constitute, in conjunction with the plurality of first resonant electrodes 30*a*, 30*b*, 30*c*, and 30*d* and the plurality of second resonant electrodes 31*a*, 31*b*, 31*c*, and 31*d*, a strip line resonator.

Moreover, in the bandpass filter of the present embodiment, the plurality of strip-like first resonant electrodes 30*a*, 30*b*, 30*c*, and 30*d* constitute, in conjunction with the first ground electrode 21 and the second ground electrode 22, a strip line resonator, and have their one ends connected to the first annular ground electrode 23 to be connected to a ground potential so as to serve as a quarter-wavelength resonator. The electrical length of each individual first resonant electrode is adjusted to approximately ¼ of the wavelength of the center frequency in the pass band formed by the plurality of first resonant electrodes 30*a*, 30*b*, 30*c*, and 30*d*. Likewise, the plurality of strip-like second resonant electrodes 31*a*, 31*b*, 31*c*, and 31*d* constitute, in conjunction with the first ground electrode 21 and the second ground electrode 22, a strip line resonator, and have their one ends connected to the second annular ground electrode 24 to be connected to a ground potential so as to serve as a quarter-wavelength resonator. The electrical length of each individual second resonant electrode is adjusted to approximately ¼ of the wavelength of the center frequency in the pass band formed by the plurality of second resonant electrodes 31*a*, 31*b*, 31*c*, and 31*d*.

Moreover, the plurality of first resonant electrodes 30*a*, 30*b*, 30*c*, and 30*d* are arranged side by side for mutual edge coupling on the first interlayer of the multilayer body 10, and also the plurality of second resonant electrodes 31*a*, 31*b*, 31*c*, and 31*d* are arranged side by side for mutual edge coupling on the second interlayer of the multilayer body 10. Although the spacing between the adjacent juxtaposed resonant electrodes should preferably be made.as small as possible from the standpoint of achieving strong mutual coupling, reduction in the spacing gives rise to difficulty in manufacturing operation. Accordingly, the spacing is set to fall in a range of from approximately 0.05 to 0.5 mm.

Further, since the plurality of juxtaposed first resonant electrodes 30*a*, 30*b*, 30*c*, and 30*d* are so arranged that one ends as well as the other ends thereof are displaced in relation to each other in a staggered manner, it follows that the resonant electrodes are coupled to each other in an interdigital form. In the case of interdigital form coupling, as compared with the case of comb-line form coupling, a higher coupling strength can be obtained by virtue of the combination of the effects of magnetic field coupling and electric field coupling. This makes it possible to render, in the pass band formed by the plurality of first resonant electrodes 30*a*, 30*b*, 30*c*, and 30*d*, the frequency spacing between the resonance frequencies in the respective resonant modes suitable for the obtainment of an extremely wide pass band width of approximately 40% to 50% in terms of fractional bandwidth. The level of this pass band width is far in excess of the levels of pass band width that are realizable by conventional quarter-wavelength resonator-using filters, and a bandpass filter capable of offering such a wide pass band width is thus suitable for use in the UWB.

Likewise, since the plurality of juxtaposed second resonant electrodes 31*a*, 31*b*, 31*c*, and 31*d* are so arranged, that one ends as well as the other ends thereof are displaced in relation to each other in a staggered manner, it follows that the resonant electrodes are coupled to each other in an interdigital form. This makes it possible to render, in the pass band formed by the plurality of second resonant electrodes 31*a*, 31*b*, 31*c*, and 31*d*, the frequency spacing between the resonance frequencies in the respective resonant modes suitable for the obtainment of an extremely wide pass band width of approximately 40% to 50% in terms of fractional bandwidth, which is far in excess of the pass band widths that are realizable by conventional quarter-wavelength resonator-using filters. Thus, a bandpass filter capable of offering such a wide pass band width is suitable for use in the UWB.

Incidentally, it has been found by studies that, when a plurality of resonant electrodes constituting a single pass band are broadside-coupled to each other and are also brought into an interdigitally-coupled state, then the coupling therebetween becomes unduly strong, and such a coupling technique is after all undesirable for the obtainment of a pass band width of approximately 40% to 50% in terms of fractional bandwidth.

Moreover, in the bandpass filter of the present embodiment, the input coupling electrode 40*a* is disposed on the third interlayer of the multilayer body 10 located between the first interlayer and the second interlayer, faces the input-stage first resonant electrode 30*a* of the plurality of first resonant electrodes 30*a*, 30*b*, 30*c*, and 30*d*, over more than half of the entire longitudinal area thereof for electromagnetic-field coupling, and has the electric signal input point 45*a* for receiving input of an electric signal from the external circuit. In the input coupling electrode 40*a* as seen in its longitudinal direction, the electric signal input point 45*a* is disposed at the part that lies nearer the other end of the input-stage first resonant electrode 30*a* than the center of the part facing the input-stage first resonant electrode 30*a*. Also, the output coupling electrode 40*b* is disposed on the third interlayer of the multilayer body 10, faces the output-stage first resonant electrode 30*b* of the plurality of first resonant electrodes, over more than half of the entire longitudinal area thereof for electromagnetic-field coupling, and has the electric signal output point 45*b* for producing output of an electric signal toward the external circuit. In the output coupling electrode 40*b* as seen in its longitudinal direction, the electric signal output point 45*b* is disposed at the part that lies nearer the other end of the output-stage first resonant electrode 30*b* than the center of the part facing the output-stage first resonant electrode 30*b*. In this construction, the input coupling electrode 40*a* and the input-stage first resonant electrode 30*a* are broadside-coupled to each other with the dielectric layer 11 interposed therebetween to achieve strong mutual electromagnetic-field coupling, and are also brought into an interdigitally-coupled state to make the electromagnetic-field coupling even stronger with the combination of the effects of magnetic field coupling and electric field coupling. Likewise, the output coupling electrode 40*b* and the output-stage first resonant electrode 30*b* are broadside-coupled to each other with the dielectric layer 11 interposed therebetween to achieve strong mutual electromagnetic-field coupling, and are also brought into an interdigitally-coupled state to make the electromagnetic-field coupling even stronger with the combination of the effects of magnetic field coupling and electric field coupling. In this way, according to the bandpass filter of the present embodiment, the input coupling electrode 40*a* and the input-stage first resonant electrode 30*a* are broadside-coupled to each other with the dielectric layer 11 interposed therebetween to achieve strong mutual electromagnetic-field coupling, and are also brought into an interdigitally-coupled state to make the electromagnetic-field coupling even stronger. Likewise, the output coupling electrode 40*b* and the output-stage first resonant electrode 30*b* are broadside-coupled to each other with the dielectric layer 11 interposed therebetween to achieve strong mutual electromagnetic-field coupling, and are also brought into an interdigitally-coupled state to make the electromagnetic-field coupling even stronger. Hence, where the pass band formed by the plurality of first resonant electrodes 30*a*, 30*b*, 30*c*, and 30*d* is concerned, even in a pass band which is far wider than those that are realizable by conventional quarter-wavelength resonator-using filters, it is possible to obtain bandpass characteristics of achieving flatness and loss reduction over the entire region of a wide pass band without causing a significant increase in insertion loss at a frequency falling between the resonance frequencies in the respective resonant modes.

Further, in the bandpass filter of the present embodiment, the input coupling electrode 40*a* is disposed on the third interlayer of the multilayer body 10 located between the first interlayer and the second interlayer, faces the input-stage second resonant electrode 31*a* of the plurality of second resonant electrodes 31*a*, 31*b*, 31*c*, and 31*d*, over more than half of the entire longitudinal area thereof for electromagnetic-field coupling, and has the electric signal input point 45*a* for receiving input of an electric signal from the external circuit. In the input coupling electrode 40*a* as seen in its longitudinal direction, the electric signal input point 45*a* is disposed at the part that lies nearer the other end of the input-stage second resonant electrode 31*a* than the center of the part facing the input-stage second resonant electrode 31*a*. Also, the output coupling electrode 40*b* is disposed on the third interlayer of the multilayer body 10, faces the output-stage second resonant electrode 31*b* of the plurality of second resonant electrodes, over more than half of the entire longitudinal area thereof for electromagnetic-field coupling, and has the electric signal output point 45*b* for producing output of an electric signal toward the external circuit. In the output coupling electrode 40*b* as seen in its longitudinal direction, the electric signal output point 45*b* is disposed at the part that lies nearer the other end of the output-stage second resonant electrode 31*b* than the center of the part facing the output-stage second resonant electrode 31*b*. In this construction, the input coupling electrode 40*a* and the input-stage second resonant electrode 31*a* are broadside-coupled to each other with the dielectric layer 11 interposed therebetween to achieve strong mutual electromagnetic-field coupling, and are also brought into an interdigitally-coupled state to make the electromagnetic-field coupling even stronger with the combination of the effects of magnetic field coupling and electric field coupling. Likewise, the output coupling electrode 40*b* and the output-stage second resonant electrode 31*b* are broadside-coupled to each other with the dielectric layer 11 interposed therebetween to achieve strong mutual electromagnetic-field coupling, and are also brought into an interdigitally-coupled state to make the electromagnetic-field coupling even stronger with the combination of the effects of magnetic field coupling and electric field coupling. In this way, according to the bandpass filter of the present embodiment, the input coupling electrode 40*a* and the input-stage second resonant electrode 31*a* are broadside-coupled to each other with the dielectric layer 11 interposed therebetween to achieve strong mutual electromagnetic-field coupling, and are also brought into an interdigitally-coupled state to make the electromagnetic-field coupling even stronger. Likewise, the output coupling electrode 40*b* and the output-stage second resonant electrode 31*b* are broadside-coupled to each other with the dielectric layer 11 interposed therebetween to achieve strong mutual electromagnetic-field coupling, and are also brought into an interdigitally-coupled state to make the electromagnetic-field coupling even stronger. Hence, where the pass band formed by the plurality of second resonant electrodes 31*a*, 31*b*, 31*c*, and 31*d* is concerned, even in a pass band which is far wider than those that are realizable by conventional quarter-wavelength resonator-using filters, it is possible to obtain bandpass characteristics of achieving flatness and loss reduction over the entire region of a wide pass band without causing a significant increase in insertion loss at a frequency falling between the resonance frequencies in the respective resonant modes.

In this way, according to the bandpass filter of the present embodiment, the input coupling electrode 40*a* and the input-stage first resonant electrode 30*a*, as well as the input-stage second resonant electrode 31*a*, are broadside-coupled to each other with the dielectric layer 11 interposed therebetween to achieve strong mutual electromagnetic-field coupling, and are also brought into an interdigitally-coupled state to make the electromagnetic-field coupling even stronger. Likewise, the output coupling electrode 40*b* and the output-stage first resonant electrode 30*b*, as well as the output-stage second resonant electrode 31*b*, are broadside-coupled to each other with the dielectric layer 11 interposed therebetween to achieve strong mutual electromagnetic-field coupling, and are also brought into an interdigitally-coupled state to make the electromagnetic-field coupling even stronger. Hence, where both the pass band formed by the plurality of first resonant electrodes 30*a*, 30*b*, 30*c*, and 30*d* and the pass band formed by the plurality of second resonant electrodes 31*a*, 31*b*, 31*c*, and 31*d* are concerned, even in a pass band which is far wider than those that are realizable by conventional quarter-wavelength resonator-using filters, it is possible to obtain bandpass characteristics of achieving flatness and loss reduction over the entire region of a wide pass band without causing a significant increase in insertion loss at a frequency falling between the resonance frequencies in the respective resonant modes.

In the bandpass filter of the present embodiment, since the one end of the input-stage first resonant electrode 30*a* and the one end of the input-stage second resonant electrode 31*a* are located on the same side, and the one end of the output-stage first resonant electrode 30*b* and the one end of the output-stage second resonant electrode 31*b* are located on the same side, it follows that the input coupling electrode 40*a* can be broadside-coupled and interdigitally-coupled to the input-stage first resonant electrode 30*a* as well as to the input-stage second resonant electrode 31*a*, and the output coupling electrode 40*b* can be broadside-coupled and interdigitally-coupled to the output-stage first resonant electrode 30*b* as well as to the output-stage second resonant electrode 31*b*.

It is preferable that the input coupling electrode 40*a* and the output coupling electrode 40*b* are designed to be substantially equal in geometry to the input-stage first resonant electrode 30*a* and the output-stage first resonant electrode 30*b*, respectively. Moreover, although the spacing between the input coupling electrode 40*a* and the input-stage first resonant electrode 30*a* as well as the input-stage second resonant electrode 31*a*, and the spacing between the output coupling electrode 40*b* and the output-stage first resonant electrode 30*b* as well as the output-stage second resonant electrode 31*b* should preferably be made as small as possible from the standpoint of achieving strong mutual coupling, a reduction in the spacing gives rise to difficulty in manufacturing operation. Accordingly, the spacing is set to fall in a range of from approximately 0.01 to 0.5 mm.

Moreover, the bandpass filter of the present embodiment includes the first annular ground electrode 23 and the second annular ground electrode 24. The first annular ground electrode 23 is formed in an annular shape on the first interlayer so as to surround the plurality of first resonant electrodes 30*a*, 30*b*, 30*c*, and 30*d*, is connected with the one ends of, respectively, the plurality of first resonant electrodes 30*a*, 30*b*, 30*c*, and 30*d*, and is connected to a ground potential. The second annular ground electrode 24 is formed in an annular shape on the second interlayer so as to surround the plurality of second resonant electrodes 31*a*, 31*b*, 31*c*, and 31*d*, is connected with the one ends of, respectively, the plurality of second resonant electrodes 31*a*, 31*b*, 31*c*, and 31*d*, and is connected to a ground potential. By the presence of the first annular ground electrode 23 and the second annular ground electrode 24, in the plurality of first resonant electrodes 30*a*, 30*b*, 30*c*, and 30*d* and in the plurality of second resonant electrodes 31*a*, 31*b*, 31*c*, and 31*d* as well, an electrode connected to a ground potential does exist on both sides of the resonant electrode in its longitudinal direction. Therefore, even in a case of forming a bandpass filter in part of the area of a module substrate, staggered one ends of the individual resonant electrodes can be connected to a ground potential with ease. Moreover, since the first annular ground electrode 23 annularly surrounds the plurality of first resonant electrodes 30*a*, 30*b*, 30*c*, and 30*d* and the second annular ground electrode 24 annularly surrounds the plurality of second resonant electrodes 31*a*, 31*b*, 31*c*, and 31*d*, it is possible to reduce the peripheral leakage of electromagnetic waves produced by the plurality of first resonant electrodes 30*a*, 30*b*, 30*c*, and 30*d* and the plurality of second resonant electrodes 31*a*, 31*b*, 31*c*, and 31*d*. This effect is especially useful in the case of forming a bandpass filter in part of the area of a module substrate in view of the protection of another part of the area of the module substrate from adverse effects.

(Second Embodiment)

Figure 5:
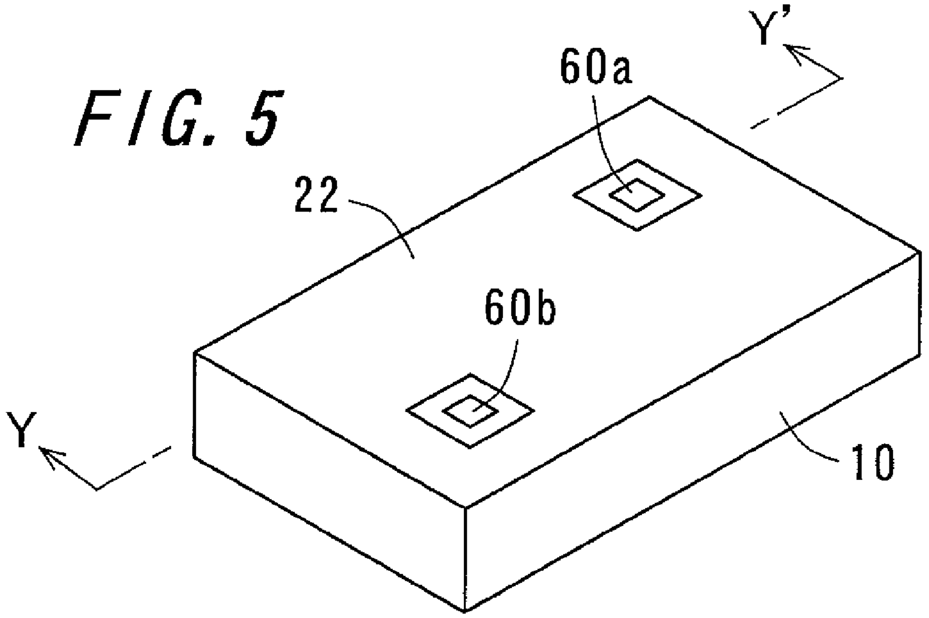
FIG. 5 is an external perspective view schematically showing a bandpass filter in accordance with a second embodiment of the invention.
Figure 6:
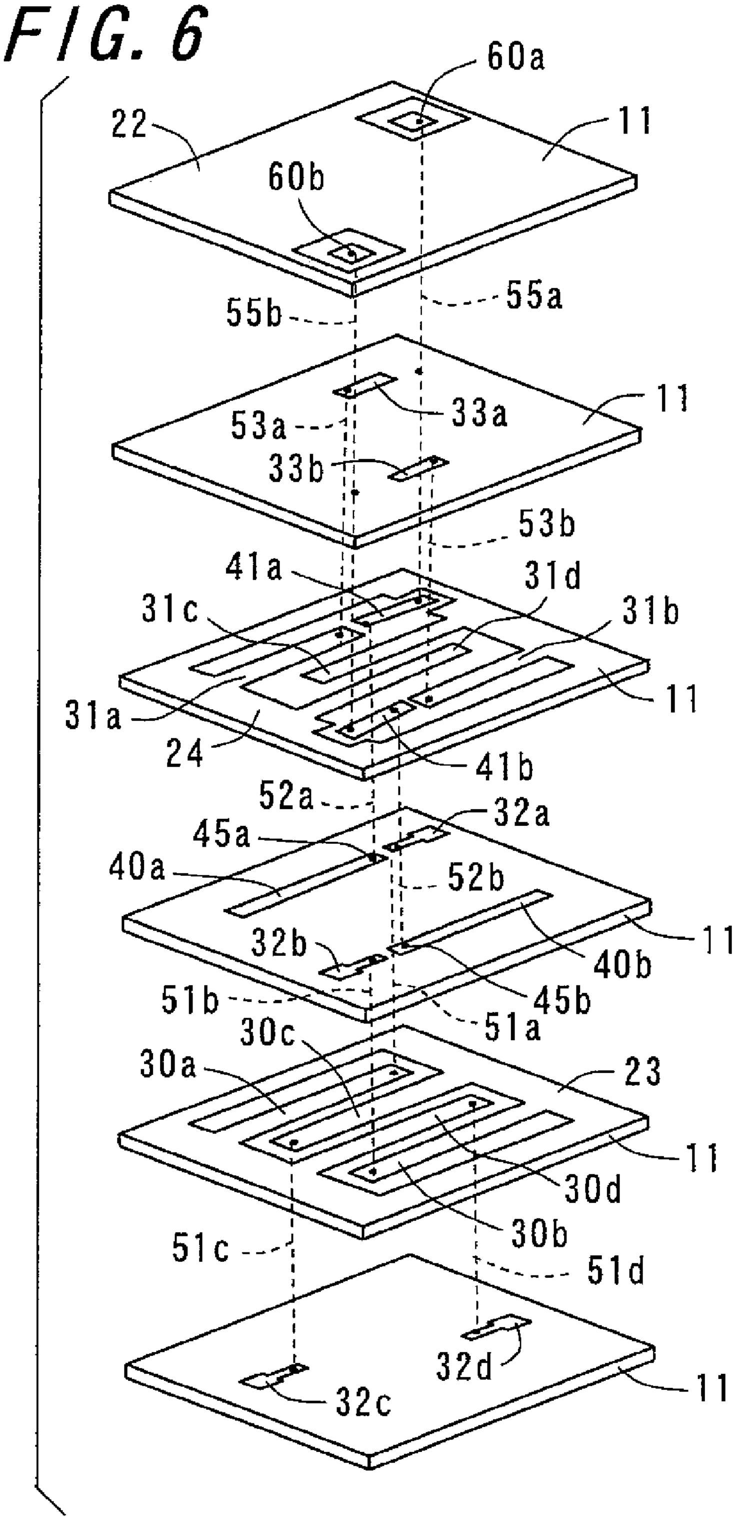
FIG. 6 is a schematic exploded perspective view of the bandpass filter shown in FIG. 5.
Figure 7:
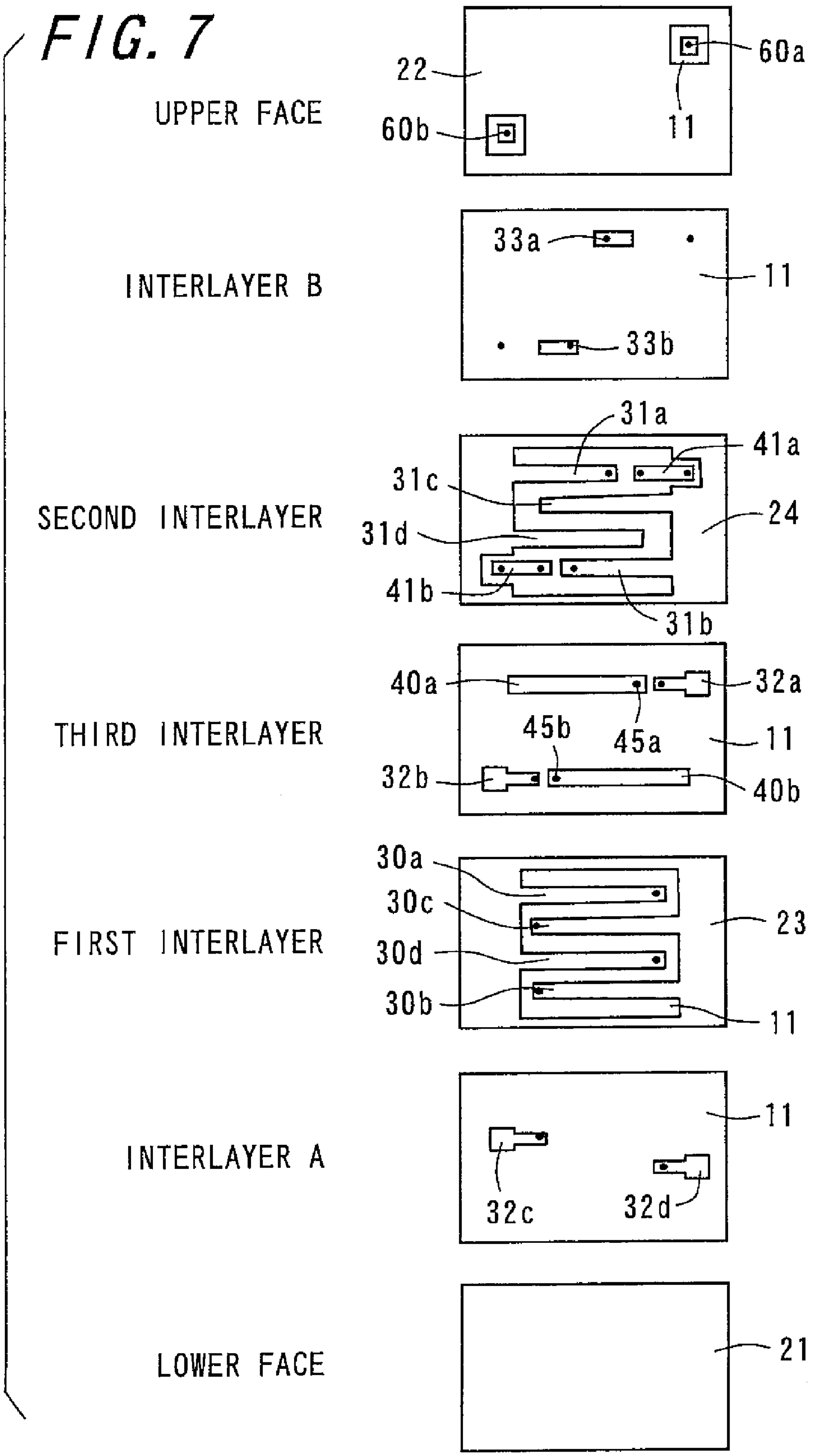
FIG. 7 is a plan view schematically showing upper and lower faces and interlayers of the bandpass filter shown in FIG. 5.
Figure 8:
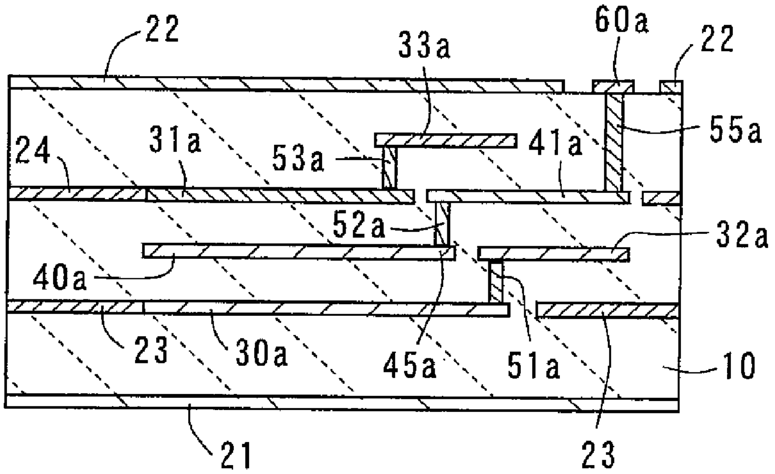
FIG. 8 is a sectional view of the bandpass filter taken along the line Y-Y' of FIG. 5.

FIG. 5 is an external perspective view schematically showing a bandpass filter in accordance with a second embodiment of the invention. FIG. 6 is a schematic exploded perspective view of the bandpass filter shown in FIG. 5. FIG. 7 is a plan view schematically showing upper and lower faces and interlayers of the bandpass filter shown in FIG. 5. FIG. 8 is a sectional view of the bandpass filter taken along the line Y-Y' of FIG. 5. Note that the following description deals with in what way this embodiment differs from the above-mentioned first embodiment, and the constituent components thereof that play the same or corresponding roles as in the preceding embodiment will be denoted by the same reference numerals and overlapping descriptions will be omitted.

As shown in FIGS. 5 through 8, in the bandpass filter of this embodiment, on the third interlayer of the multilayer body 10 located above the first interlayer are arranged an auxiliary resonant electrode 32*a* and an auxiliary resonant electrode 32*b* that correspond to the first resonant electrode 30*a* and the first resonant electrode 30*b*, respectively. The auxiliary resonant electrode 32*a*, 32*b* is so placed as to have a region facing the first annular ground electrode 23 and a region facing the first resonant electrode 30*a*, 30*b*, of which the first resonant electrode 30*a*, 30*b*-facing region is connected to the other end side of the first resonant electrode 30*a*, 30*b* by a first through conductor 51*a*, 51*b* passing all the way through the dielectric layer 11 located between the first resonant electrode 30*a*, 30*b*-facing region and the first resonant electrode 30*a*, 30*b*. Also, on an interlayer A of the multilayer body 10 located below the first interlayer are arranged an auxiliary resonant electrode 32*c* and an auxiliary resonant electrode 32*d* that correspond to the first resonant electrode 30*c* and the first resonant electrode 30*d*, respectively. The auxiliary resonant electrode 32*c*, 32*d* is so placed as to have a region facing the first annular ground electrode 23 and a region facing the first resonant electrode 30*c*, 30*d*, of which the first resonant electrode 30*c*, 30*d*-facing region is connected to the other end side of the first resonant electrode 30*c*, 30*d* by a first through conductor 51*c*, 51*d* passing all the way through the dielectric layer 11 located between the first resonant electrode 30*c*, 30*d*-facing region and the first resonant electrode 30*c*, 30*d*.

Moreover, in the bandpass filter of the present embodiment, on the second interlayer of the multilayer body 10 located above the third interlayer is provided an auxiliary input coupling electrode 41*a* placed so as to have a region facing the auxiliary resonant electrode 32*a* connected to the input-stage first resonant electrode 30*a* and a region facing the input coupling electrode 40*a*, of which the input coupling electrode 40*a*-facing region is connected to the input coupling electrode 40*a* by a second through conductor 52*a* passing all the way through the dielectric layer 11 located between the input coupling electrode 40*a*-facing region and the input coupling electrode 40*a*. In the input coupling electrode 40*a* as seen in its longitudinal direction, the second through conductor 52*a* is connected to the end part thereof that lies nearer the other end of the input-stage first resonant electrode 30*a* than the center of the part facing the input-stage first resonant electrode 30*a* and also lies nearer the other end of the input-stage second resonant electrode 31*a* than the center of the part facing the input stage second resonant electrode 31*a*.

Further, in the bandpass filter of the present embodiment, on the second interlayer of the multilayer body 10 is provided an auxiliary output coupling electrode 41*b* placed so as to have a region facing the auxiliary resonant electrode 32*b* connected to the output-stage first resonant electrode 30*b* and a region facing the output coupling electrode 40*b*, of which the output coupling electrode 40*b*-facing region is connected to the output coupling electrode 40*b* by a third through conductor 52*b* passing all the way through the dielectric layer 11 located between the output coupling electrode 40*b*-facing region and the output coupling electrode 40*b*. In the output coupling electrode 40*b* as seen in its longitudinal direction, the third through conductor 52*b* is connected to the end part thereof that lies nearer the other end of the output-stage first resonant electrode 30*b* than the center of the part facing the output-stage first resonant electrode 30*b* and also lies nearer the other end of the output-stage second resonant electrode 31*b* than the center of the part facing the output-stage second resonant electrode 31*b*.

Still further, in the bandpass filter of the present embodiment, on an interlayer B of the multilayer body 10 located above the second interlayer is provided an input-side auxiliary coupling resonant electrode 33a placed so as to have a region facing the input-stage second resonant electrode 31*a* and a region facing the auxiliary input coupling electrode 41*a*, of which the input-stage second resonant electrode 31*a*-facing region is connected to the other end side of the input-stage second resonant electrode 31*a* by a fourth through conductor 53*a* passing all the way through the dielectric layer 11 located between the input-stage second resonant electrode 31*a*-facing region and the input-stage second resonant electrode 31*a*. Likewise, on the interlayer B of the multilayer body 10 is provided an output-side auxiliary coupling resonant electrode 33*b* placed so as to have a region facing the output-stage second resonant electrode 31*b* and a region facing the auxiliary output coupling electrode 41*b*, of which the output-stage second resonant electrode 31*b*-facing region is connected to the other end side of the output-stage second resonant electrode 31*b* by a fifth through conductor 53*b* passing all the way through the dielectric layer 11 located between the output-stage second resonant electrode 31*b*-facing region and the output-stage second resonant electrode 31*b*.

According to the bandpass filter of the present embodiment, on the interlayers of the multilayer body 10 other than the first interlayer, there are arranged the auxiliary resonant electrodes 32*a*, 32*b*, 32*c*, and 32*d* that correspond to the plurality of first resonant electrodes 30*a*, 30*b*, 30*c*, and 30*d*, respectively, and the auxiliary resonant electrode 32*a*, 32*b*, 32*c*, 32*d* is so placed as to have the region facing the first annular ground electrode 23 and the region facing the first resonant electrode, of which the first resonant electrode-facing region is connected to the other end side of the first resonant electrode by the first through conductor 51*a*, 51*b*, 51*c*, 51*d* passing all the way through the dielectric layer 11 located between the first resonant electrode-facing region and the first resonant electrode. In this construction, in the region where the auxiliary resonant electrode 32*a*, 32*b*, 32*c*, 32*d* and the first annular ground electrode 23 face each other, electrostatic capacitance arises therebetween. This makes it possible to reduce the lengths of, respectively, the first resonant electrodes 30*a*, 30*b*, 30*c*, and 30*d*, and thereby obtain a more compact bandpass filter.

Moreover, the auxiliary resonant electrodes 32*a*, 32*b*, 32*c*, and 32*d* are connected to the other end sides of the first resonant electrodes 30*a*, 30*b*, 30*c*, and 30*d*, respectively, and are so formed as to extend therefrom in the opposite direction to one ends of the first resonant electrodes 30*a*, 30*b*, 30*c*, and 30*d*, respectively. In this construction, as will hereinafter be more fully described, a coupling body composed of the input-stage first resonant electrode 30*a* and the auxiliary resonant electrode 32*a* connected thereto and a coupling body composed of the input coupling electrode 40*a* and the auxiliary input coupling electrode 41*a* connected thereto are broadside-coupled to each other as a whole, and are also brought into an interdigitally-coupled state, thereby achieving extremely strong mutual coupling. Likewise, a coupling body composed of the output-stage first resonant electrode 30*b* and the auxiliary resonant electrode 32*b* connected thereto and a coupling body composed of the output coupling electrode 40*b* and the auxiliary output coupling electrode 41*b* connected thereto are broadside-coupled to each other as a whole, and are also brought into an interdigitally-coupled state, thereby achieving extremely strong mutual coupling.

The area of the part where the auxiliary resonant electrode 32*a*, 32*b*, 32*c*, 32*d* and the first annular ground electrode 23 face each other is set to fall, for example, in a range of from approximately 0.01 to 3 $mm^2$ in consideration of the balance between a required size and electrostatic capacitance to be obtained. Although the spacing between the confronting faces of, respectively, the auxiliary resonant electrode 32*a*, 32*b*, 32*c*, 32*d* and the first annular ground electrode 23 should preferably be made as small as possible from the standpoint of producing great electrostatic capacitance, a reduction in the spacing gives rise to difficulty in manufacturing operation. Accordingly, the spacing is set to fall in a range of from approximately 0.01 to 0.5 mm.

Moreover, in the bandpass filter of the present embodiment, on the second interlayer of the multilayer body 10 located above the third interlayer is provided the auxiliary input coupling electrode 41*a* placed so as to have the region facing the auxiliary resonant electrode 32*a* connected to the input-stage first resonant electrode 30*a* and the region facing the input coupling electrode 40*a*, of which the input coupling electrode 40*a*-facing region is connected to the input coupling electrode 40*a* by the second through conductor 52*a* passing all the way through the dielectric layer 11 located between the input coupling electrode 40*a*-facing region and the input coupling electrode 40*a*. Also, on the second interlayer of the multilayer body 10 is provided the auxiliary output coupling electrode 41*b* placed so as to have the region facing the auxiliary resonant electrode 32*b* connected to the output-stage first resonant electrode 30*b* and the region facing the output coupling electrode 40*b*, of which the output coupling electrode 40*b*-facing region is connected to the output coupling electrode 40*b* by the third through conductor 52*b* passing all the way through the dielectric layer 11 located between the output coupling electrode 40*b*-facing region and the output coupling electrode 40*b*. In this construction, strong electromagnetic-field coupling is established between the auxiliary resonant electrode 32*a* connected to the input-stage first resonant electrode 30*a* and the auxiliary input coupling electrode 41*a* in a broadside-coupled state, and the effect of this electromagnetic-field coupling is added to the electromagnetic-field coupling between the input-stage first resonant electrode 30*a* and the input coupling electrode 40*a*. Likewise, strong electromagnetic-field coupling is established between the auxiliary resonant electrode 32*b* connected to the output-stage first resonant electrode 30*b* and the auxiliary output coupling electrode 41*b* in a broadside-coupled state, and the effect of this electromagnetic-field coupling is added to the electromagnetic-field coupling between the output-stage first resonant electrode 30*b* and the output coupling electrode 40*b*. This makes it possible to strengthen the electromagnetic-field coupling between the input coupling electrode 40*a* and the input-stage first resonant electrode 30*a* and strengthen the electromagnetic-field coupling between the output coupling electrode 40*b* and the output-stage first resonant electrode 30*b*. Accordingly, where the pass band formed by the plurality of first resonant electrodes 30*a*, 30*b*, 30*c*, and 30*d* is concerned, even in an extremely wide pass band width, it is possible to obtain bandpass characteristics of achieving further flatness and loss reduction over the entire region of a wide pass band by lessening an increase in insertion loss at a frequency falling between the resonance frequencies in the respective resonant modes.

Moreover, according to the bandpass filter of the present embodiment, in the input coupling electrode 40*a* as seen in its longitudinal direction, the auxiliary input coupling electrode 41*a* is connected to the part that lies nearer the other end of the input-stage first resonant electrode 30*a* than the center of the part facing the input-stage first resonant electrode 30*a* and also lies nearer the other end of the input-stage second resonant electrode 31*a* than the center of the part facing the input-stage second resonant electrode 31*a*, by the second through conductor 52*a*. Likewise, in the output coupling electrode 40*b* as seen in its longitudinal direction, the auxiliary output coupling electrode 41*b* is connected to the part that lies nearer the other end of the output-stage first resonant electrode 30*b* than the center of the part facing the output-stage first resonant electrode 30*b* and also lies nearer the other end of the output-stage second resonant electrode 31*b* than the center of the part facing the output-stage second resonant electrode 31*b*, by the third through conductor 52*b*. In this construction, even in a case where an electric signal from the external circuit is inputted to the input coupling electrode 40*a* via the auxiliary input coupling electrode 41*a*, and the electric signal is outputted from the output coupling electrode 40*b* to the external circuit via the auxiliary output coupling electrode 41*b*, the input coupling electrode 40*a* and the input-stage first resonant electrode 30*a* as well as the output-stage second resonant electrode 31*b* can be coupled to each other in an interdigital form, and also the output coupling electrode 40*b* and the output-stage first resonant electrode 30*b* as well as the output-stage second resonant electrode 31*b* can be coupled to each other in an interdigital form. This makes it possible to establish strong mutual coupling by virtue of the combination of the effects of magnetic field coupling and electric field coupling.

Note that, in the bandpass filter of the present embodiment, since an electric signal from the external circuit travels through the input terminal electrode 60*a*, an eighth through conductor 55*a*, the auxiliary input coupling electrode 41*a*, and the second through conductor 52*a* so as to be inputted to the input coupling electrode 40*a*, it follows that a point of connection between the input coupling electrode 40*a* and the second through conductor 52*a* corresponds to the electric signal input point 45*a* of the input coupling electrode 40*a*. Moreover, in the bandpass filter of the present embodiment, since the electric signal fed to the output coupling electrode 40*b* travels through the third through conductor 52*b*, the auxiliary output coupling electrode 41*b*, a ninth through conductor 55*b*, and the output terminal electrode 60*b* so as to be outputted to the external circuit, it follows that a point of connection between the output coupling electrode 40*b* and the third through conductor 52*b* corresponds to the electric signal output point 45*b* of the output coupling electrode 40*b*.

Moreover, according to the bandpass filter of the present embodiment, in the auxiliary input coupling electrode 41*a* as seen in its longitudinal direction, its end opposite from the end connected to the second through conductor 52*a* is connected via the eighth through conductor 55*a* to the input terminal electrode 60*a* disposed on the upper face of the multilayer body 10. In this construction, a coupling body composed of the input-stage first resonant electrode 30*a* and the auxiliary resonant electrode 31*a* connected thereto and a coupling body composed of the input coupling electrode 40*a* and the auxiliary input coupling electrode 41*a* connected thereto are coupled to each other in an interdigital form as a whole. This makes it possible to establish strong mutual coupling by virtue of the combination of the effects of magnetic field coupling and electric field coupling. Hence, as compared with a case where the auxiliary input coupling electrode 41*a*, as seen in its longitudinal direction, is connected to the input terminal electrode 60*a* at the same side that is connected to the input coupling electrode 40*a*, a greater degree of coupling strength can be ensured.

Likewise, according to the bandpass filter of the present embodiment, in the auxiliary output coupling electrode 41*b* as seen in its longitudinal direction, its end opposite from the end connected to the third through conductor 52*b* is connected via the ninth through conductor 55*b* to the output terminal electrode 60*b* disposed on the upper face of the multilayer body 10. In this construction, a coupling body composed of the input-stage first resonant electrode 30*b* and the auxiliary resonant electrode 32*b* connected thereto and a coupling body composed of the output coupling electrode 40*b* and the auxiliary output coupling electrode 41*b* connected thereto are coupled to each other in an interdigital form as a whole. This makes it possible to establish strong mutual coupling by virtue of the combination of the effects of magnetic field coupling and electric field coupling. Hence, as compared with a case where the auxiliary output coupling electrode 41*b*, as seen in its longitudinal direction, is connected to the output terminal electrode 60*b* at the same side that is connected to the output coupling electrode 40*b*, a greater degree of coupling strength can be ensured.

In this way, the coupling body composed of the input-stage first resonant electrode 30*a* and the auxiliary resonant electrode 32*a* connected thereto and the coupling body composed of the input coupling electrode 40*a* and the auxiliary input coupling electrode 41*a* connected thereto are broadside-coupled to each other as a whole, and are also brought into an interdigitally-coupled state, thereby achieving extremely strong mutual coupling. Likewise, the coupling body composed of the input-stage first resonant electrode 30*b* and the auxiliary resonant electrode 32*b* connected thereto and the coupling body composed of the output coupling electrode 40*b* and the auxiliary output coupling electrode 41*b* connected thereto are broadside-coupled to each other as a whole, and are also brought into an interdigitally-coupled state, thereby achieving extremely strong mutual coupling. Accordingly, where the pass band formed by the plurality of first resonant electrodes 30*a*, 30*b*, 30*c*, and 30*d* is concerned, even in an extremely wide pass band width, it is possible to obtain bandpass characteristics of achieving further flatness and loss reduction over the entire region of a wide pass band by lessening an increase in insertion loss at a frequency falling between the resonance frequencies in the respective resonant modes.

For example, the width of the auxiliary input coupling electrode 41*a*, as well as the width of the auxiliary output coupling electrode 41*b*, is set to be substantially the same as those of the input coupling electrode 40*a* and the output coupling electrode 40*b*, and the length of the auxiliary input coupling electrode 41*a*, as well as the length of the auxiliary output coupling electrode 41*b*, is set to be slightly longer than that of the auxiliary resonant electrode 32*a*, 32*b*. Although the spacing between the auxiliary input coupling electrode 41*a* as well as the auxiliary output coupling electrode 41*b* and the auxiliary resonant electrode 32*a*, 32*b* should preferably be made as small as possible from the standpoint of achieving strong mutual coupling, a reduction in the spacing gives rise to difficulty in manufacturing operation. Accordingly, the spacing is set to fall in a range of from approximately 0.01 to 0.5 mm, for example.

Further, according to the bandpass filter of the present embodiment, on the interlayer B of the multilayer body 10 located above the second interlayer is provided the input-side auxiliary coupling resonant electrode 33*a* placed so as to have the region facing the input-stage second resonant electrode 31*a* and the region facing the auxiliary input coupling electrode 41*a*, of which the input-stage second resonant electrode 31*a*-facing region is connected to the other end side of the input-stage second resonant electrode 31*a* by the fourth through conductor 53*a* passing all the way through the dielectric layer 11 located between the input-stage second resonant electrode 31*a*-facing region and the input-stage second resonant electrode 31*a*. Likewise, on the interlayer B of the multilayer body 10 is provided the output-side auxiliary coupling resonant electrode 33*b* placed so as to have the region facing the output-stage second resonant electrode 31*b* and the region facing the auxiliary output coupling electrode 41*b*, of which the output-stage second resonant electrode 31*b*-facing region is connected to the other end side of the output-stage second resonant electrode 31*b* by the fifth through conductor 53*b* passing all the way through the dielectric layer 11 located between the output-stage second resonant electrode 31*b*-facing region and the output-stage second resonant electrode 31*b*. In this construction, strong electromagnetic-field coupling is established between the input-side auxiliary coupling resonant electrode 33*a* connected to the input-stage second resonant electrode 31*a* and the auxiliary input coupling electrode 41*a* in a broadside-coupled state, and the effect of this electromagnetic-field coupling is added to the electromagnetic-field coupling between the input-stage second resonant electrode 31*a* and the input coupling electrode 40*a*. Likewise, strong electromagnetic-field coupling is established between the output-side auxiliary coupling resonant electrode 33*b* connected to the output-stage second resonant electrode 31*b* and the auxiliary, output coupling electrode 41*b* in a broadside-coupled state, and the effect of this electromagnetic-field coupling is added to the electromagnetic-field coupling between the output-stage second resonant electrode 31*b* and the output coupling electrode 40*b*. This makes it possible to strengthen the electromagnetic-field coupling between the input coupling electrode 40*a* and the input-stage second resonant electrode 31*a* and strengthen the electromagnetic-field coupling between the output coupling electrode 40*b* and the output-stage second resonant electrode 31*b*. Moreover, the coupling body composed of the input-stage second resonant electrode 31*a* and the input-side auxiliary coupling resonant electrode 33*a* connected thereto and the coupling body composed of the input coupling electrode 40*a* and the auxiliary input coupling electrode 41*a* connected thereto are coupled to each other in an interdigital form as a whole. This makes it possible to establish even stronger electromagnetic-field coupling by virtue of the combination of the effects of magnetic field coupling and electric field coupling. Likewise, the coupling body composed of the output-stage second resonant electrode 31*b* and the output-side auxiliary coupling resonant electrode 33*b* connected thereto and the coupling body composed of the output coupling electrode 40*b* and the auxiliary output coupling electrode 41*b* connected thereto are coupled to each other in an interdigital form as a whole. This makes it possible to establish even stronger electromagnetic-field coupling by virtue of the combination of the effects of magnetic field coupling and electric field coupling. Accordingly, where the pass band formed by the plurality of second resonant electrodes 31*a*, 31*b*, 31*c*, and 31*d* is concerned, even in an extremely wide pass band width, it is possible to obtain bandpass characteristics of achieving further flatness and loss reduction over the entire region of a wide pass band by lessening an increase in insertion loss at a frequency falling between the resonance frequencies in the respective resonant modes.

According to the bandpass filter of the present embodiment, it is possible to obtain a bandpass filter that is more compact and offers broader-band performance compared to the bandpass filter of the above-mentioned first embodiment.

(Third Embodiment)

Figure 9:
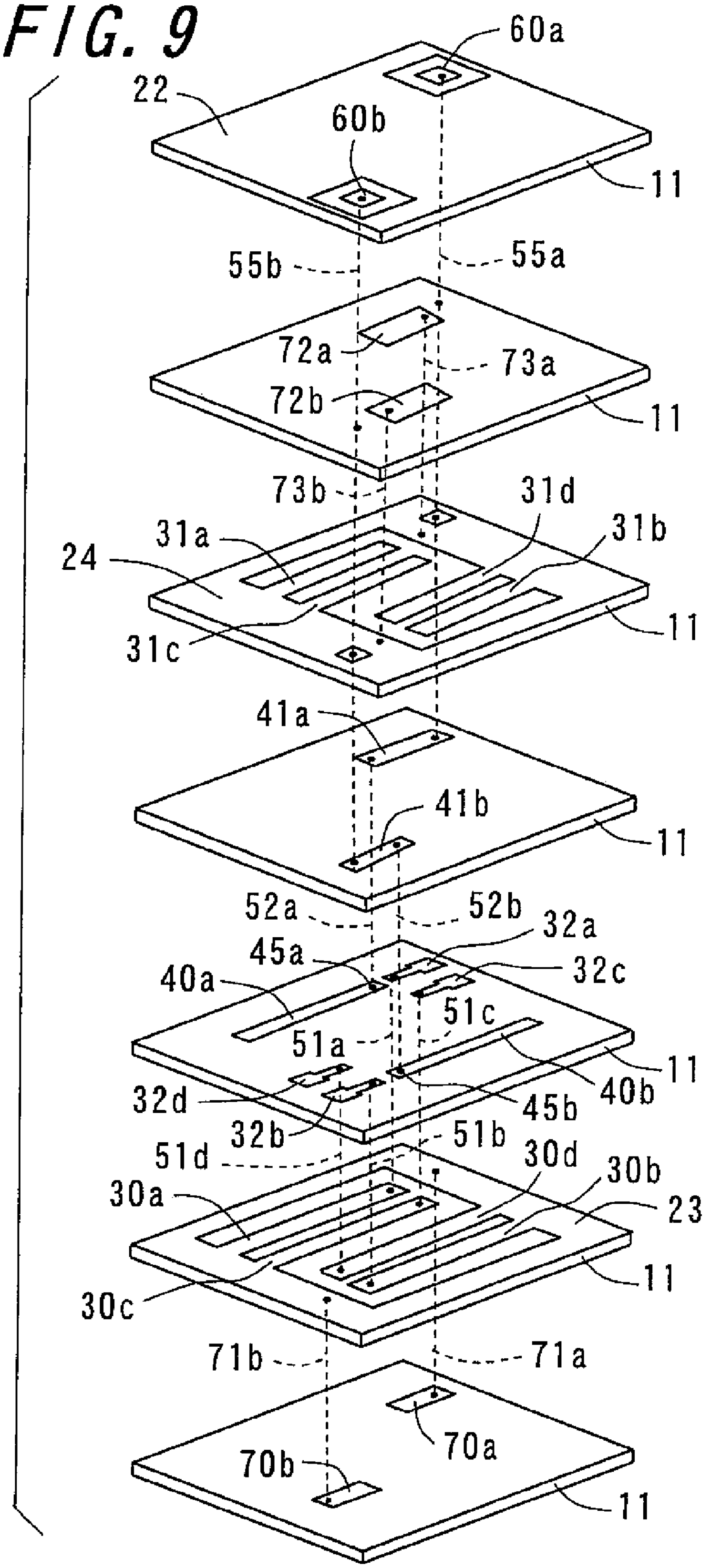
FIG. 9 is an exploded perspective view schematically showing a bandpass filter in accordance with a third embodiment of the invention.

FIG. 9 is an exploded perspective view schematically showing a bandpass filter in accordance with a third embodiment of the invention. Note that the following description deals with in what way this embodiment differs from the above-mentioned second embodiment, and the constituent components thereof that play the same or corresponding roles as in the preceding embodiments will be denoted by the same reference numerals and overlapping descriptions will be omitted.

In the bandpass filter of this embodiment, as shown in FIG. 9, on the first interlayer, the first resonant electrodes 30*a* and 30*c* are so arranged that their one ends are positioned on the same side. The first resonant electrodes 30*c* and 30*d* are so arranged that their one ends are displaced in relation to each other in a staggered manner. The first resonant electrodes 30*d* and 30*b* are so arranged that their one ends are positioned on the same side. Moreover, on the second interlayer, the first resonant electrodes 31*a* and 31*c* are so arranged that their one ends are positioned on the same side. The first resonant electrodes 31*c* and 31*d* are so arranged that their one ends are displaced in relation to each other in a staggered manner. The first resonant electrodes 31*d* and 31*b* are so arranged that their one ends are positioned on the same side.

In the bandpass filter of the present embodiment, the first resonant electrodes 30*a* and 30*c* are coupled to each other in a comb-line form. The first resonant electrodes 30*c* and 30*d* are coupled to each other in an interdigital form. The first resonant electrodes 30*d* and 30*b* are coupled to each other in a comb-line form. Moreover, the second resonant electrodes 31*a* and 31*c* are coupled to each other in a comb-line form. The second resonant electrodes 31*c* and 31*d* are coupled to each other in an interdigital form. The second resonant electrodes 31*d* and 31*b* are coupled to each other in a comb-line form.

Moreover, in the bandpass filter of the present embodiment, just like the auxiliary resonant electrodes 32*a* and 32*b*, the auxiliary resonant electrodes 32*c* and 32*d* are also arranged on the third interlayer. The auxiliary input coupling electrode 41*a* and the auxiliary output coupling electrode 41*b* are arranged on a fourth interlayer lying between the second interlayer and the third interlayer.

Further, in the bandpass filter of the present embodiment, on an interlayer A of the multilayer body 10 located below the first interlayer, there is disposed a first coupling electrode 70*a* connected via a through conductor 71*a* to the annular ground electrode 23 so as to face the other ends of, respectively, the first resonant electrodes 30*a* and 30*c*. Also disposed on the interlayer A is a second coupling electrode 70*b* connected via a through conductor 71*b* to the annular ground electrode 23 so as to face the other ends of, respectively, the first resonant electrodes 30*d* and 30*b*.

Still further, in the bandpass filter of the present embodiment, on an interlayer B of the multilayer body 10 located above the second interlayer, there is disposed a third coupling electrode 72*a* connected via a through conductor 73*a* to the annular ground electrode 24 so as to face the other ends of, respectively, the second resonant electrodes 31*a* and 31*c*. Also disposed on the interlayer B is a fourth coupling electrode 72*b* connected via a through conductor 73*b* to the annular ground electrode 24 so as to face the other ends of, respectively, the second resonant electrodes 31*d* and 31*b*.

According to the bandpass filter of the present embodiment, the first coupling electrode 70*a* helps increase electrostatic capacitance between each of the first resonant electrodes 30*a* and 30*c* and the ground potential. Likewise, the second coupling electrode 70*b* helps increase electrostatic capacitance between each of the first resonant electrodes 30*d* and 30*b* and the ground potential, the third coupling electrode 72*a* helps increase electrostatic capacitance between each of the second resonant electrodes 31*a* and 31*c* and the ground potential, and the fourth coupling electrode 72*b* helps increase electrostatic capacitance between each of the second resonant electrodes 31*d* and 31*b* and the ground potential. This makes it possible to reduce the lengths of, respectively, the first resonant electrodes 30*a*, 30*b*, 30*c*, and 30*d* and the lengths of, respectively, the first resonant electrodes 31*a*, 31*b*, 31*c*, and 31*d*, and thereby obtain a more compact bandpass filter.

Moreover, according to the bandpass filter of the present embodiment, the first coupling electrode 70*a* helps strengthen the electromagnetic coupling between the adjacent first resonant electrodes 30*a* and 30*c*. Likewise, the second coupling electrode 70*b* helps strengthen the electromagnetic coupling between the adjacent first resonant electrodes 30*d* and 30*b*, the third coupling electrode 72*a* helps strengthen the electromagnetic coupling between the adjacent second resonant electrodes 31*a* and 31*c*, and the fourth coupling electrode 72*b* helps strengthen the electromagnetic coupling between the adjacent second resonant electrodes 31*d* and 31*b*. Hence, just as in the case where all the first resonant electrodes 30*a*, 30*b*, 30*c*, and 30*d* make electromagnetic-field coupling with each other in an interdigital form and all the first resonant electrodes 31*a*, 31*b*, 31*c*, and 31*d* make electromagnetic-field coupling with each other in an interdigital form, it is possible to obtain a bandpass filter having a wide pass band.

(Fourth Embodiment)

Figure 10:
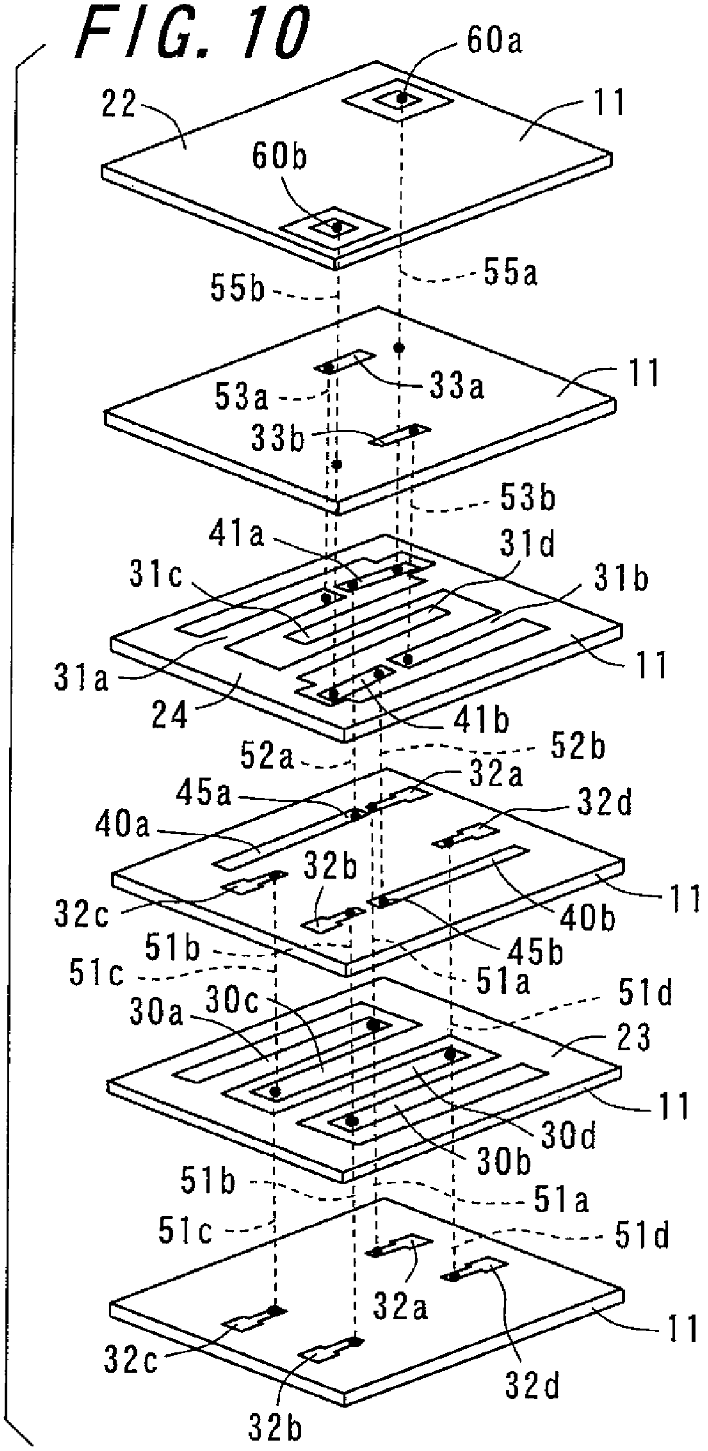
FIG. 10 is an exploded perspective view schematically showing a bandpass filter in accordance with a fourth embodiment of the invention.
Figure 11:
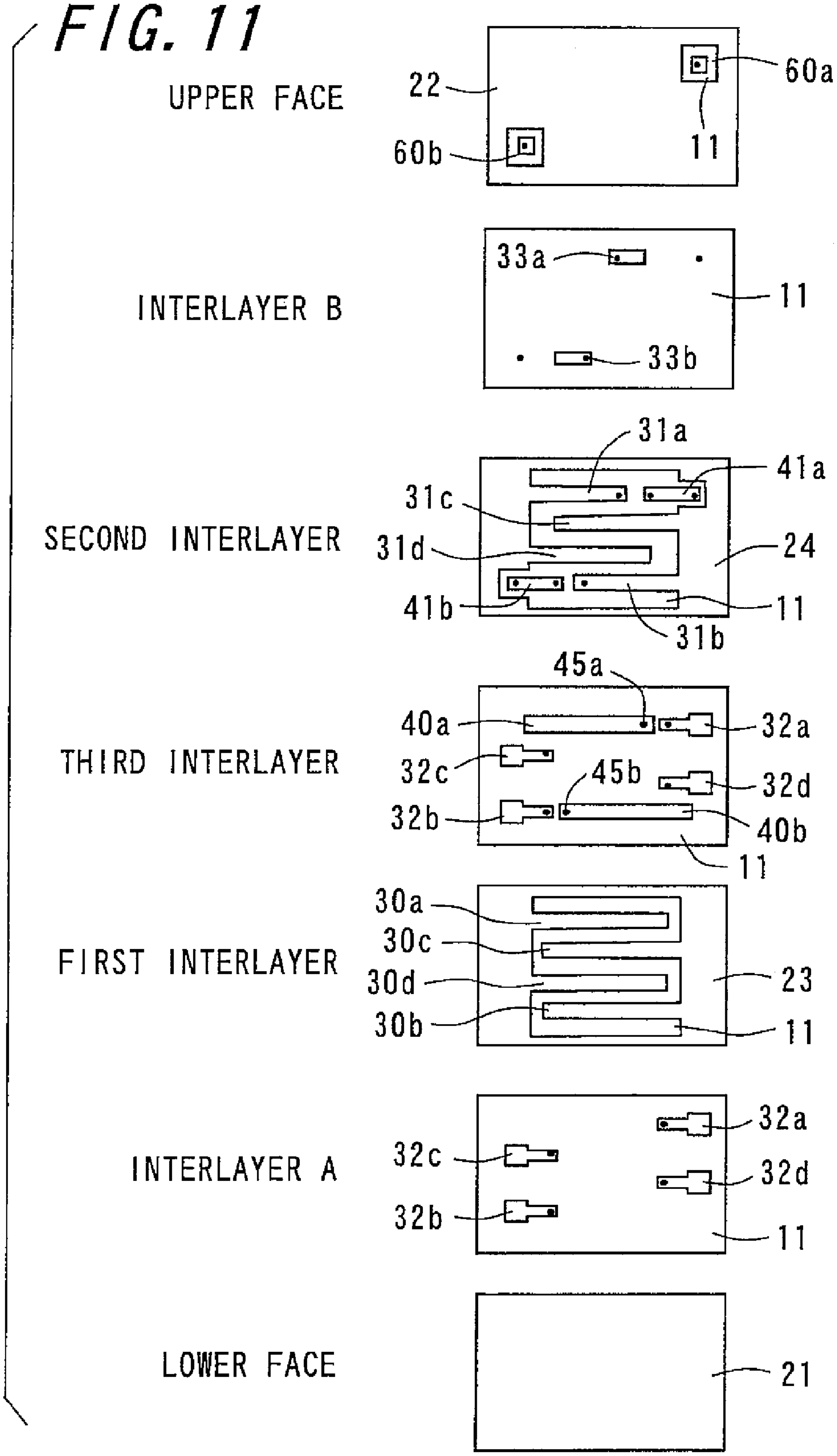
FIG. 11 is a plan view schematically showing upper and lower faces and interlayers of the bandpass filter shown in FIG. 10.

FIG. 10 is an exploded perspective view schematically showing a bandpass filter in accordance with a fourth embodiment of the invention. FIG. 11 is a plan view schematically showing upper and lower faces and interlayers of the bandpass filter shown in FIG. 10. Note that they following description deals with in what way this embodiment differs from the above-mentioned second embodiment, and the constituent components thereof that play the same or corresponding roles as in the preceding embodiments will be denoted by the same reference numerals and overlapping descriptions will be omitted.

According to the bandpass filter of this embodiment, on each of the third interlayer and the interlayer A of the multilayer body 10 that lie above the first interlayer and below the first interlayer, respectively, there are provided the auxiliary resonant electrodes 32*a*, 32*b*, 32*c*, and 32*d* that correspond to the plurality of first resonant electrodes 30*a*, 30*b*, 30*c*, and 30*d*, respectively. The auxiliary resonant electrode 32*a*, 32*b*, 32*c*, 32*d* is so placed as to have a region facing the first annular ground electrode 23 and a region facing the first resonant electrode, of which the first resonant electrode-facing region is connected to the other end side of the first resonant electrode by the first through conductor 51*a*, 51*b*, 51*c*, 51*d* passing all the way through the dielectric layer 11 located between the first resonant electrode-facing region and the first resonant electrode. In this construction, the plurality of first resonant electrodes 30*a*, 30*b*, 30*c*, and 30*d* are each provided with two auxiliary resonant electrodes. This makes it possible to further reduce the lengths of, respectively, the first resonant electrodes 30*a*, 30*b*, 30*c*, and 30*d*, and thereby obtain an even more compact bandpass filter.

(Fifth Embodiment)

Figure 12:
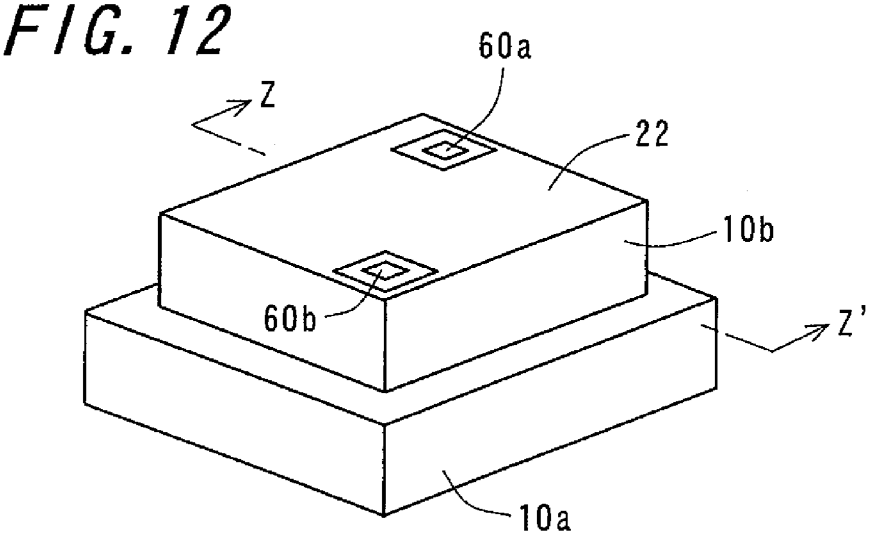
FIG. 12 is an external perspective view schematically showing a bandpass filter in accordance with a fifth embodiment of the invention.
Figure 13:
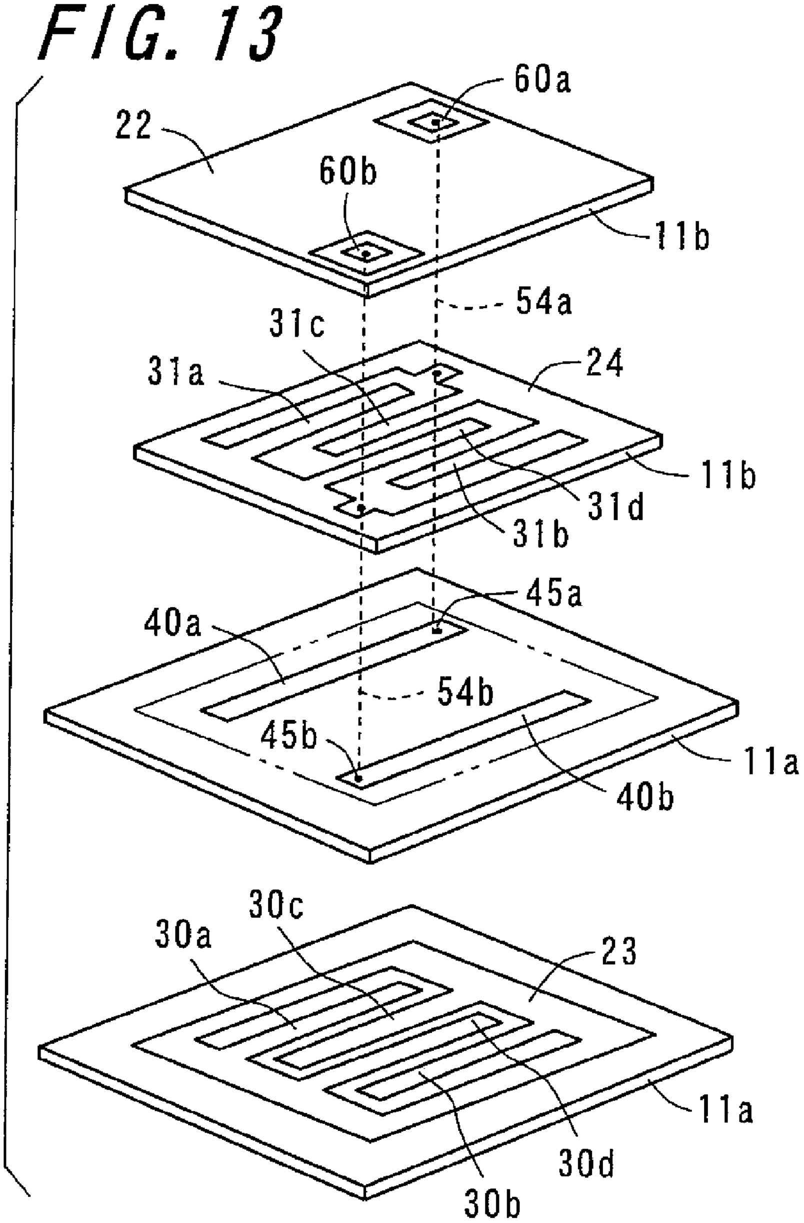
FIG. 13 is a schematic exploded perspective view of the bandpass filter shown in FIG. 12.
Figure 14:
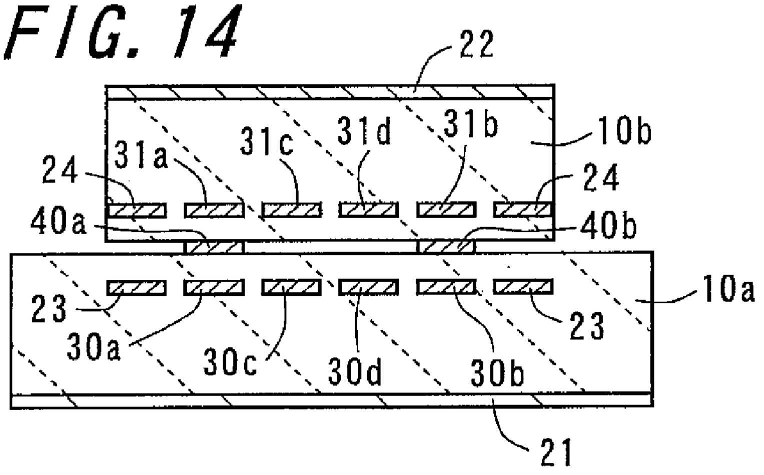
FIG. 14 is a sectional view of the bandpass filter taken along the line Z-Z' of FIG. 12.

FIG. 12 is an external perspective view schematically showing a bandpass filter in accordance with a fifth embodiment of the invention. FIG. 13 is a schematic exploded perspective view of the bandpass filter shown in FIG. 12. FIG. 14 is a sectional view of the bandpass filter taken along the line Z-Z' of FIG. 12. Note that the following description deals with in what way this embodiment differs from the above-mentioned first embodiment, and the constituent components thereof that play the same or corresponding roles as in the preceding embodiments will be denoted by the same reference numerals and overlapping descriptions will be omitted.

In the bandpass filter of this embodiment, as shown in FIGS. 12 to 14, the multilayer body comprises a first multilayer body 10*a* and a second multilayer body 10*b* placed thereon. The first ground electrode 21 is disposed on a lower face of the first multilayer body 10*a*. The second ground electrode 22 is disposed on an upper face of the second multilayer body 10*b*. The first interlayer, on which are arranged the first resonant electrodes 30*a*, 30*b*, 30*c*, and 30*d* and the first annular ground electrode 23, is located within the first multilayer body 10*a*. The second interlayer, on which are arranged the second resonant electrodes 31*a*, 31*b*, 31*c*, and 31*d* and the second annular ground electrode 24, is located within the second multilayer body 10*b*. The third interlayer, on which are arranged the input coupling electrode 40*a* and the output coupling electrode 40*b*, is located between the first multilayer body 10*a* and the second multilayer body 10*b*. Note that the first multilayer body 10*a* has a stack of a plurality of dielectric layers 11*a* on top of each other, and the second multilayer body 10*b* has a stack of a plurality of dielectric layers 11*b* on top of each other.

According to the bandpass filter of the present embodiment thereby constructed, the region bearing the first resonant electrodes 30*a*, 30*b*, 30*c*, and 30*d* and the region bearing the second resonant electrodes 31*a*, 31*b*, 31*c*, and 31*d* that differ in resonance frequency from each other, are separated into the first and second multilayer bodies 10*a* and 10*b*, by the third interlayer bearing the input coupling electrode 40*a* and the output coupling electrode 40*b* serving as a boundary. In this construction, by designing the dielectric layer constituting the first multilayer body 10*a* and the dielectric layer constituting the second multilayer body 10*b* to have different electrical characteristics, it is possible to obtain desired electrical characteristics with ease. For example, the dielectric constant of the dielectric layer 11*a* constituting the first multilayer body 10*a*, in which are arranged the first resonant electrodes 30*a*, 30*b*, 30*c*, and 30*d* that are made longer than the second resonant electrodes 31*a*, 31*b*, 31*c*, and 31*d* because of having lower resonance frequencies, is set to be higher than the dielectric constant of the dielectric layer 11*b* constituting the second multilayer body 10*b*. This makes it possible to reduce the lengths of, respectively, the first resonant electrodes 30*a*, 30*b*, 30*c*, and 30*d*, and thereby eliminate wasted space inside the bandpass filter with consequent miniaturization of the bandpass filter. Moreover, in the bandpass filter of the present embodiment, there is no need to establish electromagnetic-field coupling between the upper and lower electrode components separated by the third interlayer, which bears the input coupling electrode 40*a* and the output coupling electrode 40*b*, interposed therebetween. That is, the third interlayer serves as a boundary to separate the first multilayer body 10*a* and the second multilayer body 10*b*. In this construction, for example, even if the first multilayer body 10*a* and the second multilayer body 10*b* are positionally displaced with respect to each other, or an air layer exists at the boundary between the first multilayer body 10*a* and the second multilayer body 10*b*, the risk of consequent deterioration in electrical characteristics can be kept to the minimum. Further, for example, in a case where the first multilayer body 10*a* is designed as a module substrate for mounting another electronic component or the like on the face of the region thereof other than the region constituting the bandpass filter, by disposing part of the bandpass filter within the second multilayer body 10*b*, the thickness of the module substrate can be reduced. Accordingly, it is possible to obtain a bandpass filter-equipped substrate in which the module can be made smaller in thickness as a whole.

(Sixth Embodiment)

Figure 15:
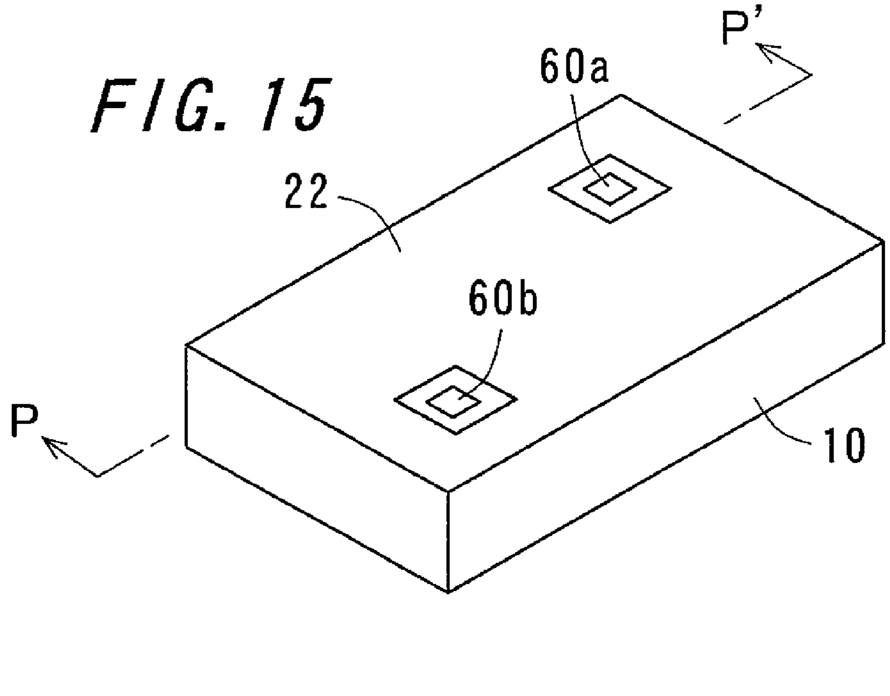
FIG. 15 is an external perspective view schematically showing a bandpass filter in accordance with a sixth embodiment of the invention.
Figure 16:
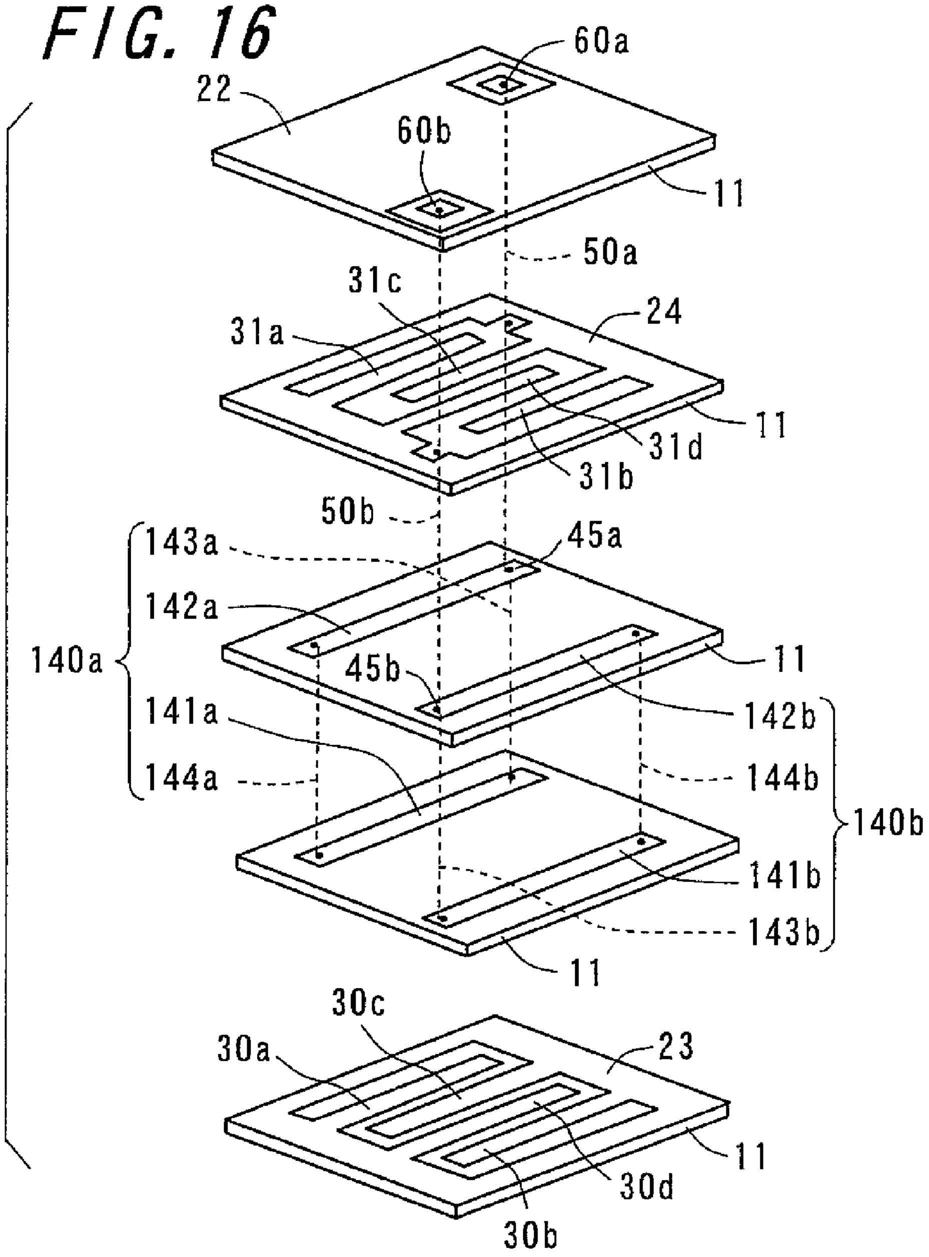
FIG. 16 is a schematic exploded perspective view of the bandpass filter shown in FIG. 15.
Figure 17:
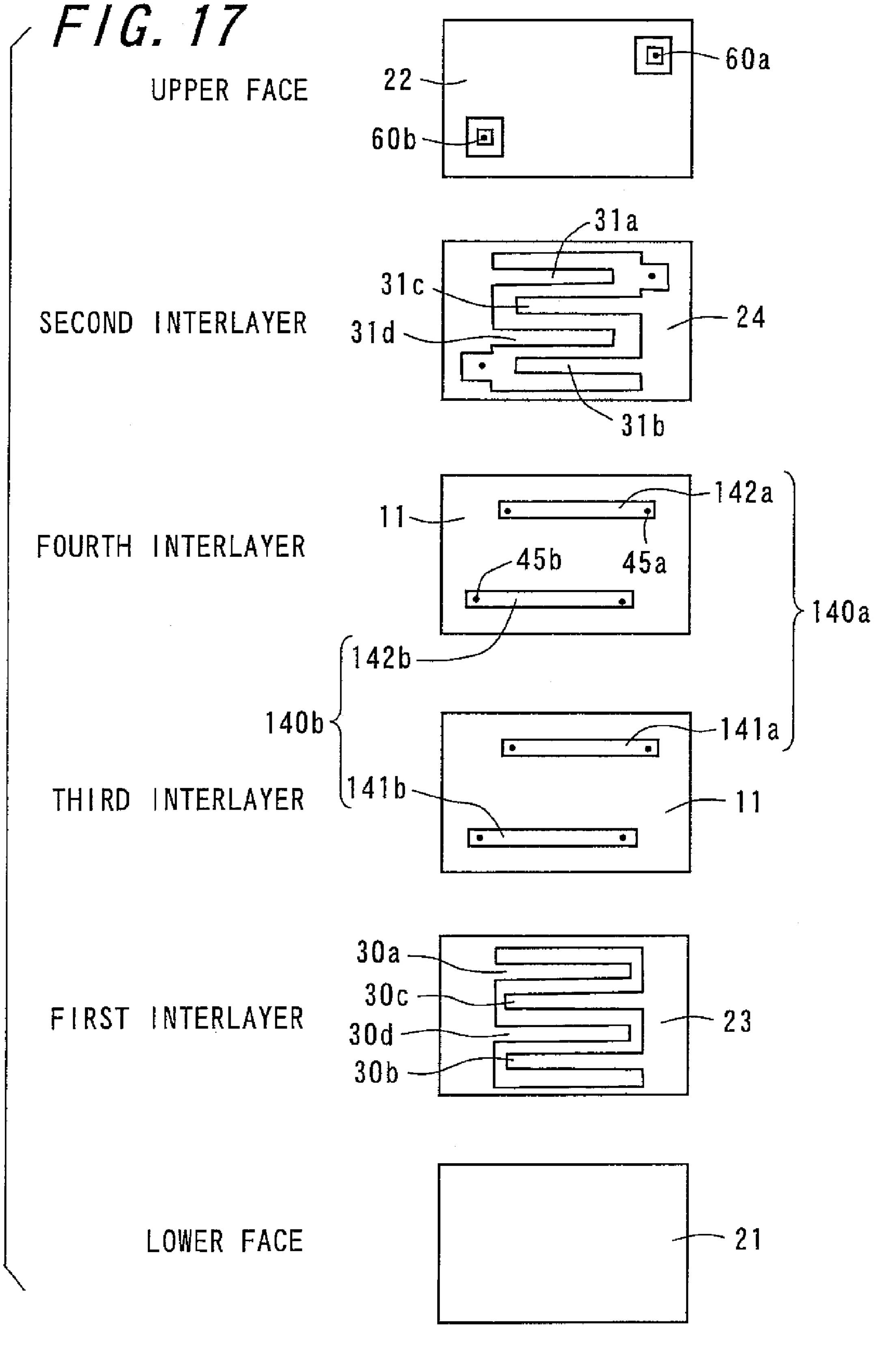
FIG. 17 is a plan view schematically showing upper and lower faces and interlayers of the bandpass filter shown in FIG. 15.
Figure 18:
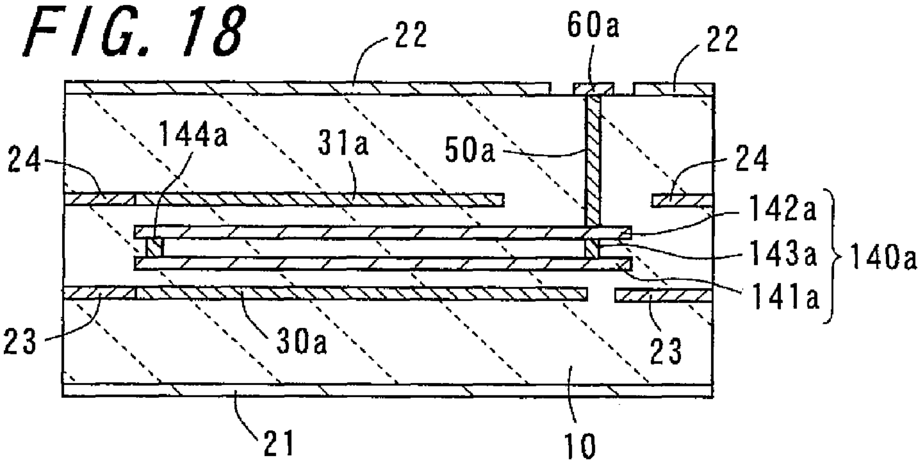
FIG. 18 is a sectional view of the bandpass filter taken along the line P-P' of FIG. 15.

FIG. 15 is an external perspective view schematically showing a bandpass filter in accordance with a sixth embodiment of the invention. FIG. 16 is a schematic exploded perspective view of the bandpass filter shown in FIG. 15. FIG. 17 is a plan view schematically showing upper and lower faces and interlayers of the bandpass filter shown in FIG. 15. FIG. 18 is a sectional view of the bandpass filter taken along the line P-P' of FIG. 15.

As shown in FIGS. 15 through 18, the bandpass filter of this embodiment includes the multilayer body 10, the first ground electrode 21, the second ground electrode 22, the plurality of strip-like first resonant electrodes 30*a*, 30*b*, 30*c*, and 30*d*, and the plurality of strip-like second resonant electrodes 31*a*, 31*b*, 31*c*, and 31*d*. The multilayer body 10 has a stack of a plurality of the dielectric layers 11 on top of each other. The first ground electrode 21 is disposed on the lower face of the multilayer body 10. The second ground electrode 22 is disposed on the upper face of the multilayer body 10. The plurality of first resonant electrodes 30*a*, 30*b*, 30*c*, and 30*d* are arranged side by side on the first interlayer of the multilayer body 10, with their one ends as well as the other ends displaced in relation to each other in a staggered manner. The first resonant electrodes have their one ends connected to ground so as to serve as a quarter-wavelength resonator and make electromagnetic-field coupling with each other. The plurality of second resonant electrodes 31*a*, 31*b*, 31*c*, and 31*d* are arranged side by side on the second interlayer of the multilayer body 10 different from the first interlayer, with their one ends as well as the other ends displaced in relation to each other in a staggered manner. The second resonant electrodes have their one ends connected to ground so as to serve as a quarter-wavelength resonator which resonates at a frequency higher than a frequency at which the first resonant electrode resonates, and make electromagnetic-field coupling with each other.

Moreover, the bandpass filter of the present embodiment includes a composite input coupling electrode 140*a* and a composite output coupling electrode 140*b*. The composite input coupling electrode 140*a* comprises a strip-like first input coupling electrode 141*a*, a strip-like second input coupling electrode 142*a*, and an input-side connection conductor 143*a*. The first input coupling electrode 141*a* is disposed on the third interlayer of the multilayer body 10 located between the first interlayer and the second interlayer, and faces the input-stage first resonant electrode 30*a* of the plurality of first resonant electrodes 30*a*, 30*b*, 30*c*, and 30*d*, over more than half of the entire longitudinal area thereof. The second input coupling electrode 142*a* is disposed on the fourth interlayer of the multilayer body 10 located between the second interlayer and the third interlayer, and faces the input-stage second resonant electrode 31*a* of the plurality of second resonant electrodes 31*a*, 31*b*, 31*c*, and 31*d*, over more than half of the entire longitudinal area thereof. The input-side connection conductor 143*a* provides connection between the first input coupling electrode 141*a* and the second input coupling electrode 142*a*. The composite input coupling electrode 140*a* makes electromagnetic-field coupling with the input-stage first resonant electrode 30*a* and the input-stage second resonant electrode 31*a*, and has the electric signal input point 45*a* for receiving input of an electric signal from the external circuit. The composite output coupling electrode 140*b* comprises a strip-like first output coupling electrode 141*b*, a strip-like second output coupling electrode 142*b*, and an output-side connection conductor 142*b*. The first output coupling electrode 141*b* is disposed on the third interlayer of the multilayer body 10, and faces the output-stage first resonant electrode 30*b* of the plurality of first resonant electrodes 30*a*, 30*b*, 30*c*, and 30*d*, over more than half of the entire longitudinal area thereof. The second output coupling electrode 142*b* is disposed on the fourth interlayer of the multilayer body 10, and faces the output-stage second resonant electrode 31*b* of the plurality of second resonant electrodes 31*a*, 31*b*, 31*c*, and 31*d*, over more than half of the entire longitudinal area thereof. The output-side connection conductor 143*b* provides connection between the first output coupling electrode 141*b* and the second output coupling electrode 142*b*. The composite output coupling electrode 140*b* makes electromagnetic-field coupling with the output-stage first resonant electrode 30*b* and the output-stage second resonant electrode 31*b*, and has the electric signal output point 45*b* for producing output of an electric signal from the external circuit.

Moreover, the bandpass filter of the present embodiment includes the first annular ground electrode 23 and the second annular ground electrode 24. The first annular ground electrode 23 is formed in an annular shape on the first interlayer of the multilayer body 10 so as to surround the plurality of first resonant electrodes 30*a*, 30*b*, 30*c*, and 30*d*, and is connected with the one ends of, respectively, the plurality of first resonant electrodes 30*a*, 30*b*, 30*c*, and 30*d*. The second annular ground electrode 24 is formed in an annular shape on the second interlayer so as to surround the plurality of second resonant electrodes 31*a*, 31*b*, 31*c*, and 31*d*, and is connected with the one ends of, respectively, the plurality of second resonant electrodes 31*a*, 31*b*, 31*c*, and 31*d*.

In the bandpass filter of the present embodiment, the one end of the input-stage first resonant electrode 30*a* and the one end of the input-stage second resonant electrode 31*a* are located on the same side. Moreover, the one end of the output-stage first resonant electrode 30*b* and the one end of the output-stage second resonant electrode 31*b* are located on the same side. In the composite input coupling electrode 140*a* as seen in its longitudinal direction, the electric signal input point 45*a* and the input-side connection conductor 143*a* are located at the part that lies nearer the other end of the input-stage first resonant electrode 30*a* than the center of the part facing the input-stage first resonant electrode 30*a* and also lies nearer the other end of the input-stage second resonant electrode 31*a* than the center of the part facing the input-stage second resonant electrode 31*a*. Also, in the composite output coupling electrode 140*b* as seen in its longitudinal direction, the electric signal output point 45*b* and the output-side connection conductor 143*b* are located at the part that lies nearer the other end of the output-stage first resonant electrode 30*b* than the center of the part facing the output-stage first resonant electrode 30*b* and also lies nearer the other end of the output-stage second resonant electrode 31*b* than the center of the part facing the output-stage second resonant electrode 31*b*.

Moreover, in the bandpass filter of the present embodiment, the composite input coupling electrode 140*a* is connected via a through conductor 50*a* to the input terminal electrode 60*a* disposed on the upper face of the multilayer body 10, and the composite output coupling electrode 140*b* is connected via a through conductor 50*b* to the output terminal electrode 60*b* disposed on the upper face of the multilayer body 10. Thus, a point of connection between the composite input coupling electrode 140*a* and the through conductor 50*a* corresponds to the electric signal input point 45*a* of the composite input coupling electrode 140*a*, and a point of connection between the composite output coupling electrode 140*b* and the through conductor 50*b* corresponds to the electric signal output point 45*b* of the composite output coupling electrode 140*b*.

In the bandpass filter of the present embodiment thereby constructed, an electric signal from the external circuit is inputted via the input terminal electrode 60*a* and the through conductor 50*a* to the electric signal input point 45*a* of the composite input coupling electrode 140*a*. Upon the input, the input-stage first resonant electrode 30*a* which makes electromagnetic-field coupling with the composite input coupling electrode 140*a* is excited, thus causing resonance in the plurality of first resonant electrodes 30*a*, 30*b*, 30*c*, and 30*d* that make electromagnetic-field coupling with each other. Then, the electric signal is outputted from the electric signal output point 45*b* of the composite output coupling electrode 140*b* which makes electromagnetic-field coupling with the output-stage first resonant electrode 30*b* to the external circuit via the through conductor 50*b* and the output terminal electrode 60*b*. At this time, signals in a first frequency band including frequencies at which the plurality of first resonant electrodes 30*a*, 30*b*, 30*c*, and 30*d* resonate are selectively passed, thereby forming the first pass band.

Moreover, in the bandpass filter of the present embodiment, when an electric signal from the external circuit is inputted via the input terminal electrode 60*a* and the through conductor 50*a* to the electric signal input point 45*a* of the composite input coupling electrode 140*a*, then the input-stage second resonant electrode 31*a* which makes electromagnetic-field coupling with the composite input coupling electrode 140*a* is excited, thus causing resonance in the plurality of second resonant electrodes 31*a*, 31*b*, 31*c*, and 31*d* that make electromagnetic-field coupling with each other. Then, the electric signal is outputted from the electric signal output point 45*b* of the composite output coupling electrode 140*b* which makes electromagnetic-field coupling with the output-stage second resonant electrode 31*b* to the external circuit via the through conductor 50*b* and the output terminal electrode 60*b*. At this time, signals in a second frequency band including frequencies at which the plurality of second resonant electrodes 31*a*, 31*b*, 31*c*, and 31*d* resonate are selectively passed, thereby forming the second pass band.

In this way, the bandpass filter of the present embodiment serves as a bandpass filter having two pass bands that differ in frequency from each other.

In the bandpass filter of the present embodiment, the first ground electrode 21 is so disposed as to extend all over the lower face of the multilayer body 10, and the second ground electrode 22 is so disposed as to extend substantially all over, the upper face of the multilayer body 10, except for the region around the input terminal electrode 60*a* and the region around the output terminal electrode 60*b*. The first and second ground electrodes 21 and 22 are each connected to ground and constitute, in conjunction with the plurality of first resonant electrodes 30*a*, 30*b*, 30*c*, and 30*d* and the plurality of second resonant electrodes 31*a*, 31*b*, 31*c*, and 31*d*, a strip line resonator.

Moreover, in the bandpass filter of the present embodiment, the plurality of strip-like first resonant electrodes 30*a*, 30*b*, 30*c*, and 30*d* have their one ends connected to the first annular ground electrode 23 to be connected to ground so as to serve as a quarter-wavelength resonator. The electrical length of each individual first resonant electrode is adjusted to approximately ¼ of the wavelength of the center frequency in the pass band formed by the plurality of first resonant electrodes 30*a*, 30*b*, 30*c*, and 30*d*. Likewise, the plurality of strip-like second resonant electrodes 31*a*, 31*b*, 31*c*, and 31*d* have their one ends connected to the second annular ground electrode 24 to be connected to ground so as to serve as a quarter-wavelength resonator. The electrical length of each individual second resonant electrode is adjusted to approximately ¼ of the wavelength of the center frequency in the pass band formed by the plurality of second resonant electrodes 31*a*, 31*b*, 31*c*, and 31*d*.

Moreover, the plurality of first resonant electrodes 30*a*, 30*b*, 30*c*, and 30*d* are arranged side by side for mutual edge coupling on the first interlayer of the multilayer body 10, and also the plurality of second resonant electrodes 31*a*, 31*b*, 31*c*, and 31*d* are arranged side by side for mutual edge coupling on the second interlayer of the multilayer body 10. Although the spacing between the adjacent ones of the plurality of juxtaposed first resonant electrodes 30*a*, 30*b*, 30*c*, and 30*d*, and the spacing between the adjacent ones of the plurality of juxtaposed second resonant electrodes 31*a*, 31*b*, 31*c*, and 31*d* should preferably be made as small as possible from the standpoint of achieving strong mutual coupling, a reduction in the spacing gives rise to difficulty in manufacturing operation. Accordingly, the spacing is set to fall in a range of from approximately 0.05 to 0.5 mm.

Further, since the plurality of juxtaposed first resonant electrodes 30*a*, 30*b*, 30*c*, and 30*d* are so arranged that one ends as well as the other ends thereof are displaced in relation to each other in a staggered manner, it follows that the resonant electrodes are coupled to each other in an interdigital form. In the case of interdigital form coupling, as compared with the case of comb-line form coupling, a higher coupling strength can be obtained by virtue of the combination of the effects of, magnetic field coupling and electric field coupling. This makes it possible to render, in the pass band formed by the plurality of first resonant electrodes 30*a*, 30*b*, 30*c*, and 30*d*, the frequency spacing between the resonance frequencies in the respective resonant modes suitable for the obtainment of an extremely wide pass band width of approximately 40% to 50% in terms of fractional bandwidth. The level of this pass band width is far in excess of the levels of pass band width that are realizable by conventional quarter-wavelength resonator-using filters.

Likewise, since the plurality of juxtaposed second resonant electrodes 31*a*, 31*b*, 31*c*, and 31*d* are so arranged that one ends as well as the other ends thereof are displaced in relation to each other in a staggered manner, it follows that the resonant electrodes are coupled to each other in an interdigital form. This makes it possible to render, in the pass band formed by the plurality of second resonant electrodes 31*a*, 31*b*, 31*c*, and 31*d*, the frequency spacing between the resonance frequencies in the respective resonant modes suitable for the obtainment of an extremely wide pass band width of approximately 40% to 50% in terms of fractional bandwidth, which is far in excess of the pass band widths that are realizable by conventional quarter-wavelength resonator-using filters.

Incidentally, it has been found by studies that, when a plurality of resonant electrodes constituting a single pass band are broadside-coupled to each other and are also brought into an interdigitally-coupled state, then the coupling therebetween becomes unduly strong, and such a coupling technique is after all undesirable for the obtainment of a pass band width of approximately 40% to 50% in terms of fractional bandwidth.

Moreover, in the bandpass filter of the present embodiment, the composite input coupling electrode 140*a* comprises: the strip-like first input coupling electrode 141*a* disposed on the third interlayer of the multilayer body 10 located between the first interlayer and the second interlayer so as to face the input-stage first resonant electrode 30*a* over more than half of the entire longitudinal area thereof; the strip-like second input coupling electrode 142*a* disposed on the fourth interlayer of the multilayer body 10 located between the second interlayer and the third interlayer so as to face the input-stage second resonant electrode 31*a* over more than half of the entire longitudinal area thereof; and the input-side connection conductor 143*a* for providing connection between the first input coupling electrode 141*a* and the second input coupling electrode 142*a*. The composite input coupling electrode 140*a* makes electromagnetic-field coupling with the input-stage first resonant electrode 30*a* and the input-stage second resonant electrode 31*a*. In the composite input coupling electrode 140*a* as seen in its longitudinal direction, the electric signal input point 45*a* for receiving input of an electric signal from the external circuit and the input-side connection conductor 143a are located at the part that lies nearer the other end of the input-stage first resonant electrode 30a than the center of the part facing the input-stage first resonant electrode 30a and also lies nearer the other end of the input-stage second resonant electrode 31a than the center of the part facing the input-stage second resonant electrode 31a. In this construction, the composite input coupling electrode 140a is broadside-coupled and interdigitally-coupled to the input-stage first resonant electrode 30a and the input-stage second resonant electrode 31a. Therefore, strong electromagnetic-field coupling can be established by the broadside coupling, and also the interdigital form coupling makes the electromagnetic-field coupling even stronger with the combination of the effects of electric field coupling and magnetic field coupling. This makes it possible to achieve extremely strong coupling between the composite input coupling electrode 140a and the input-stage first resonant electrode 30a, as well as the input-stage second resonant electrode 31a. Further, in this construction, in contrast to a case where the composite input coupling electrode 140a is designed in the form of a single-layered electrode, it is possible to secure a wider spacing between the input-stage first resonant electrode 30a and the input-stage second resonant electrode 31a while maintaining the spacing between the composite input coupling electrode 140a and the input-stage first resonant electrode 30a as well as the input-stage second resonant electrode 31a. Accordingly, the direct electromagnetic-field coupling between the input-stage first resonant electrode 30a and the input-stage second resonant electrode 31a can be weakened without decreasing the strength of the electromagnetic-field coupling between the composite input coupling electrode 140a and the input-stage first resonant electrode 30a as well as the input-stage second resonant electrode 31a. This makes it possible to strengthen the electromagnetic-field coupling between the composite input coupling electrode 140a and the input-stage first resonant electrode 30a as well as the input-stage second resonant electrode 31a even further.

Further, in the bandpass filter of the present embodiment, the composite output coupling electrode 140b comprises: the strip-like first output coupling electrode 141b disposed on the third interlayer of the multilayer body 10 so as to face the output-stage first resonant electrode 30b over more than half of the entire longitudinal area thereof; the strip-like second output coupling electrode 142b disposed on the fourth interlayer of the multilayer body 10 so as to face the output-stage second resonant electrode 31b over more than half of the entire longitudinal area thereof; and the output-side connection conductor 143b for providing connection between the first output coupling electrode 141b and the second output coupling electrode 142b. The composite output coupling electrode 140b makes electromagnetic-field coupling with the output-stage first resonant electrode 30b and the output-stage second resonant electrode 31b. In the composite output coupling electrode 140b as seen in its longitudinal direction, the electric signal output point 45b for producing output of an electric signal from the external circuit and the output-side connection conductor 143b are located at the part that lies nearer the other end of the output-stage first resonant electrode 30b than the center of the part facing the output-stage first resonant electrode 30b and also lies nearer the other end of the output-stage second resonant electrode 31b than the center of the part facing the output-stage second resonant electrode 31b. In this construction, the composite output coupling electrode 140b is broadside-coupled and interdigitally-coupled to the output-stage first resonant electrode 30b and the output-stage second resonant electrode 31b. Therefore, strong electromagnetic-field coupling can be established by the broadside coupling, and also the interdigital form coupling renders the electromagnetic-field coupling even stronger with the combination of the effects of electric field coupling and magnetic field coupling. This makes it possible to achieve extremely strong coupling between the composite output coupling electrode 140b and the output-stage first resonant electrode 30b, as well as the output-stage second resonant electrode 31b. Further, in this construction, in contrast to a case where the composite output coupling electrode 140b is designed in the form of a single-layered electrode instead of a double-layered electrode, it is possible to secure a wider spacing between the output-stage first resonant electrode 30b and the output-stage second resonant electrode 31b while maintaining the spacing between the composite output coupling electrode 140b and the output-stage first resonant electrode 30b as well as the output-stage second resonant electrode 31b. Accordingly, the direct electromagnetic-field coupling between the output-stage first resonant electrode 30b and the output-stage second resonant electrode 31b can be weakened without decreasing the strength of the electromagnetic-field coupling between the composite output coupling electrode 140b and the output-stage first resonant electrode 30b as well as the output-stage second resonant electrode 31b. This makes it possible to strengthen the electromagnetic-field coupling between the composite output coupling electrode 140b and the output-stage first resonant electrode 30b as well as the output-stage second resonant electrode 31b even further.

Moreover, according to the bandpass filter of the present embodiment, there is provided an input-side auxiliary connection conductor 144a for providing connection between the first input coupling electrode 141a and the second input, coupling electrode 142a. With respect to the center of the region where the first input coupling electrode 141a and the second input coupling electrode 142a face each other, the input-side auxiliary connection conductor 144a is disposed on the side opposite from the first input-side connection conductor 143a. In this construction, since the difference in potential between the first input coupling electrode 141a and the second input coupling electrode 142a can be narrowed near the open end of the composite input coupling electrode 140a, it follows that the strength of the electromagnetic-field coupling between the first input coupling electrode 141a and the second input coupling electrode 142a is decreased. In consequence, it is likely that the electromagnetic-field coupling between the first input coupling electrode 141a and the input-stage first resonant electrode 30a is strengthened and the electromagnetic-field coupling between the second input coupling electrode 142a and the input-stage second resonant electrode 31a is strengthened, too. According to the probable mechanism described just above, it is possible to strengthen the electromagnetic-field coupling between the composite input coupling electrode 140a and the input-stage first resonant electrode 30a as well as the input-stage second resonant electrode 31a even further.

Likewise, according to the bandpass filter of the present embodiment, there is provided an output-side auxiliary connection conductor 144b for providing connection between the first output coupling electrode 141b and the second output coupling electrode 142b. With respect to the center of the region where the first output coupling electrode 141b and the second output coupling electrode 142b face each other, the output-side auxiliary connection conductor 144b is disposed on the side opposite from the first output-side connection conductor 143b. This makes it'possible to strengthen the electromagnetic-field coupling between the composite output coupling electrode 140*b* and the output-stage first resonant electrode 30*b* as well as the output-stage second resonant electrode 31*b* even further.

Moreover, according to the bandpass filter of the present embodiment, the input-side auxiliary connection conductor 144*a* is disposed at one end opposite from the other end bearing the electric signal input point 45*a* and the first input-side connection conductor 143*a* with respect to the center of the region where the first input coupling electrode 141*a* and the second input coupling electrode 142*a* face each other. Likewise, the output-side auxiliary connection conductor 144*b* is disposed at one end opposite from the other end bearing the electric signal output point 45*b* and the first input-side connection conductor 143*b* with respect to the center of the region where the first output coupling electrode 141*b* and the second output coupling electrode 142*b* face each other. In this construction, the difference in potential between the first input coupling electrode 141*a* and the second input coupling electrode 142*a*, and the difference in potential between the first output coupling electrode 141*b* and the second output coupling electrode 142*b* can be narrowed to the minimum near the open ends of the composite input coupling electrode 140*a* and the composite output coupling electrode 140*b*. This makes it possible to strengthen the electromagnetic-field coupling between the composite input coupling electrode 140*a* and the input-stage first resonant electrode 30*a* as well as the input-stage second resonant electrode 31*a*, and the electromagnetic-field coupling between the composite output coupling electrode 140*b* and the output-stage first resonant electrode 30*b* as well as the output-stage second resonant electrode 31*b* even further.

Further, according to the bandpass filter of the present embodiment, the input-side connection conductor 143*a* and the input-side auxiliary connection conductor 144*a* are arranged at the opposite ends of the region where the first input coupling electrode 141*a* and the second input coupling electrode 142*a* face each other, and also the output-side connection conductor 143*b* and the output-side auxiliary connection conductor 144*b* are arranged at the opposite ends of the region where the first output coupling electrode 141*b* and the second output coupling electrode 142*b* face each other. In this construction, the potential of the first input coupling electrode 141*a* and the potential of the second input coupling electrode 142*a* can be approximated throughout the entire mutually facing region, and also the potential of the first output coupling electrode 141*b* and the, potential of the second output coupling electrode 142*b* can be approximated throughout the entire mutually facing region. This makes it possible to strengthen the electromagnetic-field coupling between the composite input coupling electrode 140*a* and the input-stage first resonant electrode 30*a* as well as the input-stage second resonant electrode 31*a*, and the electromagnetic-field coupling between the composite output coupling electrode 140*b* and the output-stage first resonant electrode 30*b* as well as the output-stage second resonant electrode 31*b* even further.

In this way, according to the bandpass filter of the present embodiment, the composite input coupling electrode 140*a* makes extremely strong electromagnetic-field coupling with the input-stage first resonant electrode 30*a* and the input-stage second resonant electrode 31*a*, and also the composite output coupling electrode 140*b* makes extremely strong electromagnetic-field coupling with the output-stage first resonant electrode 30*b* and the output-stage second resonant electrode 31*b*. Accordingly, in the entire regions of two extremely wide pass bands formed by the plurality of first resonant electrodes 30*a*, 30*b*, 30*c*, and 30*d* and the plurality of second resonant electrodes 31*a*, 31*b*, 31*c*, and 31*d*, respectively, it is possible to obtain bandpass characteristics of achieving flatness and loss reduction by lessening an increase in insertion loss and a decrease in return loss resulting from input-output impedance mismatching even at a frequency falling between the resonance frequencies in the respective resonant modes.

In the bandpass filter of the present embodiment, the one end of the input-stage first resonant electrode 30*a* and the one end of the input-stage second resonant electrode 31*a* are located on the same side, and also the one end of the output-stage first resonant electrode 30*b* and the one end of the output-stage second resonant electrode 31*b* are located on the same side. In this construction, the composite input coupling electrode 140*a* can be broadside-coupled and interdigitally-coupled to the input-stage first resonant electrode 30*a* and the input-stage second resonant electrode 31*a*, and also the composite output coupling electrode 140*b* can be broadside-coupled and interdigitally-coupled to the output-stage first resonant electrode 30*b* and the output-stage second resonant electrode 31*b*.

Although the spacing between the composite input coupling electrode 140*a* and the input-stage first resonant electrode 30*a* as well as the input-stage second resonant electrode 31*a*, and the spacing between the composite output coupling electrode 140*b* and the output-stage first resonant electrode 30*b* as well as the output-stage second resonant electrode 31*b* should preferably be made as small as possible from the standpoint of achieving strong mutual coupling, a reduction in the spacing gives rise to difficulty in manufacturing operation. Accordingly, the spacing is set to fall in a range of from approximately 0.01 to 0.5 mm.

Moreover, according to the bandpass filter of the present embodiment, there are provided the first annular ground electrode 23 which is formed in an annular shape on the first interlayer so as to surround the plurality of first resonant electrodes 30*a*, 30*b*, 30*c*, and 30*d* and is connected with the one ends of, respectively, the plurality of first resonant electrodes 30*a*, 30*b*, 30*c*, and 30*d*, and the second annular ground electrode 24 which is formed in an annular shape on the second interlayer so as to surround the plurality of second resonant electrodes 31*a*, 31*b*, 31*c*, and 31*d* and is connected with the one ends of, respectively, the plurality of second resonant electrodes 31*a*, 31*b*, 31*c*, and 31*d*. With the provision of these annular ground electrodes, in the plurality of first resonant electrodes 30*a*, 30*b*, 30*c*, and 30*d* and in the plurality of second resonant electrodes 31*a*, 31*b*, 31*c*, and 31*d* as well, an electrode connected to ground does exist on both sides of the resonant electrode in its longitudinal direction. Therefore, staggered one ends of the individual resonant electrodes can be connected to ground with ease. Moreover, since the first annular ground electrode 23 annularly surrounds the plurality of first resonant electrodes 30*a*, 30*b*, 30*c*, and 30*d* and the second annular ground electrode 24 annularly surrounds the plurality of second resonant electrodes 31*a*, 31*b*, 31*c*, and 31*d*, it is possible to reduce the peripheral leakage of electromagnetic waves produced by the plurality of first resonant electrodes 30*a*, 30*b*, 30*c*, and 30*d* and the plurality of second resonant electrodes 31*a*, 31*b*, 31*c*, and 31*d*. Such an effect is especially useful in the case of forming a bandpass filter in part of the area of the module substrate.

(Seventh Embodiment)

Figure 19:
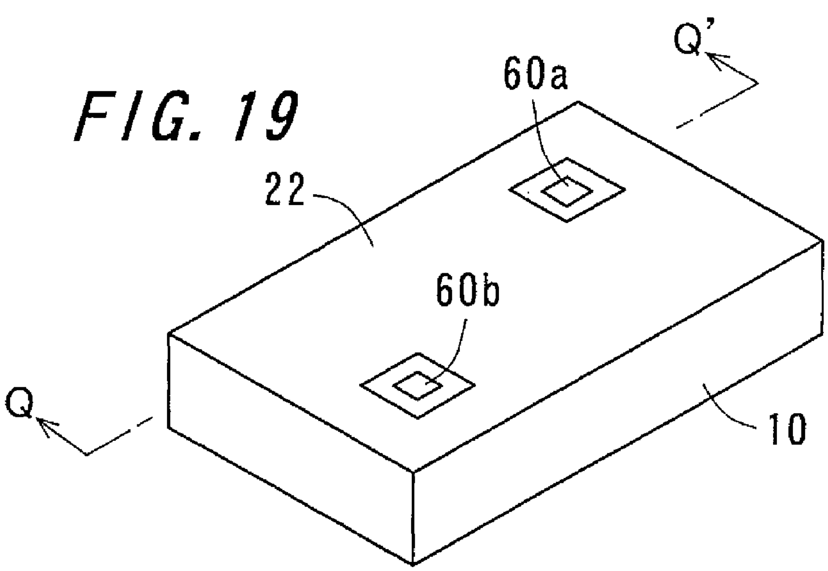
FIG. 19 is an external perspective view schematically showing a bandpass filter in accordance with a seventh embodiment of the invention.
Figure 20:
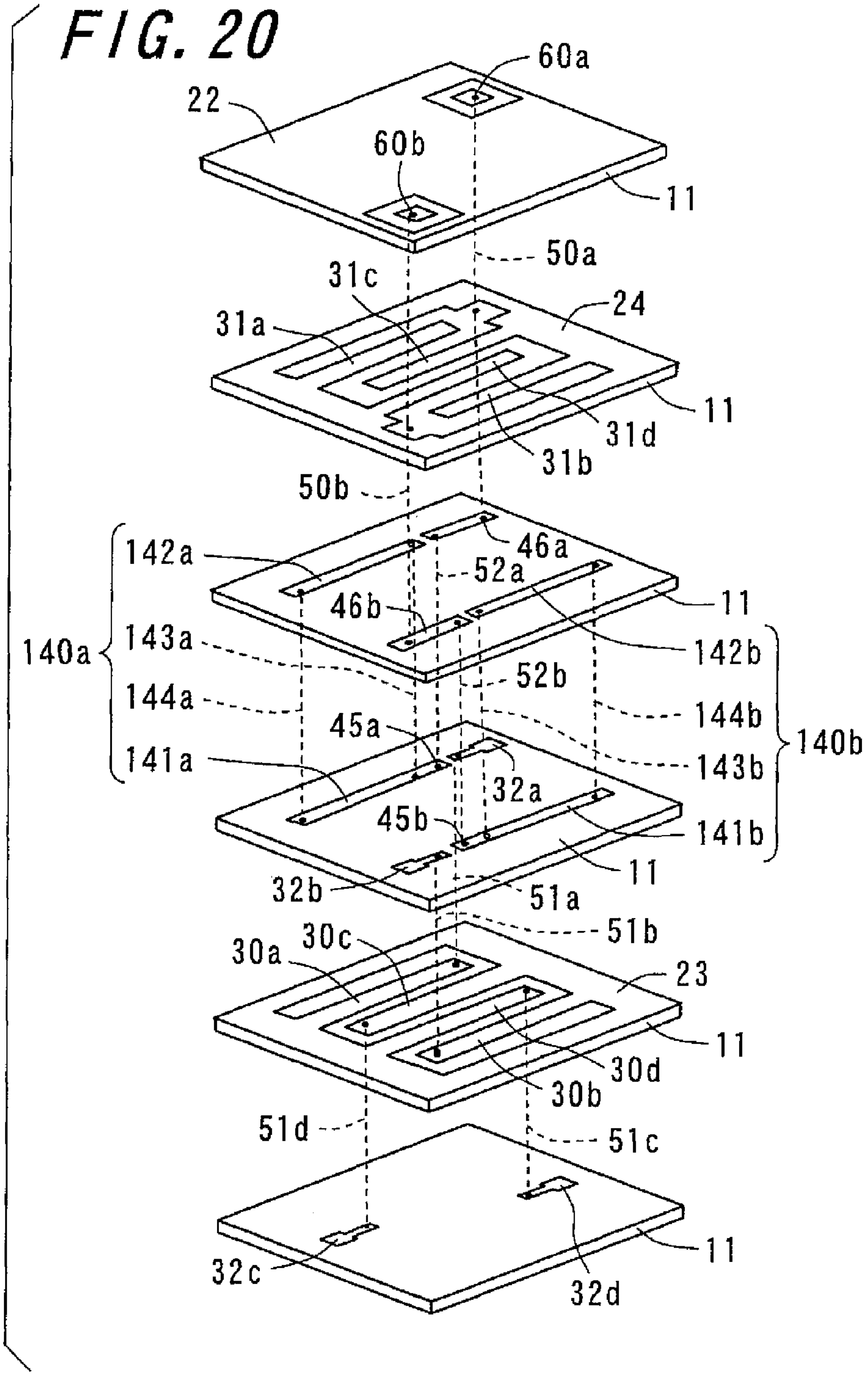
FIG. 20 is a schematic exploded perspective view of the bandpass filter shown in FIG. 19.
Figure 21:
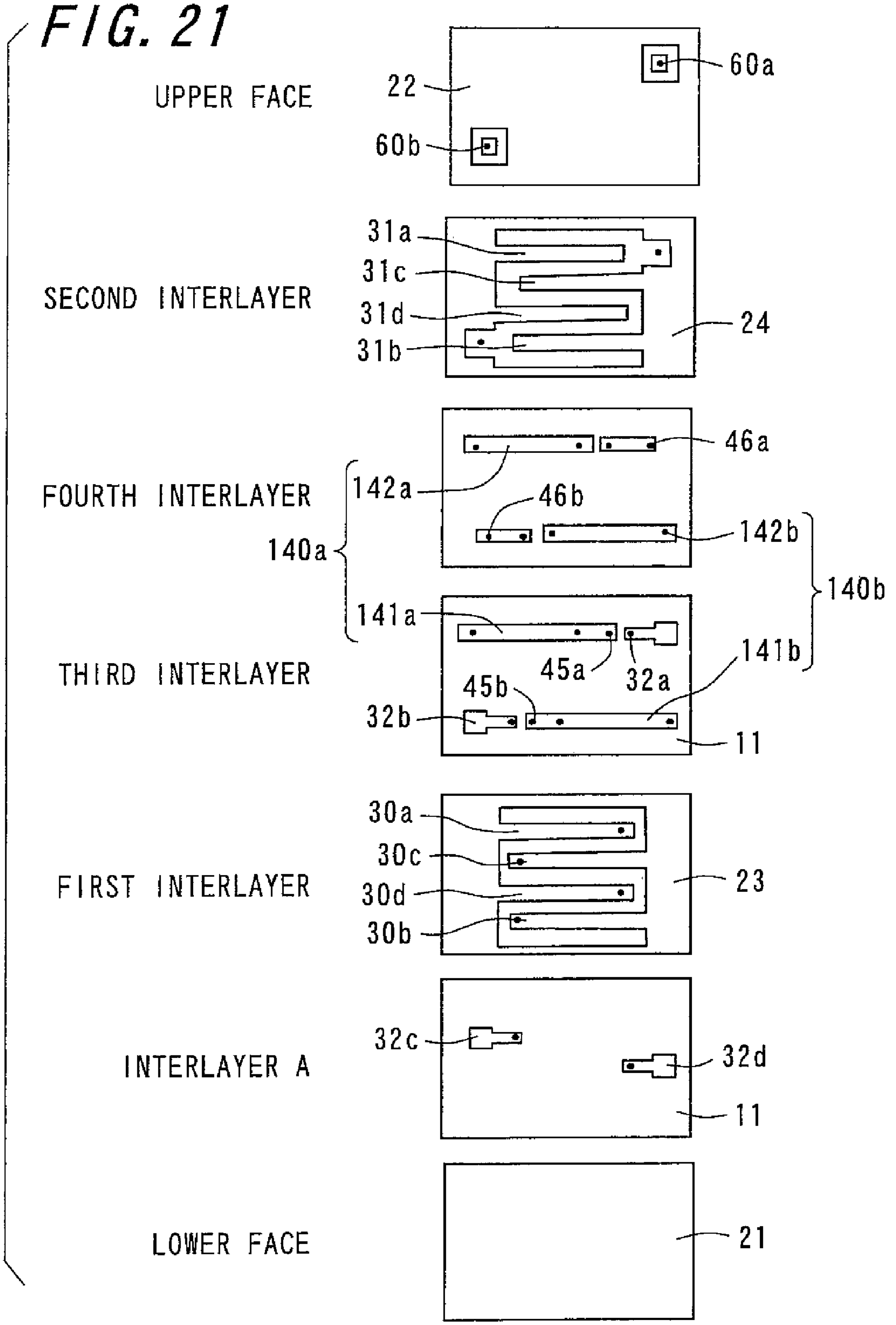
FIG. 21 is a plan view schematically showing upper and lower faces and interlayers of the bandpass filter shown in FIG. 19.

FIG. 19 is an external perspective view schematically showing a bandpass filter in accordance with a seventh embodiment of the invention. FIG. 20 is a schematic exploded perspective view of the bandpass filter shown in FIG. 19. FIG. 21 is a plan view schematically showing upper and lower faces and interlayers of the bandpass filter shown in FIG. 19.

Figure 22:
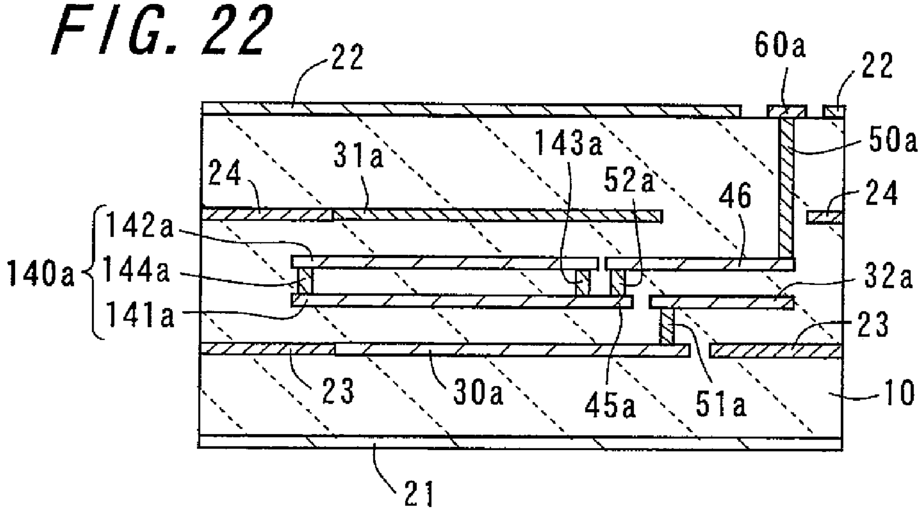
FIG. 22 is a sectional view of the bandpass filter taken along the line Q-Q' of FIG. 19.

FIG. 22 is a sectional view of the bandpass filter taken along the line Q-Q' of FIG. 19. Note that the following description deals with in what way this embodiment differs from the above-mentioned sixth embodiment, and the constituent components thereof that play the same or corresponding roles as in the preceding embodiments will be denoted by the same reference numerals and overlapping descriptions will be omitted.

As shown in FIGS. 19 through 22, in the bandpass filter of this embodiment, on the third interlayer of the multilayer body 10 located above the first interlayer, there are arranged an input-stage auxiliary resonant electrode 32*a* and an output-stage auxiliary resonant electrode 32*b*. The input-stage auxiliary resonant electrode 32*a* is so placed as to have a region facing the first annular ground electrode 23 and is connected via a through conductor 51*a* to the open end of the input-stage first resonant electrode 30*a*. The output-stage auxiliary resonant electrode 32*b* is so placed as to have a region facing the first annular ground electrode 23 and is connected via a through conductor 51*b* to the open end of the output-stage first resonant electrode 30*b*. In addition, on the interlayer A of the multilayer body 10 located below the first interlayer, there are arranged auxiliary resonant electrodes 32*c* and 32*d* that are each so placed as to have a region facing the first annular ground electrode 23 and are connected to the other ends of the first resonant electrodes 30*c* and 30*d*, respectively, via through conductors 51*c* and 51*d*, respectively.

Moreover, in the bandpass filter of the present embodiment, on the fourth interlayer of the multilayer body 10 located above the third interlayer, there are arranged an auxiliary input coupling electrode 46*a* and an auxiliary output coupling electrode 46*b*. The auxiliary input coupling electrode 46*a* is so placed as to have a region facing the input-stage auxiliary resonant electrode 32*a* and is connected via a through conductor 52*a* to the electric signal input point 45*a* of the composite input coupling electrode 140*a*. The auxiliary output coupling electrode 46*b* is so placed as to have a region facing the output-stage auxiliary resonant electrode 32*b* and is connected via a through conductor 52*b* to the electric signal output point 45*b* of the composite output coupling electrode 140*b*. The auxiliary input coupling electrode 46*a*, to which is connected the composite input coupling electrode 140*a* via the through conductor 52*a*, is connected via another through conductor 50*a* to the input terminal electrode 60*a*. The auxiliary output coupling electrode 46*b*, to which is connected the composite output coupling electrode 140*b* via the through conductor 52*b*, is connected via another through conductor 50*b* to the output terminal electrode 60*b*.

According to the bandpass filter of the present embodiment thereby constructed, on the third interlayer and the interlayer A of the multilayer body 10 that are different from the first interlayer, there are arranged the auxiliary resonant electrodes 32*a*, 32*b*, 32*c*, and 32*d* that are connected to the other end sides of the first resonant electrodes 30*a*, 30*b*, 30*c*, and 30*d*, respectively, via the through conductors 51*a*, 51*b*, 51*c*, and 51*d*, respectively, and are each so placed as to have the region facing the first annular ground electrode 23. In this construction, in the region where each of the auxiliary resonant electrodes 32*a*, 32*b*, 32*c*, and 32*d* and the first annular ground electrode 23 face each other, electrostatic capacitance arises therebetween. Since the resultant electrostatic capacitance is added to the electrostatic capacitance between the ground potential and each of the first resonant electrodes 30*a*, 30*b*, 30*c*, and 30*d* connected with the auxiliary resonant electrodes 32*a*, 32*b*, 32*c*, and 32*d*, respectively, it is possible to reduce the lengths of, respectively, the first resonant electrodes 30*a*, 30*b*, 30*c*, and 30*d*, and thereby obtain a more compact bandpass filter.

Moreover, the auxiliary resonant electrodes 32*a*, 32*b*, 32*c*, and 32*d* are connected to the other end sides of the first resonant electrodes 30*a*, 30*b*, 30*c*, and 30*d*, respectively, and are so formed as to extend therefrom in the opposite direction to the one ends of the first resonant electrodes 30*a*, 30*b*, 30*c*, and 30*d*, respectively. In this construction, the coupling body composed of the input-stage first resonant electrode 30*a* and the input-stage auxiliary resonant electrode 32*a* and a coupling body composed of the composite input coupling electrode 140*a* and the auxiliary input coupling electrode 46*a* are broadside-coupled to each other as a whole, thereby achieving extremely strong mutual coupling. Likewise, the coupling body composed of the output-stage first resonant electrode 30*b* and the output-stage auxiliary resonant electrode 32*b* and a coupling body composed of the composite output coupling electrode 140*b* and the auxiliary output coupling electrode 46*b* are broadside-coupled to each other as a whole, thereby achieving extremely strong mutual coupling.

The area of the part where the auxiliary resonant electrode 32*a*, 32*b*, 32*c*, 32*d* and the first annular ground electrode 23 face each other is set to fall, for example, in a range of from approximately 0.01 to 3 $mm^2$ in consideration of the balance between a required size and electrostatic capacitance to be obtained. Although the spacing between the confronting faces of, respectively, the auxiliary resonant electrode 32*a*, 32*b*, 32*c*, 32*d* and the first annular ground electrode 23 should preferably be made as small as possible from the standpoint of producing great electrostatic capacitance, a reduction in the spacing gives rise to difficulty in manufacturing operation. Accordingly, the spacing is set to fall in a range of from approximately 0.01 to 0.5 mm.

Moreover, according to the bandpass filter of the present embodiment, on the fourth interlayer of the multilayer body 10, there are arranged: the auxiliary input coupling electrode 46*a* which is so placed as to have the region facing the input-stage auxiliary resonant electrode 32*a* and is connected via the through conductor 52*a* to the electric signal input point 45*a* of the composite input coupling electrode 140*a*; and the auxiliary output coupling electrode 46*b* which is so placed as to have the region facing the output-stage auxiliary resonant electrode 32*b* and is connected via the through conductor 52*b* to the electric signal output point 45*b* of the composite output coupling electrode 140*b*. In this construction, strong electromagnetic-field coupling is established between the input-stage auxiliary resonant electrode 32*a* and the auxiliary input coupling electrode 46*a* in a broadside-coupled state, and the effect of this electromagnetic-field coupling is added to the electromagnetic-field coupling between the input-stage first resonant electrode 30*a* and the composite input coupling electrode 140*a*. Likewise, strong electromagnetic-field coupling is established between the output-stage auxiliary resonant electrode 32*b* and the auxiliary output coupling electrode 46*b* in a broadside-coupled state, and the effect of this electromagnetic-field coupling is added to the electromagnetic-field coupling between the output-stage first resonant electrode 30*b* and the composite output coupling electrode 140*b*. This makes it possible to strengthen the electromagnetic-field coupling between the composite input coupling electrode 140*a* and the input-stage first resonant electrode 30*a*, and the electromagnetic-field coupling between the composite output coupling electrode 140*b* and the output-stage first resonant electrode 30*b*. Accordingly, where the pass band formed by the plurality of first resonant electrodes 30*a*, 30*b*, 30*c*, and 30*d* is concerned, even in an extremely wide pass band width, it is possible to obtain bandpass characteristics of achieving further flatness and loss reduction over the entire region of a wide pass band by lessening an increase in insertion loss at a frequency falling between the resonance frequencies in the respective resonant modes.

Further, according to the bandpass filter of the present embodiment, in the composite input coupling electrode 140*a* as seen in its longitudinal direction, the electric signal input point 45*a*, to which is connected the auxiliary input coupling electrode 46*a*, is located at the part that lies nearer the other end of the input-stage first resonant electrode 30*a* than the center of the part facing the input-stage first resonant electrode 30*a* and also lies nearer the other end of the input-stage second resonant electrode 31*a* than the center of the part facing the input-stage second resonant electrode 31*a*. Also, in the composite output coupling electrode 140*b* as seen in its longitudinal direction, the electric signal output point 45*b*, to which is connected the auxiliary output coupling electrode 46*b*, is located at the part that lies nearer the other end of the output-stage first resonant electrode 30*b* than the center of the part facing the output-stage first resonant electrode 30*b* and also lies nearer the other end of the output-stage second resonant electrode 31*b* than the center of the part facing the output-stage second resonant electrode 31*b*. In this construction, even in a case where an electric signal from the external circuit is inputted to the composite input coupling electrode 140*a* via the auxiliary input coupling electrode 46*a*, and the electric signal is outputted from the composite output coupling electrode 140*b* to the external circuit via the auxiliary output coupling electrode 46*b*, the composite input coupling electrode 140*a* and the input-stage first resonant electrode 30*a* as well as the input-stage second resonant electrode 31*a* can be coupled to each other in an interdigital form, and also the composite output coupling electrode 140*b* and the output-stage first resonant electrode 30*b* as well as the output-stage second resonant electrode 31*b* can be coupled to each other in an interdigital form. This makes it possible to establish strong mutual coupling by virtue of the combination of the effects of magnetic field coupling and electric field coupling.

Still further, according to the bandpass filter of the present embodiment, in the auxiliary input coupling electrode 46*a* as seen in its longitudinal direction, its end opposite from the end connected to the composite input coupling electrode 140*a* via the through conductor 52*a* is connected to the input terminal electrode 60*a* via another through conductor 50*a*. In this construction, the coupling body composed of the input-stage first resonant electrode 30*a* and the input-stage auxiliary resonant electrode 32*a* and the coupling body composed of the composite input coupling electrode 140*a* and the auxiliary input coupling electrode 46*a* are coupled to each other in an interdigital form as a whole. This makes it possible to establish strong mutual coupling by virtue of the combination of the effects of magnetic field coupling and electric field coupling. Hence, as compared with a case where the auxiliary input coupling electrode 46*a*, as seen in its longitudinal direction, is connected to the input terminal electrode 60*a* at the same side that is connected to the composite input coupling electrode 140*a*, a greater degree of coupling strength can be ensured.

Likewise, according to the bandpass filter of the present embodiment, in the auxiliary output coupling electrode 46*b* as seen in its longitudinal direction, its end opposite from the end connected to the composite output coupling electrode 140*b* via the through conductor 52*b* is connected to the output terminal electrode 60*b* via another through conductor 50*b*. In this construction, the coupling body composed of the output-stage first resonant electrode 30*b* and the output-stage auxiliary resonant electrode 32*b* and the coupling body composed of the composite output coupling electrode 140*b* and the auxiliary output coupling electrode 46*b* are coupled to each other in an interdigital form as a whole. This makes it possible to establish strong mutual coupling by virtue of the combination of the effects of magnetic field coupling and electric field coupling. Hence, as compared with a case where the auxiliary output coupling electrode 46*b*, as seen in its longitudinal direction, is connected to the output terminal electrode 60*b* at the same side that is connected to the composite output coupling electrode 140*b*, a greater degree of coupling strength can be ensured.

In this way, the coupling body, composed of the input-stage first resonant electrode 30*a* and the input-stage auxiliary resonant electrode 32*a* and the coupling body composed of the composite input coupling electrode 140*a* and the auxiliary input coupling electrode 46*a* are broadside-coupled to each other as a whole, and are also brought into an interdigitally-coupled state, thereby achieving extremely strong mutual, coupling. Likewise, the coupling body composed of the output-stage first resonant electrode 30*b* and the output-stage auxiliary resonant electrode 32*b* and the coupling body composed of the composite output coupling electrode 140*b* and the auxiliary output coupling electrode 46*b* are broadside-coupled to each other as a whole, and are also brought into an interdigitally-coupled state, thereby achieving extremely strong mutual coupling. Accordingly, where the pass band formed by the plurality of first resonant electrodes 30*a*, 30*b*, 30*c*, and 30*d* is concerned, even in an extremely wide pass band width, it is possible to obtain bandpass characteristics of achieving further flatness and loss reduction over the entire region of a wide pass band by lessening an increase in insertion loss at a frequency falling between the resonance frequencies in the respective resonant modes.

For example, the width of the auxiliary input coupling electrode 46*a*, as well as the width of the auxiliary output coupling electrode 46*b*, is set to be substantially the same as those of the composite input coupling electrode 140*a* and the composite output coupling electrode 140*b*, and the length of the auxiliary input coupling electrode 46*a*, as well as the length of the auxiliary output coupling electrode 46*b*, is set to be slightly longer than that of the auxiliary resonant electrode 32*a*, 32*b*. Although the spacing between the auxiliary input coupling electrode 46*a* as well as the auxiliary output coupling electrode 46*b* and the auxiliary resonant electrode 32*a*, 32*b* should preferably be made as small as possible from the standpoint of achieving strong mutual coupling, a reduction in the spacing gives rise to difficulty in manufacturing operation. Accordingly, the spacing is set to fall in a range of from approximately. 0.01 to 0.5 mm, for example.

(Eighth Embodiment)

Figure 23:
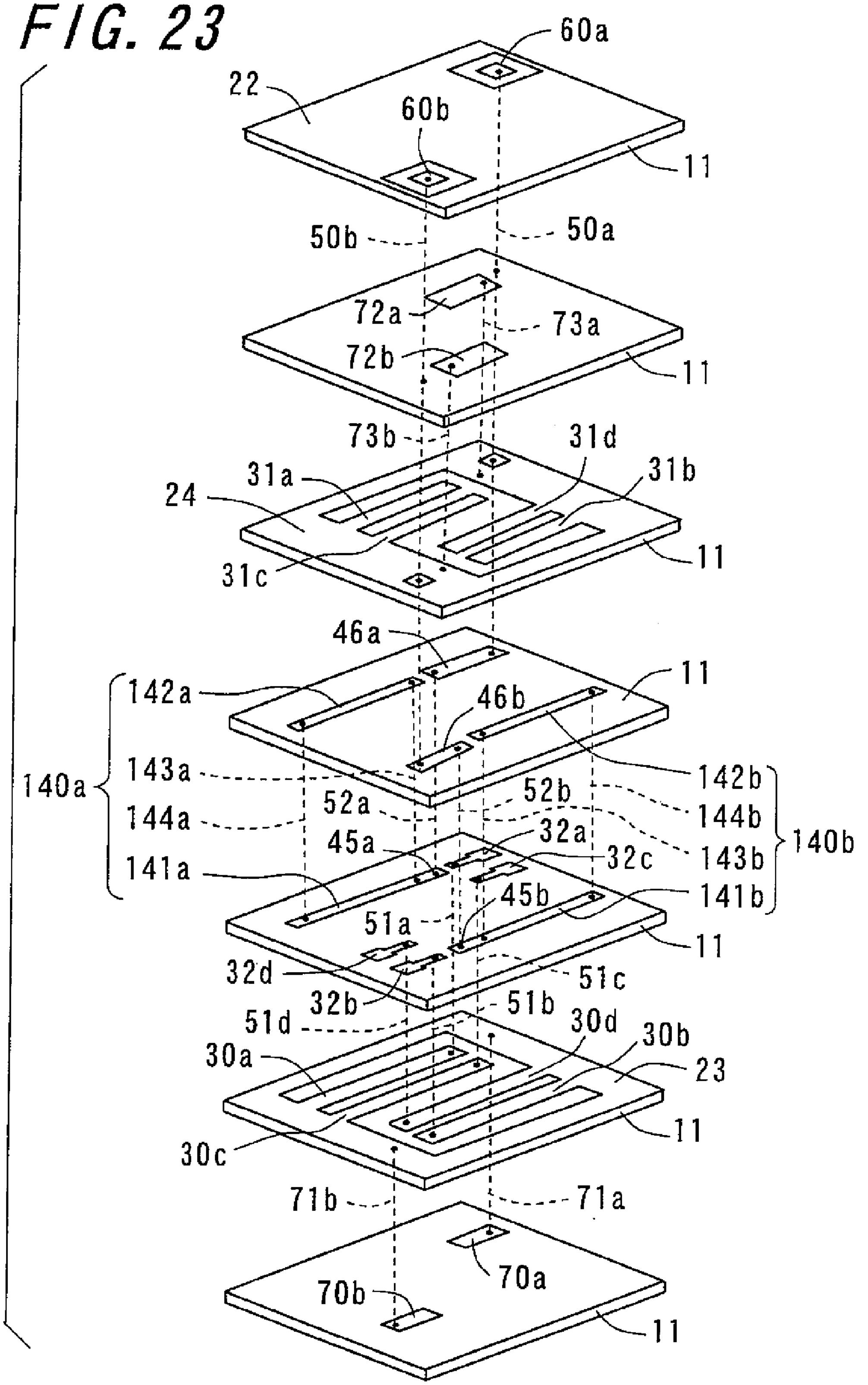
FIG. 23 is an exploded perspective view schematically showing a bandpass filter in accordance with an eighth embodiment of the invention.

FIG. 23 is an exploded perspective view schematically showing a bandpass filter in accordance with an eighth embodiment of the invention. Note that the following description deals with in what way this embodiment differs from the above-mentioned seventh embodiment, and the constituent components thereof that play the same or corresponding roles as in the preceding embodiments will be denoted by the same reference numerals and overlapping descriptions will be omitted.

In the bandpass filter of this embodiment, as shown in FIG. 23, on the first interlayer, the first resonant electrodes 30*a* and 30*c* are so arranged that their one ends are positioned on the same side. The first resonant electrodes 30*c* and 30*d* are so arranged that their one ends are displaced in relation to each other in a staggered manner. The first resonant electrodes 30*d* and 30*b* are so arranged that their one ends are positioned on the same side. Moreover, on the second interlayer, the first resonant electrodes 31*a* and 31*c* are so arranged that their one ends are positioned on the same side. The first resonant electrodes 31*c* and 31*d* are so arranged that their one ends are displaced in relation to each other in a staggered manner. The first resonant electrodes 31*d* and 31*b* are so arranged that their one ends are positioned on the same side. Further, just like the auxiliary resonant electrodes 32*a* and 32*b*, the auxiliary resonant electrodes 32*c* and 32*d* are arranged on the third interlayer.

In the bandpass filter of the present embodiment, the first resonant electrodes 30*a* and 30*c* are coupled to each other in a comb-line form. The first resonant electrodes 30*c* and 30*d* are coupled to each other in an interdigital form. The first resonant electrodes 30*d* and 30*b* are coupled to each other in a comb-line form. Moreover, the second resonant electrodes 31*a* and 31*c* are coupled to each other in a comb-line form. The second resonant electrodes 31*c* and 31*d* are coupled to each other in an interdigital form. The second resonant electrodes 31*d* and 31*b* are coupled to each other in a comb-line form.

Moreover, in the bandpass filter of the present embodiment, on the interlayer A of the multilayer body 10 located below the first interlayer, there is disposed the first coupling electrode 70*a* connected via the through conductor 71*a* to the annular ground electrode 23 so as to face the other ends of, respectively, the first resonant electrodes 30*a* and 30*c*. Also disposed on the interlayer A is the second coupling electrode 70*b* connected via the through conductor 71*b* to the annular ground electrode 23 so as to face the other ends of, respectively, the first resonant electrodes 30*d* and 30*b*.

Further, in the bandpass filter of the present embodiment, on the interlayer B of the multilayer body 10 located above the second interlayer, there is disposed the third coupling electrode 72*a* connected via the through conductor 73*a* to the annular ground electrode 24 so as to face the other ends of, respectively, the second resonant electrodes 31*a* and 31*c*. Also disposed on the interlayer B is the fourth coupling electrode 72*b* connected via the through conductor 73*b* to the annular ground electrode 24 so as to face the other ends of, respectively, the second resonant electrodes 31*d* and 31*b*.

According to the bandpass filter of the present embodiment, the first coupling electrode 70*a* helps increase the electrostatic capacitance between each of the first resonant electrodes 30*a* and 30*c* and the ground potential. Likewise, the second coupling electrode 70*b* helps increase the electrostatic capacitance between each of the first resonant electrodes 30*d* and 30*b* and the ground potential, the third coupling electrode 72*a* helps increase the electrostatic capacitance between each of the second resonant electrodes 31*a* and 31*c* and the ground potential, and the fourth coupling electrode 72*b* helps increase the electrostatic capacitance between each of the second resonant electrodes 31*d* and 31*b* and the ground potential. This makes it possible to reduce the lengths of, respectively, the first resonant electrodes 30*a*, 30*b*, 30*c*, and 30*d* and the lengths of, respectively, the first resonant electrodes 31*a*, 31*b*, 31*c*, and 31*d*, and thereby obtain a more compact bandpass filter.

Moreover, according to the bandpass filter of the present embodiment, the first coupling electrode 70*a* helps strengthen the electromagnetic coupling between the adjacent first resonant electrodes 30*a* and 30*c*. Likewise, the second coupling electrode 70*b* helps strengthen the electromagnetic coupling between the adjacent first resonant electrodes 30*d* and 30*b*, the third coupling electrode 72*a* helps strengthen the electromagnetic coupling between the adjacent second resonant electrodes 31*a* and 31*c*, and the fourth coupling electrode 72*b* helps strengthen the electromagnetic coupling between the adjacent second resonant electrodes 31*d* and 31*b*. Hence, just as in the case where all the first resonant electrodes 30*a*, 30*b*, 30*c*, and 30*d* make electromagnetic-field coupling with each other in an interdigital form and all the first resonant electrodes 31*a*, 31*b*, 31*c*, and 31*d* make electromagnetic-field coupling with each other in an interdigital form, it is possible to obtain a bandpass filter having a wide pass band.

(Ninth Embodiment)

Figure 24:
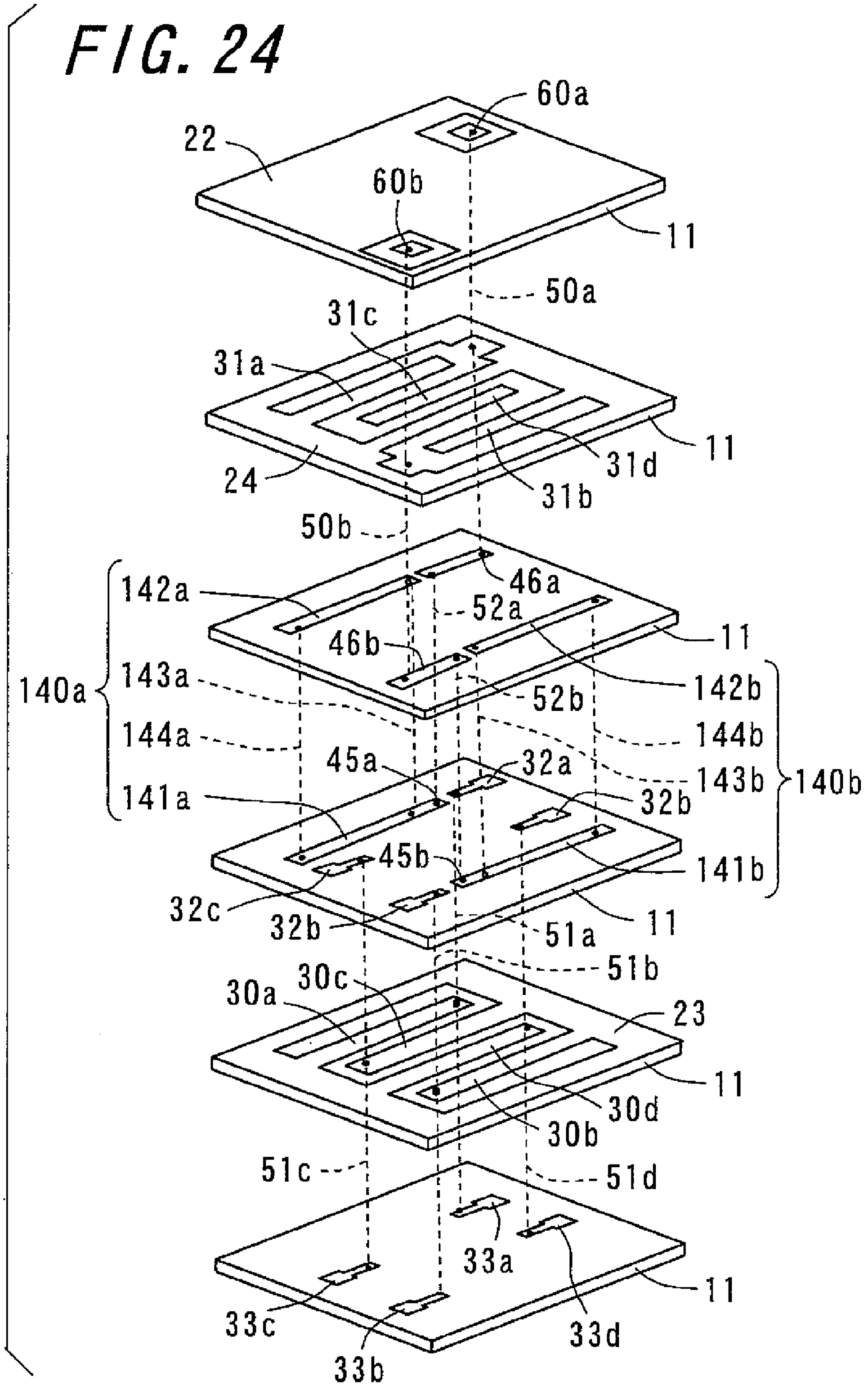
FIG. 24 is an exploded perspective view schematically showing a bandpass filter in accordance with a ninth embodiment of the invention.
Figure 25:
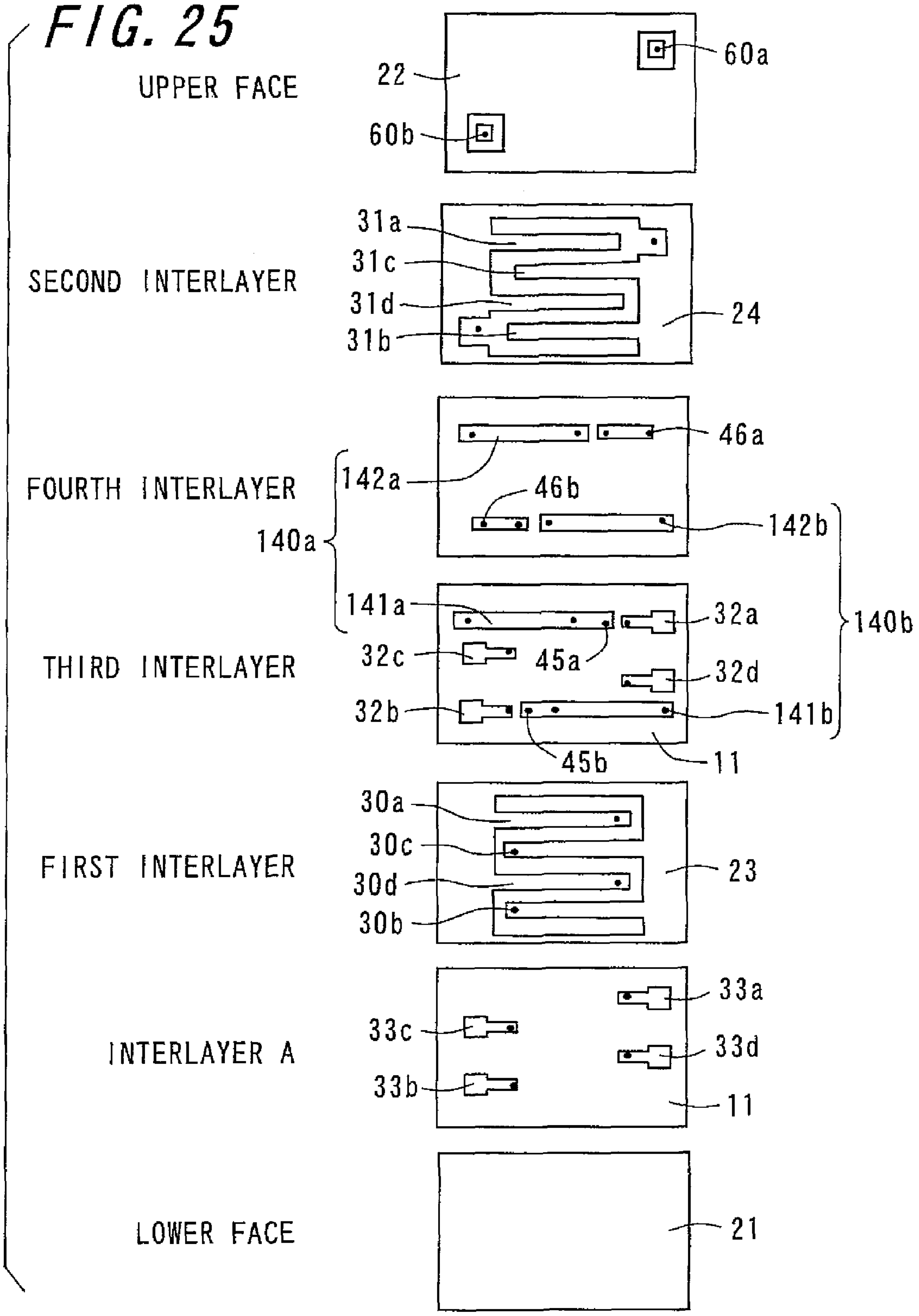
FIG. 25 is a plan view schematically showing upper and lower faces and interlayers of the bandpass filter shown in FIG. 24.

FIG. 24 is an exploded perspective view schematically showing a bandpass filter in accordance with a ninth embodiment of the invention. FIG. 25 is a plan view schematically showing upper and lower faces and interlayers of the bandpass filter shown in FIG. 24. Note that the following description deals with in what way this embodiment differs from the above-mentioned seventh embodiment, and the constituent components thereof that play the same or corresponding roles as in the preceding embodiments will be denoted by the same reference numerals and overlapping descriptions will be omitted.

According to the bandpass filter of this embodiment, all of the auxiliary resonant electrodes 32*a*, 32*b*, 32*c*, and 32*d* are arranged on the third interlayer of the multilayer body 10. Moreover, second auxiliary resonant electrodes 33*a*, 33*b*, 33*c*, and 33*d* are arranged on the interlayer A of the multilayer body 10. The interlayer A and the third interlayer are arranged on opposite sides of the first interlayer. The second auxiliary resonant electrodes 33*a*, 33*b*, 33*c*, and 33*d* are each so placed as to have a region facing the first annular ground electrode 23 and are connected to the other ends of the plurality of first resonant electrodes 30*a*, 30*b*, 30*c*, and 30*d*, respectively, via the through conductors 51*a*, 51*b*, 51*c*, and 51*d*, respectively.

According to the bandpass filter of the present embodiment thereby constructed, in the region where each of the second auxiliary resonant electrodes 33*a*, 33*b*, 33*c*, and 33*d* and the first annular ground electrode 23 face each other, electrostatic capacitance arises therebetween. Since the resultant electrostatic capacitance is added to the electrostatic capacitance between the ground potential and each of the first resonant electrodes 30*a*, 30*b*, 30*c*, and 30*d* connected with the second auxiliary resonant electrodes 33*a*, 33*b*, 33*c*, and 33*d*, respectively, it is possible to reduce the lengths of, respectively, the first resonant electrodes 30*a*, 30*b*, 30*c*, and 30*d*, and thereby obtain an even more compact bandpass filter.

(Tenth Embodiment)

Figure 26:
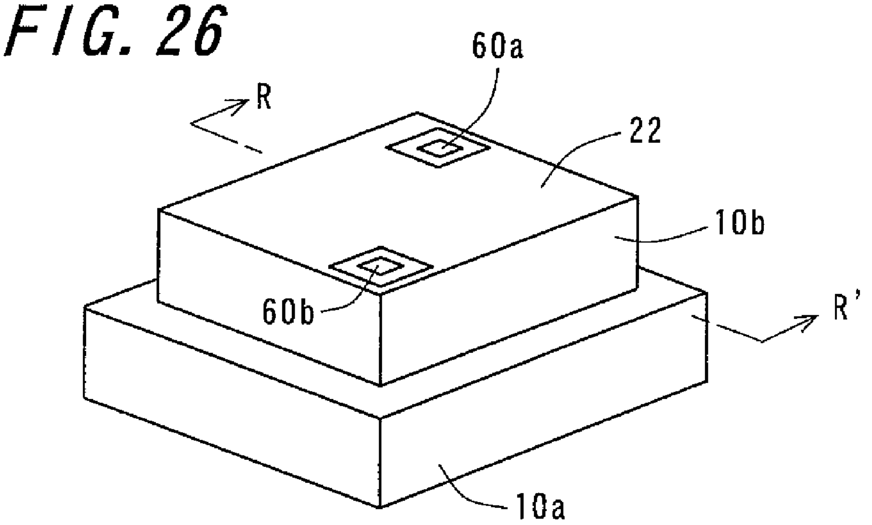
FIG. 26 is an external perspective view schematically showing a bandpass filter in accordance with a tenth embodiment of the invention.
Figure 27:
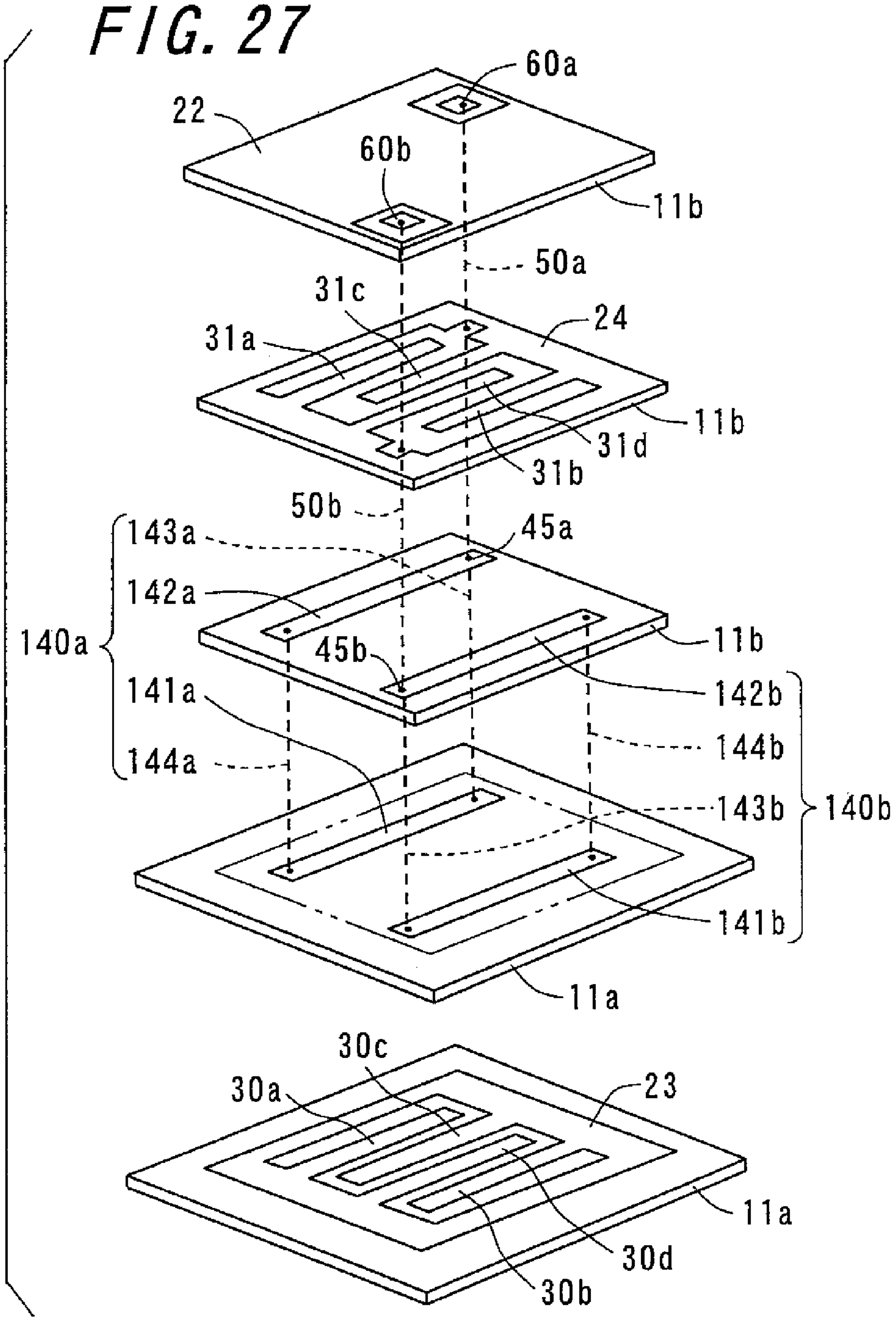
FIG. 27 is a schematic exploded perspective view of the bandpass filter shown in FIG. 26.
Figure 28:
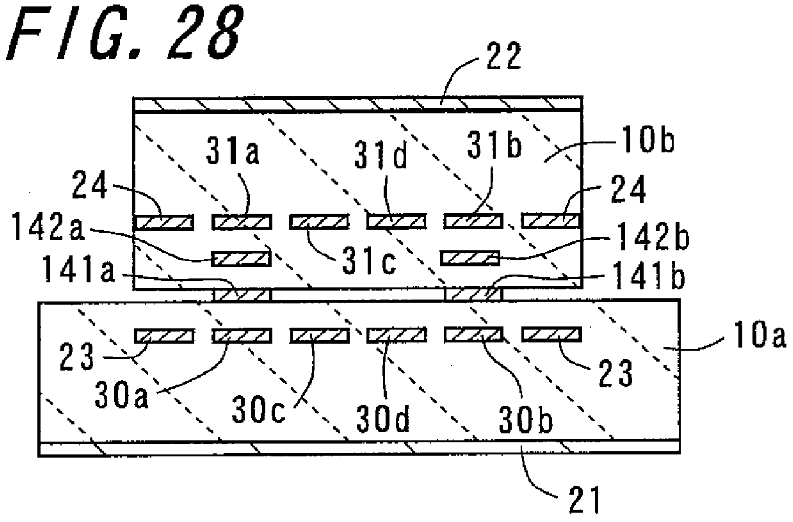
FIG. 28 is a sectional view of the bandpass filter taken along the line R-R' of FIG. 26.

FIG. 26 is an external perspective view schematically showing a bandpass filter in accordance with a tenth embodiment of the invention. FIG. 27 is a schematic exploded perspective view of the bandpass filter shown in FIG. 26. FIG. 28 is a sectional view of the bandpass filter taken along the line R-R' of FIG. 26. Note that the following description deals with in what way this embodiment differs from the above-mentioned sixth embodiment, and the constituent components thereof that play the same or corresponding roles as in the preceding embodiments will be denoted by the same reference numerals and overlapping descriptions will be omitted.

In the bandpass filter of this embodiment, as shown in FIGS. 26 to 28, the multilayer body comprises the first multilayer body 10*a* and the second multilayer body 10*b* placed thereon. The first ground electrode 21 is disposed on the lower face of the first multilayer body 10*a*. The second ground electrode 22 is disposed on the upper face of the second multilayer body 10*b*. The first interlayer bearing the first resonant electrodes 30*a*, 30*b*, 30*c*, and 30*d* and the first annular ground electrode 23 is located within the first multilayer body 10*a*. The second interlayer bearing the second resonant electrodes 31*a*, 31*b*, 31*c*, and 31*d* and the second annular ground electrode 24, as well as the fourth interlayer bearing the second input coupling electrode 142*a* and the second output coupling electrode 142*b*, is located within the second multilayer body 10*b*. The third interlayer bearing the first input coupling electrode 141*a* and the first output coupling electrode 141*b* is located between the first multilayer body 10*a* and the second multilayer body 10*b*. Note that the first multilayer body 10*a* has a stack of a plurality of dielectric layers 11*a* on top of each other, and the second multilayer body 10*b* has a stack of a plurality of dielectric layers 11*b* on top of each other.

According to the bandpass filter of the present embodiment thereby constructed, the region bearing the first resonant electrodes 30*a*, 30*b*, 30*c*, and 30*d* and the region bearing the second resonant electrodes 31*a*, 31*b*, 31*c*, and 31*d* that differ in resonance frequency from each other, are separated into the first and second multilayer bodies 10*a* and 10*b*, by the third interlayer serving as a boundary. In this construction, by designing the dielectric layer constituting the first multilayer body 10*a* and the dielectric layer constituting the second multilayer body 10*b* to have different electrical characteristics, it is possible to obtain desired electrical characteristics with ease. For example, the dielectric constant of the dielectric layer 11*a* constituting the first multilayer body 10*a*, in which are arranged the first resonant electrodes 30*a*, 30*b*, 30*c*, and 30*d* that are made longer than the second resonant electrodes 31*a*, 31*b*, 31*c*, and 31*d* because of having lower resonance frequencies, is set to be higher than the dielectric constant of the dielectric layer 11*b* constituting the second multilayer body 10*b*. This makes it possible to reduce the lengths of, respectively, the first resonant electrodes 30*a*, 30*b*, 30*c*, and 30*d*, and thereby eliminate wasted space inside the bandpass filter with consequent miniaturization of the bandpass filter. Moreover, in the bandpass filter of the present embodiment, there is no need to establish electromagnetic-field coupling between the upper and lower electrode components separated by the third and fourth interlayers interposed therebetween. Since the third interlayer serves as a boundary to separate the first multilayer body 10*a* and the second multilayer body 10*b*, for example, even if the first multilayer body 10*a* and the second multilayer body 10*b* are positionally displaced with respect to each other, or an air layer exists at the boundary between the first multilayer body 10*a* and the second multilayer body 10*b*, it is possible to keep the risk of consequent deterioration in electrical characteristics to the minimum. Moreover, for example, in a case where the first multilayer body 10*a* is designed as a module substrate for mounting another electronic component or the like on the surface of the region thereof other than the region constituting the bandpass filter, by disposing part of the bandpass filter within the second multilayer body 10*b*, the thickness of the module substrate can be reduced. Accordingly, it is possible to obtain a bandpass filter-equipped substrate in which the module can be made smaller in thickness as a whole.

(Eleventh Embodiment)

Figure 29:
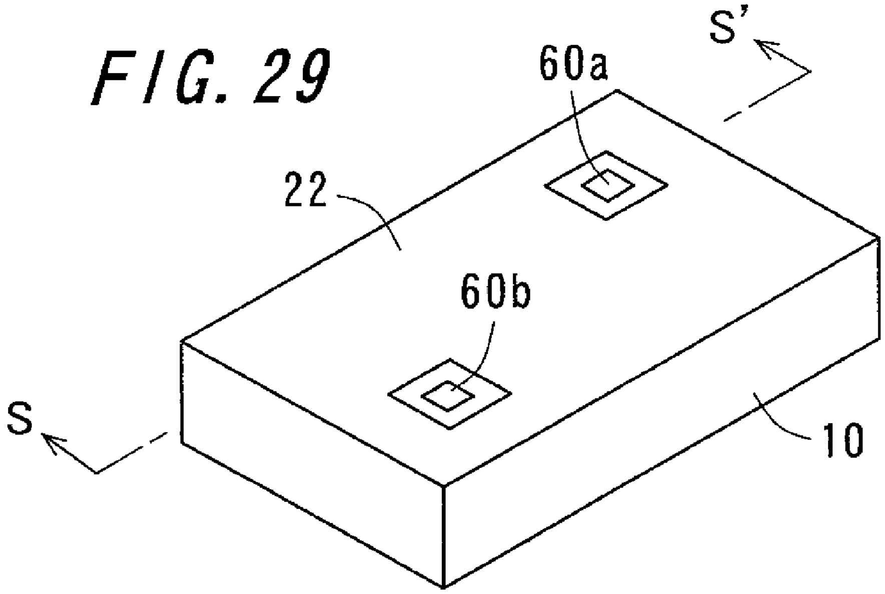
FIG. 29 is an external perspective view schematically showing a bandpass filter in accordance with an eleventh embodiment of the invention.
Figure 30:
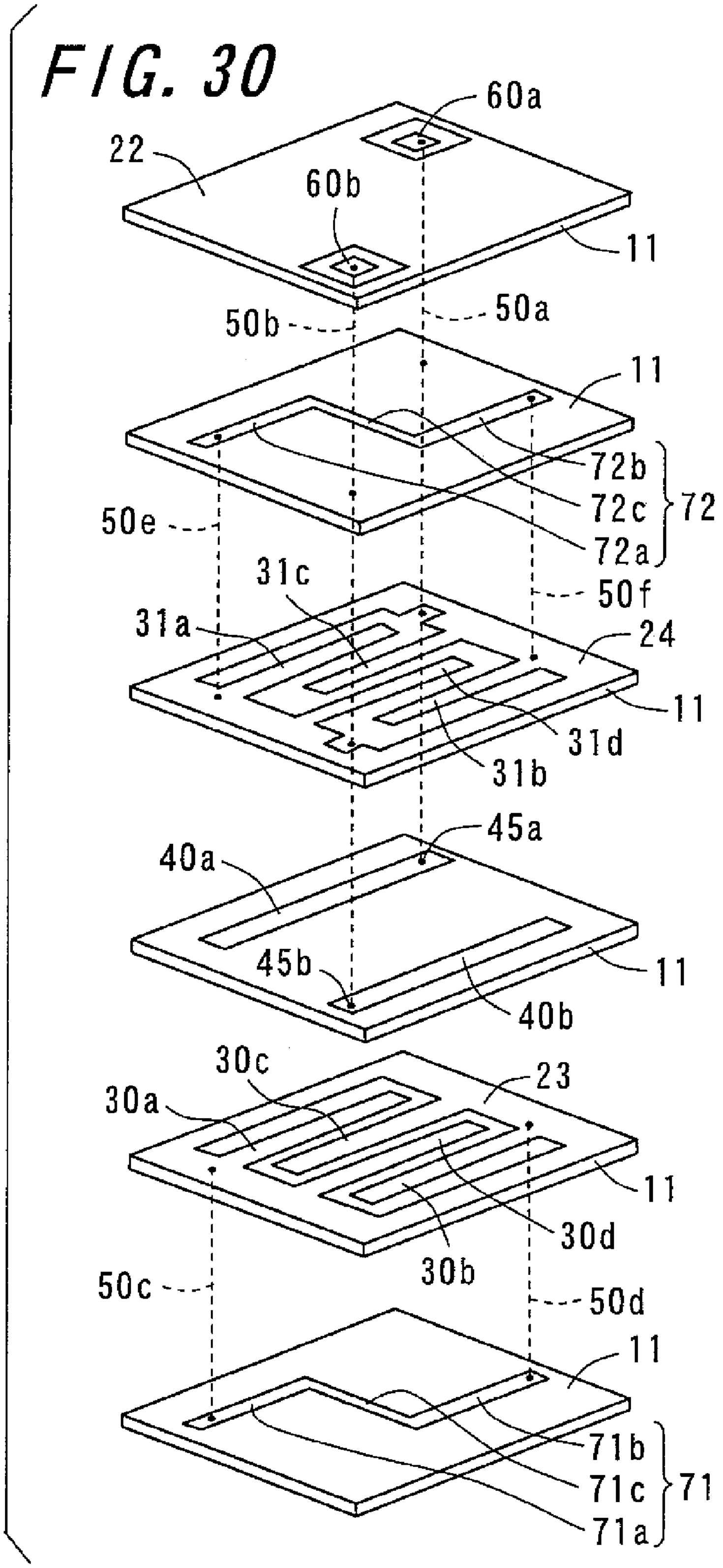
FIG. 30 is a schematic exploded perspective view of the bandpass filter shown in FIG. 29.
Figure 31:
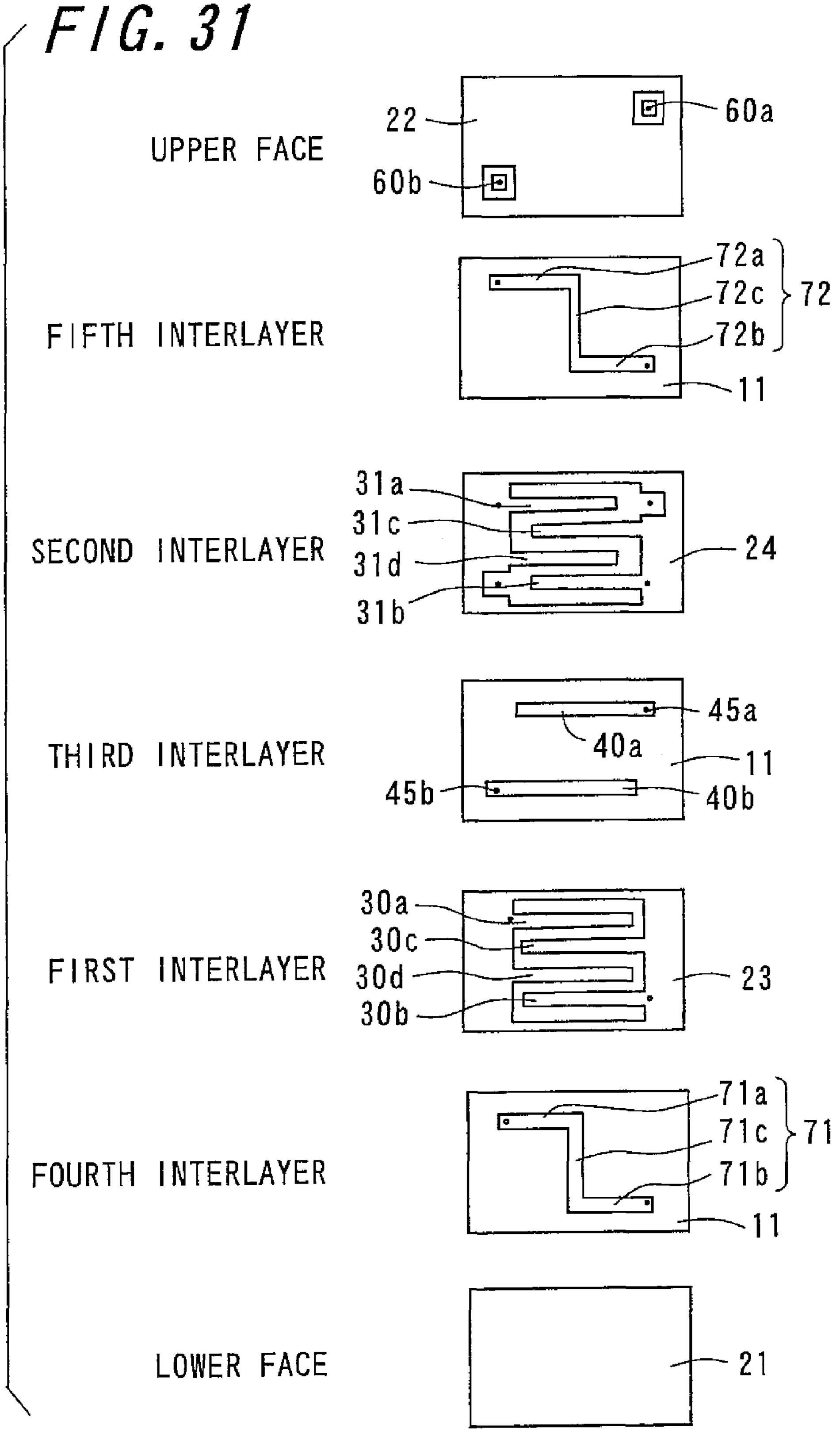
FIG. 31 is a plan view schematically showing upper and lower faces and interlayers of the bandpass filter shown in FIG. 29.
Figure 32:
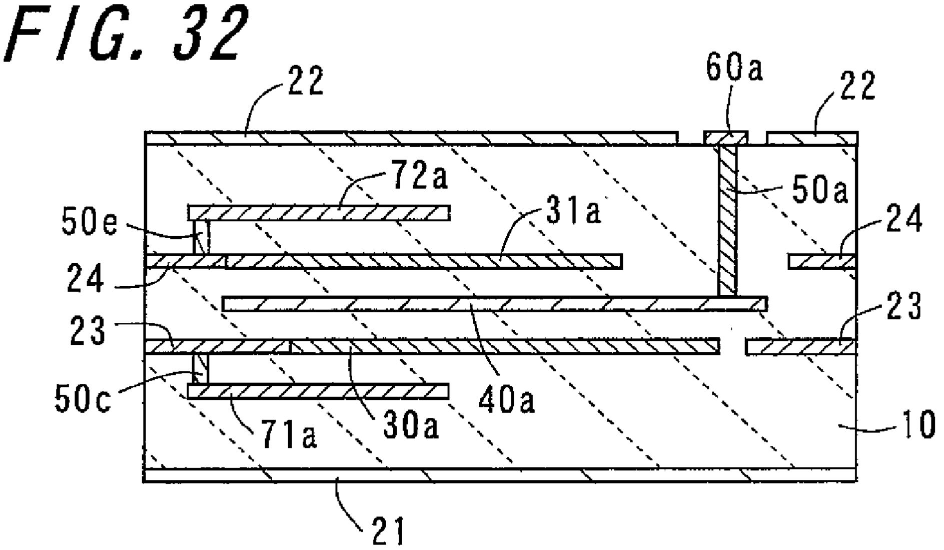
FIG. 32 is a sectional view of the bandpass filter taken along the line S-S' of FIG. 29.

FIG. 29 is an external perspective view schematically showing a bandpass filter in accordance with an eleventh embodiment of the invention. FIG. 30 is a schematic exploded perspective view of the bandpass filter shown in FIG. 29. FIG. 31 is a plan view schematically showing upper and lower faces and interlayers of the bandpass filter shown in FIG. 29. FIG. 32 is a sectional view of the bandpass filter taken along the line S-S' of FIG. 29.

As shown in FIGS. 29 through 32, the bandpass filter of this embodiment includes the multilayer body 10, the first ground electrode 21, the second ground electrode 22, the plurality of strip-like first resonant electrodes 30*a*, 30*b*, 30*c*, and 30*d*, and the plurality of strip-like second resonant electrodes 31*a*, 31*b*, 31*c*, and 31*d*. The multilayer body 10 has a stack of a plurality of the dielectric layers 11 on top of each other. The first ground electrode 21 is disposed on the lower face of the multilayer body 10. The second ground electrode 22 is disposed on the upper face of the multilayer body 10. The first resonant electrodes 30*a*, 30*b*, 30*c*, and 30*d* are arranged side by side on the first interlayer of the multilayer body 10, with their one ends as well as the other ends displaced in relation to each other in a staggered manner. The first resonant electrodes have their one ends connected to ground so as to serve as a quarter-wavelength resonator and make electromagnetic-field coupling with each other. The second resonant electrodes 31*a*, 31*b*, 31*c*, and 31*d* are arranged side by side on the second interlayer of the multilayer body different from the first interlayer, with their one ends as well as the other ends displaced in relation to each other in a staggered manner. The second resonant electrodes have their one ends connected to ground so as to serve as a quarter-wavelength resonator which resonates at a frequency higher than a frequency at which the first resonant electrode resonates, and make electromagnetic-field coupling with each other.

Moreover, the bandpass filter of the present embodiment includes the strip-like input coupling electrode 40*a* and the strip-like output coupling electrode 40*b*. The input coupling electrode 40*a* is disposed on the third interlayer of the multilayer body 10 located between the first interlayer and the second interlayer. The input coupling electrode 40*a* faces the input-stage first resonant electrode 30*a* of the first resonant electrodes 30*a*, 30*b*, 30*c*, and 30*d*, over more than half of the entire longitudinal area thereof for electromagnetic-field coupling, faces the input-stage second resonant electrode 31*a* of the second resonant electrodes 31*a*, 31*b*, 31*c*, and 31*d*, over more than half of the entire longitudinal area thereof for electromagnetic-field coupling, and has the electric signal input point 45*a* for receiving input of an electric signal from the external circuit. The output coupling electrode 40*b* is disposed on the third interlayer of the multilayer body 10. The output coupling electrode 40*b* faces the output-stage first resonant electrode 30*b* of the first resonant electrodes 30*a*, 30*b*, 30*c*, and 30*d*, over more than half of the entire longitudinal area thereof for electromagnetic-field coupling, faces the output-stage second resonant electrode 31*b* of the second resonant electrodes 31*a*, 31*b*, 31*c*, and 31*d*, over more than half of the entire longitudinal area thereof for electromagnetic-field coupling, and has the electric signal output point 45*b* for producing output of an electric signal toward the external circuit.

Moreover, the bandpass filter of the present embodiment includes a first resonant electrode coupling conductor 71 and a second resonant electrode coupling conductor 72. The first resonant electrode coupling conductor 71 is disposed on the fourth interlayer of the multilayer body 10 which is arranged on an opposite side of the third interlayer with the first interlayer interposed therebetween. The first resonant electrode coupling conductor 71 has its one end connected to ground close to one end of a frontmost-stage first resonant electrode 30*a* constituting a first resonant electrode group composed of the four adjoining first resonant electrodes 30*a*, 30*b*, 30*c*, and 30*d*, and has its other end connected to ground close to one end of a rearmost-stage first resonant electrode 30*b* constituting the first resonant electrode group, and also includes a region facing one end side of the frontmost-stage first resonant electrode 30*a* for electromagnetic-field coupling and a region facing one end side of the rearmost-stage first resonant electrode 30*b* for electromagnetic-field coupling. The second resonant electrode coupling conductor 72 is disposed on the fifth interlayer of the multilayer body 10 which is arranged on an opposite side of the third interlayer with the second interlayer interposed therebetween. The second resonant electrode coupling conductor 72 has its one end connected to ground close to one end of a frontmost-stage second resonant electrode 31*a* constituting a second resonant electrode group composed of the four adjoining second resonant electrodes 31*a*, 31*b*, 31*c*, and 31*d*, and has its other end connected to ground close to one end of a rearmost-stage second resonant electrode 31*b* constituting the second resonant electrode group, and also includes a region facing one end side of the frontmost-stage second resonant electrode 31*a* for electromagnetic-field coupling and a region facing one end side of the rearmost-stage second resonant electrode 31*b* for electromagnetic-field coupling.

Further, the bandpass filter of the present embodiment includes the first annular ground electrode 23 and the second annular ground electrode 24. The first annular ground electrode 23 is formed in an annular shape on the first interlayer of the multilayer body 10 so as to surround the first resonant electrodes 30*a*, 30*b*, 30*c*, and 30*d*, and is connected with the one ends of, respectively, the first resonant electrodes 30*a*, 30*b*, 30*c*, and 30*d*. The second annular ground electrode 24 is formed in an annular shape on the second interlayer so as to surround the second resonant electrodes 31*a*, 31*b*, 31*c*, and 31*d*, and is connected with the one ends of, respectively, the second resonant electrodes 31*a*, 31*b*, 31*c*, and 31*d*.

In the bandpass filter of the present embodiment, the first resonant electrode coupling conductor 71 is composed of a strip-like first front-stage side coupling region 71*a* facing the frontmost-stage first resonant electrode 30*a* in parallel, a strip-like first rear-stage side coupling region 71*b* facing in parallel to the rearmost-stage first resonant electrode 30*b* in parallel, and a first connection region 71*c* formed so as to be perpendicular to each of the first front-stage side coupling region 71*a* and the first rear-stage side coupling region 71*b*, for providing connection between the two coupling regions. The second resonant electrode coupling conductor 72 is composed of a strip-like second front-stage side coupling region 72*a* facing the frontmost-stage second resonant electrode 31*a* in parallel, a strip-like second rear-stage side coupling region 72*b* facing the rearmost-stage second resonant electrode 31*b* in parallel, and a second connection region 72*c* formed so as to be perpendicular to each of the second front-stage side coupling region 72*a* and the second rear-stage side coupling region 72*b*, for providing connection between the two coupling regions. Note that the opposite ends of the first resonant electrode coupling conductor 71 are connected to the first annular ground electrode 23 via through conductors 50*c* and 50*d*, respectively. Also, the opposite ends of the second resonant electrode coupling conductor 72 are connected to the second annular ground electrode 24 via through conductors 50*e* and 50*f*, respectively.

Moreover, in the bandpass filter of the present embodiment, the one end of the input-stage first resonant electrode 30*a* and the one end of the input-stage second resonant electrode 31*a* are located on the same side. Also, the one end of the output-stage first resonant electrode 30*b* and the one end of the output-stage second resonant electrode 31*b* are located on the same side. In the input coupling electrode 40*a* as seen in its longitudinal direction, the electric signal input point 45*a* is disposed at the part that lies nearer the other end of the input-stage first resonant electrode 30*a* than the center of the part facing the input-stage first resonant electrode 30*a* and also lies nearer the other end of the input-stage second resonant electrode 31*a* than the center of the part facing the input-stage second resonant electrode 31*a*. Also, in the output coupling electrode 40*b* as seen in its longitudinal direction, the electric signal output point 45*b* is disposed at the part that lies nearer the other end of the output-stage first resonant electrode 30*b* than the center of the part facing the output-stage. first resonant electrode 30*b* and also lies nearer the other end of the output-stage second resonant electrode 31*b* than the center of the part facing the output-stage second resonant electrode 31*b*.

Moreover, in the bandpass filter of the present embodiment, the input coupling electrode 40*a* is connected via a through conductor 50*a* to the input terminal electrode 60*a* disposed on the upper face of the multilayer body 10, and the output coupling electrode 40*b* is connected via a through conductor 50*b* to the output terminal electrode 60*b* disposed on the upper face of the multilayer body 10. Thus, a point of connection between the input coupling electrode 40*a* and the through conductor 50*a* corresponds to the electric signal input point 45*a* of the input coupling electrode 40*a*, and a point of connection between the output coupling electrode 40*b* and the through conductor 50*b* corresponds to the electric signal output point 45*b* of the output coupling electrode 40*b*.

In the bandpass filter of the present embodiment thereby constructed, an electric signal from the external circuit is inputted via the input terminal electrode 60*a* and the through conductor 50*a* to the electric signal input point 45*a* of the input coupling electrode 40*a*. Upon the input, the input-stage first resonant electrode 30*a* which makes electromagnetic-field coupling with the input coupling electrode 40*a* is excited, thus causing resonance in the plurality of first resonant electrodes 30*a*, 30*b*, 30*c*, and 30*d* that make electromagnetic-field coupling with each other. Then, the electric signal is outputted from the electric signal output point 45*b* of the output coupling electrode 40*b* which makes electromagnetic-field coupling with the output-stage first resonant electrode 30*b* to the external circuit via the through conductor 50*b* and the output terminal electrode 60*b*. At this time, signals in the first frequency band including frequencies at which the plurality of first resonant electrodes 30*a*, 30*b*, 30*c*, and 30*d* resonate are selectively passed, thereby forming the first pass band.

Moreover, in the bandpass filter of the present embodiment, when an electric signal from the external circuit is inputted via the input terminal electrode 60*a* and the through conductor 50*a* to the electric signal input point 45*a* of the input coupling electrode 40*a*, then the input-stage second resonant electrode 31*a* which makes electromagnetic-field coupling with the input coupling electrode 40*a* is excited, thus causing resonance in the plurality of second resonant electrodes 31*a*, 31*b*, 31*c*, and 31*d* that make electromagnetic-field coupling with each other. Then, the electric signal is outputted from the electric signal output point 45*b* of the output coupling electrode 40*b* which makes electromagnetic-field coupling with the output-stage second resonant electrode 31*b* to the external circuit via the through conductor 50*b* and the output terminal electrode 60*b*. At this time, signals in the second frequency band including frequencies at which the plurality of second resonant electrodes 31*a*, 31*b*, 31*c*, and 31*d* resonate are selectively passed, thereby forming the second pass band.

In this way, the bandpass filter of the present embodiment serves as a bandpass filter having two pass bands that differ in frequency from each other.

In the bandpass filter of the present embodiment, the first ground electrode 21 is so disposed as to extend all over the lower face of the multilayer body 10, and the second ground electrode 22 is so disposed as to extend substantially all over the upper face of the multilayer body 10, except for the region around the input terminal electrode 60*a* and the region around the output terminal electrode 60*b*. The first and second ground electrodes 21 and 22 are each connected to ground and constitute, in conjunction with the first resonant electrodes 30*a*, 30*b*, 30*c*, and 30*d* and the second resonant electrodes 31*a*, 31*b*, 31*c*, and 31*d*, a strip line resonator.

Moreover, in the bandpass filter of the present embodiment, the strip-like first resonant electrodes 30*a*, 30*b*, 30*c*, and 30*d* have their one ends connected to the first annular ground electrode 23 to be connected to ground so as to serve as a quarter-wavelength resonator. The electrical length of each individual first resonant electrode is adjusted to approximately ¼ of the wavelength of the center frequency in the pass band formed by the first resonant electrodes 30*a*, 30*b*, 30*c*, and 30*d*. Likewise, the strip-like second resonant electrodes 31*a*, 31*b*, 31*c*, and 31*d* have their one ends connected to the second annular ground electrode 24 to be connected to ground so as to serve as a quarter-wavelength resonator. The electrical length of each individual second resonant electrode is adjusted to approximately ¼ of the wavelength of the center frequency in the pass band formed by the second resonant electrodes 31*a*, 31*b*, 31*c*, and 31*d*.

Moreover, the first resonant electrodes 30*a*, 30*b*, 30*c*, and 30*d* are arranged side by side for mutual edge coupling on the first interlayer of the multilayer body 10, and also the second resonant electrodes 31*a*, 31*b*, 31*c*, and 31*d* are arranged side by side for mutual edge coupling on the second interlayer of the multilayer body 10. Although the spacing between the adjacent ones of the juxtaposed first resonant electrodes 30*a*, 30*b*, 30*c*, and 30*d*, and the spacing between the adjacent ones of the juxtaposed second resonant electrodes 31*a*, 31*b*, 31*c*, and 31*d* should preferably be made as small as possible from the standpoint of achieving strong mutual coupling, a reduction in the spacing gives rise to difficulty in manufacturing operation. Accordingly, the spacing is set to fall in a range of from approximately 0.05 to 0.5 mm.

Further, since the juxtaposed first resonant electrodes 30*a*, 30*b*, 30*c*, and 30*d* are so arranged that one ends as well as the other ends thereof are displaced in relation to each other in a staggered manner, it follows that the resonant electrodes are coupled to each other in an interdigital form. In the case of interdigital form coupling, as compared with the case of comb-line form coupling, a higher coupling strength can be obtained by virtue of the combination of the effects of magnetic field coupling and electric field coupling. This makes it possible to render, in the pass band formed by the first resonant electrodes 30*a*, 30*b*, 30*c*, and 30*d*, the frequency spacing between the resonance frequencies in the respective resonant modes suitable for the obtainment of an extremely wide pass band width of approximately 40% to 50% in terms of fractional bandwidth, which is far in excess of the levels that are realizable by conventional quarter-wavelength resonator-using filters.

Likewise, since the juxtaposed second resonant electrodes 31*a*, 31*b*, 31*c*, and 31*d* are so arranged that one ends as well as the other ends thereof are displaced in relation to each other in a staggered manner, it follows that the resonant electrodes are coupled to each other in an interdigital form. This makes it possible to render, in the pass band formed by the second resonant electrodes 31*a*, 31*b*, 31*c*, and 31*d*, the frequency spacing between the resonance frequencies in the respective resonant modes suitable for the obtainment of an extremely wide pass band width of approximately 40% to 50% in terms of fractional bandwidth, which is far in excess of the levels that are realizable by conventional quarter-wavelength resonator-using filters.

Incidentally, it has been found by studies that, when resonant electrodes constituting a single pass band are broadside-coupled to each other and are also brought into an interdigitally-coupled state, then the coupling therebetween becomes unduly strong, and such a coupling technique is after all undesirable for the obtainment of a pass band width of approximately 40% to 50% in terms of fractional bandwidth.

Moreover, in the bandpass filter of the present embodiment, the input coupling electrode 40*a* is disposed on the third interlayer of the multilayer body 10 located between the first interlayer and the second interlayer. The input coupling electrode 40*a* faces the input-stage first resonant electrode 30*a* of the first resonant electrodes 30*a*, 30*b*, 30*c*, and 30*d*, over more than half of the entire longitudinal area thereof for electromagnetic-field coupling, faces the input-stage second resonant electrode 31*a* of the second resonant electrodes 31*a*, 31*b*, 31*c*, and 31*d*, over more than half of the entire longitudinal area thereof for electromagnetic-field coupling, and has the electric signal input point 45*a* for receiving input of an electric signal from the external circuit. In the input coupling electrode 40*a* as seen in its longitudinal direction, the electric signal input point 45*a* is disposed at the part that lies nearer the other end of the input-stage first resonant electrode 30*a* than the center of the part facing the input-stage first resonant electrode 30*a* and also lies nearer the other end of the input-stage second resonant electrode 31*a* than the center of the part facing the input-stage second resonant electrode 31*a*. In this construction, the input coupling electrode 40*a* is broadside-coupled and interdigitally-coupled to the input-stage first resonant electrode 30*a* and the input-stage second resonant electrode 31*a*. Therefore, strong electromagnetic-field coupling can be established by the broadside coupling, and the interdigital form coupling makes the electromagnetic-field coupling even stronger with the combination of the effects of electric field coupling and magnetic field coupling. This makes it possible to achieve extremely strong coupling between the input coupling electrode 40*a* and the input-stage first resonant electrode 30*a*, as well as the input-stage second resonant electrode 31*a*.

Further, in the bandpass filter of the present embodiment, the output coupling electrode 40*b* is disposed on the third interlayer of the multilayer body 10. The output coupling electrode 40*b* faces the output-stage first resonant electrode 30*b* of the first resonant electrodes 30*a*, 30*b*, 30*c*, and 30*d*, over more than half of the entire longitudinal area thereof for electromagnetic-field coupling, faces the output-stage second resonant electrode 31*b* of the second resonant electrodes 31*a*, 31*b*, 31*c*, and 31*d*, over more than half of the entire longitudinal area thereof for electromagnetic-field coupling, and has the electric signal output point 45*b* for producing output of an electric signal toward the external circuit. In the output coupling electrode 40*b* as seen in its longitudinal direction, the electric signal output point 45*b* is disposed at the part that lies nearer the other end of the output-stage first resonant electrode 30*b* than the center of the part facing the output-stage first resonant electrode 30*b* and also lies nearer the other end of the output-stage second resonant electrode 31*b* than the center of the part facing the output-stage second resonant electrode 31*b*. In this construction, the output coupling electrode 40*b* is broadside-coupled and interdigitally-coupled to the output-stage first resonant electrode 30*b* and the output-stage second resonant electrode 31*b*. Therefore, strong electromagnetic-field coupling can be established by the broadside coupling, and the interdigital form coupling makes the electromagnetic-field coupling even stronger with the combination of the effects of electric field coupling and magnetic field coupling. This makes it possible to achieve extremely strong coupling between the output coupling electrode 40*b* and the output-stage first resonant electrode 30*b*, as well as the output-stage second resonant electrode 31*b*.

In this way, according to the bandpass filter of the present embodiment, the input coupling electrode 40*a* makes extremely strong electromagnetic-field coupling with the input-stage first resonant electrode 30*a* and the input-stage second resonant electrode 31*a*, and also the output coupling electrode 40*b* makes extremely strong electromagnetic-field coupling with the output-stage first resonant electrode 30*b* and the output-stage second resonant electrode 31*b*. Accordingly, in the entire regions of two extremely wide pass bands formed by the first resonant electrodes and the second resonant electrodes, respectively, it is possible to obtain bandpass characteristics of achieving flatness and loss reduction by lessening an increase in insertion loss even at a frequency falling between the resonance frequencies in the respective resonant modes.

In the bandpass filter of the present embodiment, the one end of the input-stage first resonant electrode 30*a* and the one end of the input-stage second resonant electrode 31*a* are located on the same side, and also the one end of the output-stage first resonant electrode 30*b* and the one end of the output-stage second resonant electrode 31*b* are located on the same side. In this construction, the input coupling electrode 40*a* can be broadside-coupled and interdigitally-coupled to the input-stage first resonant electrode 30*a* and the input-stage second resonant, electrode 31*a*, and also the output coupling electrode 40*b* can be broadside-coupled and interdigitally-coupled to the output-stage first resonant electrode 30*b* and the output-stage second resonant electrode 31*b*.

Although the spacing between the input coupling electrode 40*a* and the input-stage first resonant electrode 30*a* as well as the input-stage second resonant electrode 31*a*, and the spacing between the output coupling electrode 40*b* and the output-stage first resonant electrode 30*b* as well as the output-stage second resonant electrode 31*b* should preferably be made as small as possible from the standpoint of achieving strong mutual coupling, a reduction in the spacing gives rise to difficulty in manufacturing operation. Accordingly, the spacing is set to fall in a range of from approximately 0.01 to 0.5 mm.

Moreover, in the bandpass filter of the present embodiment, there are provided the first annular ground electrode 23 which is formed in an annular shape on the first interlayer of the multilayer body 10 so as to surround the first resonant electrodes 30*a*, 30*b*, 30*c*, and 30*d* and is connected with the one ends of, respectively, the first resonant electrodes 30*a*, 30*b*, 30*c*, and 30*d*, and the second annular ground electrode 24 which is formed in an annular shape on the second interlayer so as to surround the second resonant electrodes 31*a*, 31*b*, 31*c*, and 31*d* and is connected with the one ends of, respectively, the second resonant electrodes 31*a*, 31*b*, 31*c*, and 31*d*. With the provision of these annular ground electrodes, in the first resonant electrodes 30*a*, 30*b*, 30*c*, and 30*d* and in the second resonant electrodes 31*a*, 31*b*, 31*c*, and 31*d* as well, an electrode connected to ground does exist on both sides of the resonant electrode in its longitudinal direction. Therefore, staggered one ends of the individual resonant electrodes can be connected to ground with ease. Moreover, since the first annular ground electrode 23 annularly surrounds the first resonant electrodes 30*a*, 30*b*, 30*c*, and 30*d* and the second annular ground electrode 24 annularly surrounds the second resonant electrodes 31*a*, 31*b*, 31*c*, and 31*d*, it is possible to reduce the peripheral leakage of electromagnetic waves produced by the first resonant electrodes 30*a*, 30*b*, 30*c*, and 30*d* and the second resonant electrodes 31*a*, 31*b*, 31*c*, and 31*d*. This effect is especially useful in the case of forming a bandpass filter in part of the area of the module substrate in view of the protection of another part of the area of the module substrate from adverse effects.

Moreover, according to the bandpass filter of the present embodiment, on the fourth interlayer of the multilayer body 10 which is arranged on an opposite side of the third interlayer with the first interlayer interposed therebetween, there is disposed the first resonant electrode coupling conductor 71 which has its one end connected to ground close to one end of the frontmost-stage first resonant electrode 30*a* constituting the first resonant electrode group composed of the four adjoining first resonant electrodes 30*a*, 30*b*, 30*c*, and 30*d*, and has its other end connected to ground close to one end of the rearmost-stage first resonant electrode 30*b* constituting the first resonant electrode group, and also includes the region facing one end side of the frontmost-stage first resonant electrode 30*a* for electromagnetic-field coupling and the region facing one end side of the rearmost-stage first resonant electrode 30*b* for electromagnetic-field coupling. In addition, on the fifth interlayer of the multilayer body 10 which is arranged on an opposite side of the third interlayer with the second interlayer interposed therebetween, there is disposed the second resonant electrode coupling conductor 72 which has its one end connected to ground close to one end of the frontmost-stage second resonant electrode 31*a* constituting the second resonant electrode group composed of the four adjoining second resonant electrodes 31*a*, 31*b*, 31*c*, and 31*d*, and has its other end connected to ground close to one end of the rearmost-stage second resonant electrode 31*b* constituting the second resonant electrode group, and also includes the region facing one end side of the frontmost-stage second resonant electrode 31*a* for electromagnetic-field coupling and the region facing one end side of the rearmost-stage second resonant electrode 31*b* for electromagnetic-field coupling. In this construction, there arises a phase difference of 180° between a signal transmitted through the inductive coupling established between the frontmost-stage first resonant electrode 30*a* and the rearmost-stage first resonant electrode 30*b* of the first resonant electrode group via the first resonant electrode coupling conductor 71 and a signal transmitted through the capacitive coupling established between the adjacent first resonant electrodes, with consequent occurrence of a mutual cancellation phenomenon. Also, there arises a phase difference of 180° between a signal transmitted through the inductive coupling established between the frontmost-stage second resonant electrode 31*a* and the rearmost-stage second resonant electrode 31*b* of the second resonant electrode group via the second resonant electrode coupling conductor 72 and a signal transmitted through the capacitive coupling established between the adjacent second resonant electrodes, with consequent occurrence of a mutual cancellation phenomenon. Accordingly, in terms of the bandpass characteristics of the bandpass filter, an attenuation pole can be formed in the regions near both sides with respect to each of the two pass bands formed by the first resonant electrodes and the second resonant electrodes, respectively, where signals are barely transmitted.

Further, according to the bandpass filter of the present embodiment, the first resonant electrode coupling conductor 71 is composed of the strip-like first front-stage side coupling region 71*a* facing the frontmost-stage first resonant electrode 30*a* in parallel, the strip-like first rear-stage side coupling region 71*b* facing the rearmost-stage first resonant electrode

30*b* in parallel, and the first connection region 71*c* formed so as to be perpendicular to each of the first front-stage side coupling region 71*a* and the first rear-stage side coupling region 71*b*, for providing connection between the two coupling regions. Also, the second resonant electrode coupling conductor 72 is composed of the strip-like second front-stage side coupling region 72*a* facing the frontmost-stage second resonant electrode 31*a* in parallel, the strip-like second rear-stage side coupling region 72*b* facing the rearmost-stage second resonant electrode 31*b* in parallel, and the second connection region 72*c* formed so as to be perpendicular to each of the second front-stage side coupling region 72*a* and the second rear-stage side coupling region 72*b*, for providing connection between the two coupling regions. In this construction, the following effects can be gained. Firstly, the magnetic-field coupling between the first front-stage side coupling region 71*a* and the frontmost-stage first resonant electrode 30*a*, the magnetic-field coupling between the first rear-stage side coupling region 71*b* and the rearmost-stage first resonant electrode 30*b*, the magnetic-field coupling between the second front-stage side coupling region 72*a* and the frontmost-stage second resonant electrode 31*a*, and the magnetic-field coupling between the second rear-stage side coupling region 72*b* and the rearmost-stage second resonant electrode 31*b* can respectively be strengthened. Secondly, since the extent of the magnetic-field coupling between each of the frontmost-stage first resonant electrode 30*a*, the rearmost-stage first resonant electrode 30*b*, and the first resonant electrode lying therebetween and the first connection region 71*c* can be reduced to the minimum, it is possible to minimize the risk of deterioration in electrical characteristics resulting from unintended electromagnetic-field coupling between the first resonant electrodes via the first connection region 71*c*. Likewise, since the extent of the magnetic-field coupling between each of the frontmost-stage second resonant electrode 31*a*, the rearmost-stage second resonant electrode 31*b*, and the second resonant electrode lying therebetween and the second connection region 72*c* can be reduced to the minimum, it is possible to minimize the risk of deterioration in electrical characteristics resulting from unintended electromagnetic-field coupling between the second resonant electrodes via the second connection region 72*c*.

Still further, according to the bandpass filter of the present embodiment, the first resonant electrode coupling conductor 71 has its one end connected via the through conductor 50*c* to the first annular ground electrode 23 close to one end of the frontmost-stage first resonant electrode 30*a* constituting the first resonant electrode group, and has its other end connected via the through conductor 50*d* to the first annular ground electrode 23 close to one end of the rearmost-stage first resonant electrode 30*b* constituting the first resonant electrode group. This makes it possible to achieve a further strengthening of the electromagnetic-field coupling between the frontmost-stage first resonant electrode 30*a* constituting the first resonant electrode group and the rearmost-stage first resonant electrode 30*b* constituting the first resonant electrode group through the first resonant electrode coupling conductor 71, and thereby bring the attenuation pole formed on both sides with respect to the pass band formed by the first resonant electrodes 30*a*, 30*b*, 30*c*, and 30*d* closer to the vicinity of the pass band. Accordingly, stopband attenuation in the vicinity of the pass band can be augmented even further.

Likewise, according to the bandpass filter of the present embodiment, the second resonant electrode coupling conductor 72 has its one end connected via the through conductor 50*e* to the second annular ground electrode 24 close to one end of the frontmost-stage second resonant electrode 31*a* constituting the second resonant electrode group, and has its other end connected via the through conductor 50*f* to the second annular ground electrode 24 close to one end of the rearmost-stage second resonant electrode 31*b* constituting the second resonant electrode group. This makes it possible to achieve a further strengthening of the electromagnetic-field coupling between the frontmost-stage second resonant electrode 31*a* constituting the second resonant electrode group and the rearmost-stage second resonant electrode 31*b* constituting the second resonant electrode group through the second resonant electrode coupling conductor 72, and thereby bring the attenuation pole formed on both sides with respect to the pass band formed by the second resonant electrodes 31*a*, 31*b*, 31*c*, and 31*d* closer to the vicinity of the pass band. Accordingly, stopband attenuation in the vicinity of the pass band can be augmented even further.

(Twelfth Embodiment)

Figure 33:
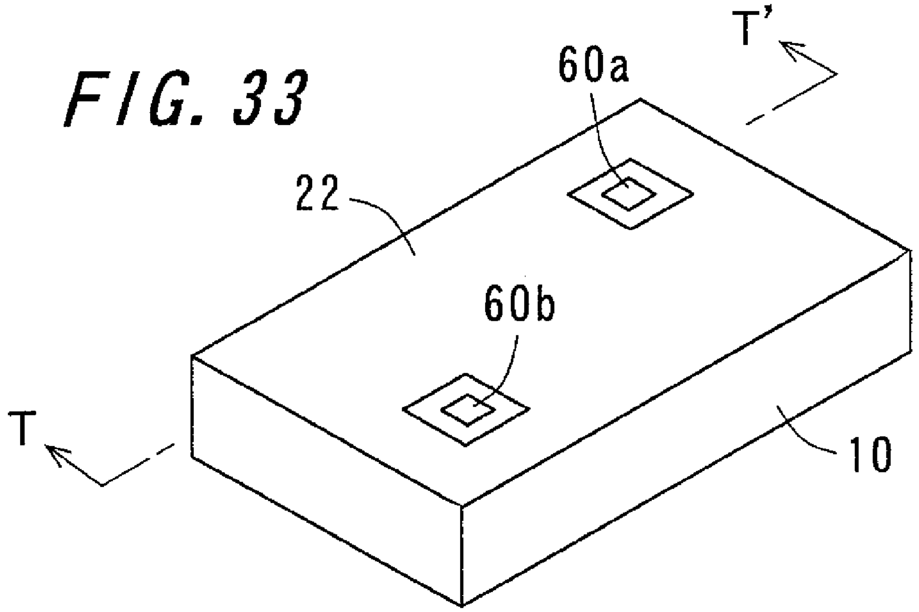
FIG. 33 is an external perspective view schematically showing a bandpass filter in accordance with a twelfth embodiment of the invention.
Figure 34:
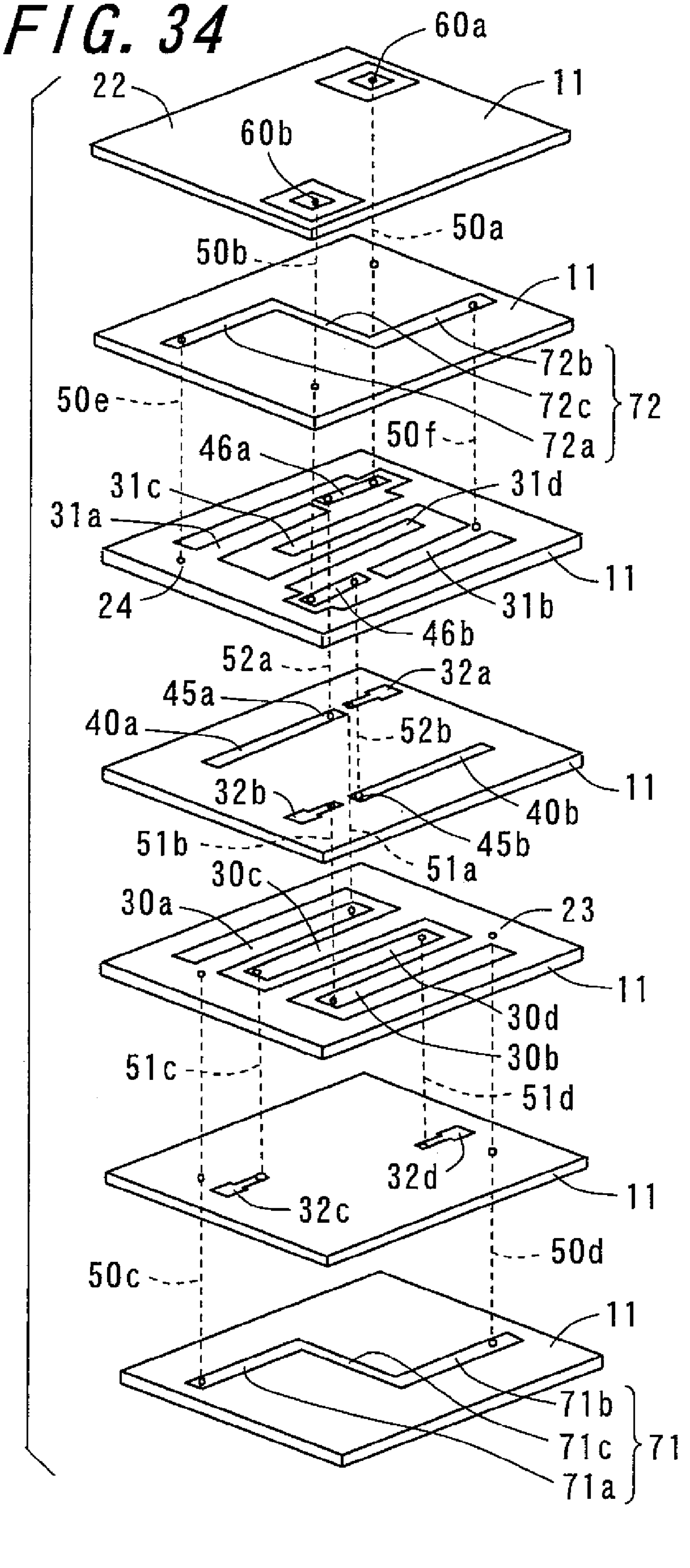
FIG. 34 is a schematic exploded perspective view of the bandpass filter shown in FIG. 33.
Figure 35:
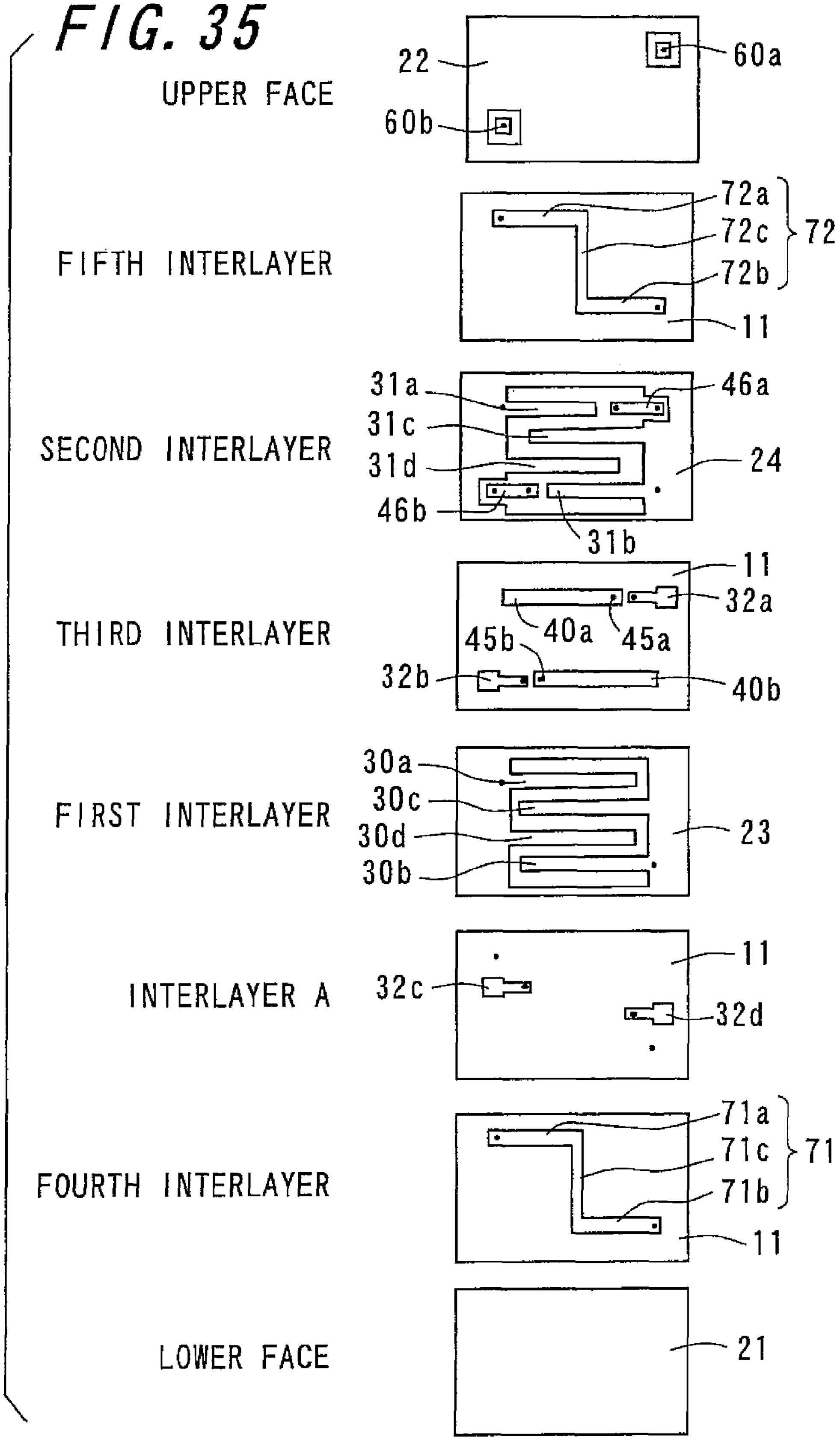
FIG. 35 is a plan view schematically showing upper and lower faces and interlayers of the bandpass filter shown in FIG. 33.
Figure 36:
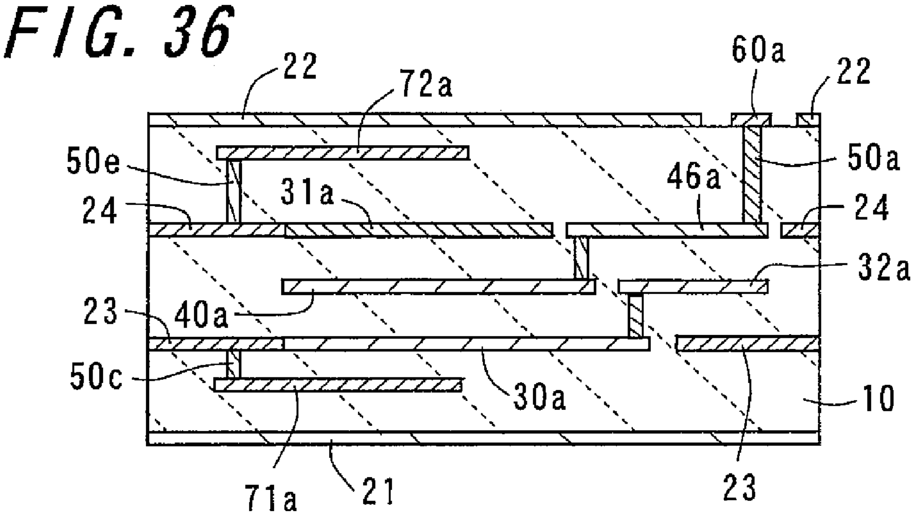
FIG. 36 is a sectional view of the bandpass filter taken along the line T-T' of FIG. 33.

FIG. 33 is an external perspective view schematically showing a bandpass filter in accordance with a twelfth embodiment of the invention. FIG. 34 is a schematic exploded perspective view of the bandpass filter shown in FIG. 33. FIG. 35 is a plan view schematically showing upper and lower faces and interlayers of the bandpass filter shown in FIG. 33. FIG. 36 is a sectional view of the bandpass filter taken along the line T-T' of FIG. 33. Note that the following description deals with in what way this embodiment differs from the above-mentioned eleventh embodiment, and the constituent components thereof that play the same or corresponding roles as in the preceding embodiments will be denoted by the same reference numerals and overlapping descriptions will be omitted.

As shown in FIGS. 33 through 36, in the bandpass filter of this embodiment, on the third interlayer of the multilayer body 10 are arranged: the input-stage auxiliary resonant electrode 32*a* which is so placed as to have a region facing the first annular ground electrode 23 and is connected via the through conductor 51*a* to the open end of the input-stage first resonant electrode 30*a*; and the output-stage auxiliary resonant electrode 32*b* which is so placed as to have a region facing the first annular ground electrode 23 and is connected via the through conductor 51*b* to the open end of the output-stage first resonant electrode 30*b*. In addition, on the interlayer A of the multilayer body 10 located between the first interlayer and the fourth interlayer, there are arranged the auxiliary resonant electrodes 32*c* and 32*d* that are each so placed as to have a region facing the first annular ground electrode 23 and are connected to the other ends of the first resonant electrodes 30*c* and 30*d*, respectively, via the through conductors 51*c* and 51*d*, respectively.

Moreover, in the bandpass filter of the present embodiment, on the second interlayer of the multilayer body 10 are arranged: the auxiliary input coupling electrode 46*a* which is so placed as to have a region facing the input-stage auxiliary resonant electrode 32*a* and is connected via the through conductor 52*a* to the electric signal input point 45*a* of the input coupling electrode 40*a*; and the auxiliary output coupling electrode 46*b* which is so placed as to have a region facing the output-stage auxiliary resonant electrode 32*b* and is connected via the through conductor 52*b* to the electric signal output point 45*b* of the output coupling electrode 40*b*. The auxiliary input coupling electrode 46*a*, to which is connected the input coupling electrode 40*a* via the through conductor 52*a*, is connected via another through conductor 50*a* to the input terminal electrode 60*a*. The auxiliary output coupling electrode 46*b*, to which is connected the output coupling electrode 40$b$ via the through conductor 52$b$, is connected via another through conductor 50$b$ to the output terminal electrode 60$b$.

According to the bandpass filter of the present embodiment thereby constructed, on the third interlayer and the interlayer A of the multilayer body 10 that are different from the first interlayer, there are arranged the auxiliary resonant electrodes 32$a$, 32$b$, 32$c$, and 32$d$ that are connected to the other end sides of the first resonant electrodes 30$a$, 30$b$, 30$c$, and 30$d$, respectively, via the through conductors 51$a$, 51$b$, 51$c$, and 51$d$, respectively, and are each so placed as to have the region facing the first annular ground electrode 23. In this construction, in the region where each of the auxiliary resonant electrodes 32$a$, 32$b$, 32$c$, and 32$d$ and the first annular ground electrode 23 face each other, electrostatic capacitance arises therebetween. Since the resultant electrostatic capacitance is added to the electrostatic capacitance between the ground potential and each of the first resonant electrodes 30$a$, 30$b$, 30$c$, and 30$d$ connected with the auxiliary resonant electrodes 32$a$, 32$b$, 32$c$, and 32$d$, respectively, it is possible to reduce the lengths of, respectively, the first resonant electrodes 30$a$, 30$b$, 30$c$, and 30$d$, and thereby obtain a more compact bandpass filter.

Moreover, the auxiliary resonant electrodes 32$a$, 32$b$, 32$c$, and 32$d$ are connected to the other end sides of the first resonant electrodes 30$a$, 30$b$, 30$c$, and 30$d$, respectively, and are so formed as to extend therefrom in the opposite direction to one ends of the first resonant electrodes 30$a$, 30$b$, 30$c$, and 30$d$, respectively. In this construction, the coupling body composed of the input-stage first resonant electrode 30$a$ and the input-stage auxiliary resonant electrode 32$a$ and a coupling body composed of the input coupling electrode 40$a$ and the auxiliary input coupling electrode 46$a$ are broadside-coupled to each other as a whole, thereby achieving extremely strong mutual coupling. Also, the coupling body composed of the output-stage first resonant electrode 30$b$ and the output-stage auxiliary resonant electrode 32$b$ and a coupling body composed of the output coupling electrode 40$b$ and the auxiliary output coupling electrode 46$b$ are broadside-coupled to each other as a whole, thereby achieving extremely strong mutual coupling.

The area of the part where the auxiliary resonant electrode 32$a$, 32$b$, 32$c$, 32$d$ and the first annular ground electrode 23 face each other is set to fall, for example, in a range of from approximately 0.01 to 3 $mm^2$ in consideration of the balance between a required size and electrostatic capacitance to be obtained. Although the spacing between the confronting faces of, respectively, the auxiliary resonant electrode 32$a$, 32$b$, 32$c$, 32$d$ and the first annular ground electrode 23 should preferably be made as small as possible from the standpoint of producing great electrostatic capacitance, a reduction in the spacing gives rise to difficulty in manufacturing operation. Accordingly, the spacing is set to fall in a range of from approximately 0.01 to 0.5 mm.

Moreover, according to the bandpass filter of the present embodiment, on the second interlayer of the multilayer body 10 are arranged: the auxiliary input coupling electrode 46$a$ which is so placed as to have the region facing the input-stage auxiliary resonant electrode 32$a$ and is connected via the through conductor 52$a$ to the electric signal input point 45$a$ of the input coupling electrode 40$a$; and the auxiliary output coupling electrode 46$b$ which is so placed as to have the region facing the output-stage auxiliary resonant electrode 32$b$ and is connected via the through conductor 52$b$ to the electric signal output point 45$b$ of the output coupling electrode 40$b$. In this construction, strong electromagnetic-field coupling is established between the input-stage auxiliary resonant electrode 32$a$ and the auxiliary input coupling electrode 46$a$ in a broadside-coupled state, and the effect of this electromagnetic-field coupling is added to the electromagnetic-field coupling between the input-stage first resonant electrode 30$a$ and the input coupling electrode 40$a$. Likewise, strong electromagnetic-field coupling is established between the output-stage auxiliary resonant electrode 32$b$ and the auxiliary output coupling electrode 46$b$ in a broadside-coupled state, and the effect of this electromagnetic-field coupling is added to the electromagnetic-field coupling between the output-stage first resonant electrode 30$b$ and the output coupling electrode 40$b$. This makes it possible to achieve a further strengthening of the electromagnetic-field coupling between the input coupling electrode 40$a$ and the input-stage first resonant electrode 30$a$, and the electromagnetic-field coupling between the output coupling electrode 40$b$ and the output-stage first resonant electrode 30$b$ as well. Accordingly, where the pass band formed by the plurality of first resonant electrodes 30$a$, 30$b$, 30$c$, and 30$d$ is concerned, even in an extremely wide pass band width, it is possible to obtain bandpass characteristics of achieving further flatness and loss reduction over the entire region of a wide pass band by lessening an increase in insertion loss at a frequency falling between the resonance frequencies in the respective resonant modes.

Further, according to the bandpass filter of the present embodiment, in the input coupling electrode 40$a$ as seen in its longitudinal direction, the electric signal input point 45$a$, to which is connected the auxiliary input coupling electrode 46$a$, is located at the part that lies nearer the other end of the input-stage first resonant electrode 30$a$ than the center of the part facing the input-stage first resonant electrode 30$a$ and also lies nearer the other end of the input-stage second resonant electrode 31$a$ than the center of the part facing the input-stage second resonant electrode 31$a$. Also, in the output coupling electrode 40$b$ as seen in its longitudinal direction, the electric signal output point 45$b$, to which is connected the auxiliary output coupling electrode 46$b$, is located at the part that lies nearer the other end of the output-stage first resonant electrode 30$b$ than the center of the part facing the output-stage first resonant electrode 30$b$ and also lies nearer the other end of the output-stage second resonant electrode 31$b$ than the center of the part facing the output-stage second resonant electrode 31$b$. In this construction, even in a case where an electric signal from the external circuit is inputted to the input coupling electrode 40$a$ via the auxiliary input coupling electrode 46$a$, and the electric signal is outputted from the output coupling electrode 40$b$ to the external circuit via the auxiliary output coupling electrode 46$b$, the input coupling electrode 40$a$ and the input-stage first resonant electrode 30$a$ as well as the input-stage second resonant electrode 31$a$ can be coupled to each other in an interdigital form, and also the output coupling electrode 40$b$ and the output-stage first resonant electrode 30$b$ as well as the output-stage second resonant electrode 31$b$ can be coupled to each other in an interdigital form. This makes it possible to establish strong mutual coupling by virtue of the combination of the effects of magnetic field coupling and electric field coupling.

Still further, according to the bandpass filter of the present embodiment, in the auxiliary input coupling electrode 46$a$ as seen in its longitudinal direction, its end opposite from the end connected to the input coupling electrode 40$a$ via the through conductor 52$a$ is connected to the input terminal electrode 60$a$ via another through conductor 50$a$. In this construction, the coupling body composed of the input-stage first resonant electrode 30$a$ and the input-stage auxiliary resonant electrode 32$a$ and the coupling body composed of the input coupling electrode 40*a* and the auxiliary input coupling electrode 46*a* are coupled to each other in an interdigital form as a whole This makes it possible to establish strong mutual coupling by virtue of the combination of the effects of magnetic field coupling and electric field coupling. Hence, as compared with a case where the auxiliary input coupling electrode 46*a*, as seen in its longitudinal direction, is connected to the input terminal electrode 60*a* at the same side that is connected to the input coupling electrode 40*a*, a greater degree of coupling strength can be ensured.

Likewise, according to the bandpass filter of the present embodiment, in the auxiliary output coupling electrode 46*b* as seen in its longitudinal direction, its end opposite from the end connected to the output coupling electrode 40*b* via the through conductor 52*b* is connected to the output terminal electrode 60*b* via another through conductor 50*b*. In this construction, the coupling body composed of the output-stage first resonant electrode 30*b* and the output-stage auxiliary resonant electrode 32*b* and the coupling body composed of the output coupling electrode 40*b* and the auxiliary output coupling electrode 46*b* are coupled to each other in an interdigital form as a whole. This makes it possible to establish strong mutual coupling by virtue of the combination of the effects of magnetic field coupling and electric field coupling. Hence, as compared with a case where the auxiliary output coupling electrode 46*b*, as seen in its longitudinal direction, is connected to the output terminal electrode 60*b* at the same side that is connected to the output coupling electrode 40*b*, a greater degree of coupling strength can be ensured.

In this way, the coupling body composed of the input-stage first resonant electrode 30*a* and the input-stage auxiliary resonant electrode 32*a* and the coupling body composed of the input coupling electrode 40*a* and the auxiliary input coupling electrode 46*a* are broadside-coupled to each other as a whole, and are also brought into an interdigitally-coupled state, thereby achieving extremely strong mutual coupling. Likewise, the coupling body composed of the output-stage first resonant electrode 30*b* and the output-stage auxiliary resonant electrode 32*b* and the coupling body composed of the output coupling electrode 40*b* and the auxiliary output coupling electrode 46*b* are broadside-coupled to each other as a whole, and are also brought into an interdigitally-coupled state, thereby achieving extremely strong mutual coupling. Accordingly, where the pass band formed by the plurality of first resonant electrodes 30*a*, 30*b*, 30*c*, and 30*d* is concerned, even in an extremely wide pass band width, it is possible to obtain bandpass characteristics of achieving further flatness and loss reduction over the entire region of a wide pass band by lessening an increase in insertion loss at a frequency falling between the resonance frequencies in the respective resonant modes.

For example, the width of the auxiliary input coupling electrode 46*a*, as well as the width of the auxiliary output coupling electrode 46*b*, is set to be substantially the same as those of the input coupling electrode 40*a* and the output coupling electrode 40*b*, and the length of the auxiliary input coupling electrode 46*a*, as well as the length of the auxiliary output coupling electrode 46*b*, is set to be slightly longer than that of the auxiliary resonant electrode 32*a*, 32*b*. Although the spacing between the auxiliary input coupling electrode 46*a* as well as the auxiliary output coupling electrode 46*b* and the auxiliary resonant electrode 32*a*, 32*b* should preferably be made as small as possible from the standpoint of achieving strong mutual coupling, a reduction in the spacing gives rise to difficulty in manufacturing operation. Accordingly, the spacing is set to fall in a range of from approximately 0.01 to 0.5 mm, for example.

(Thirteenth Embodiment)

Figure 37:
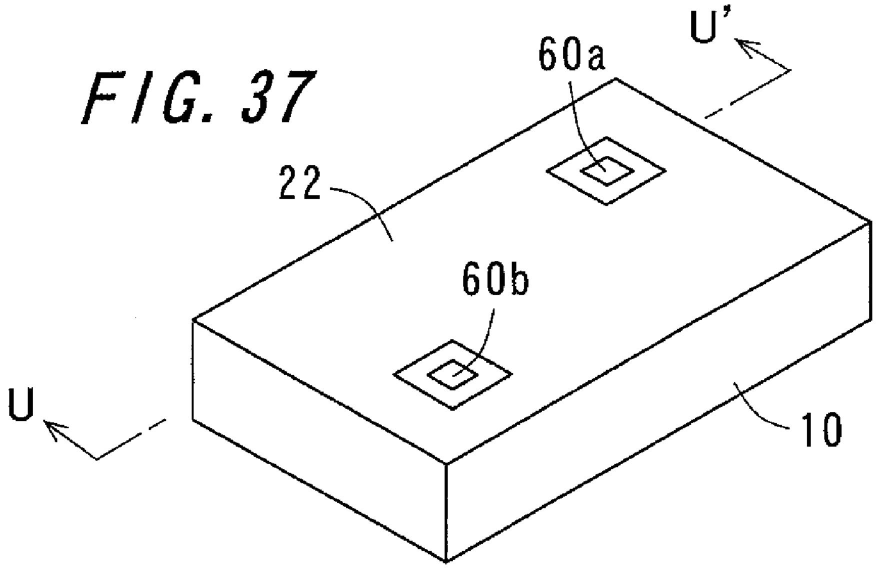
FIG. 37 is an external perspective view schematically showing a bandpass filter in accordance with a thirteenth embodiment of the invention.
Figure 38:
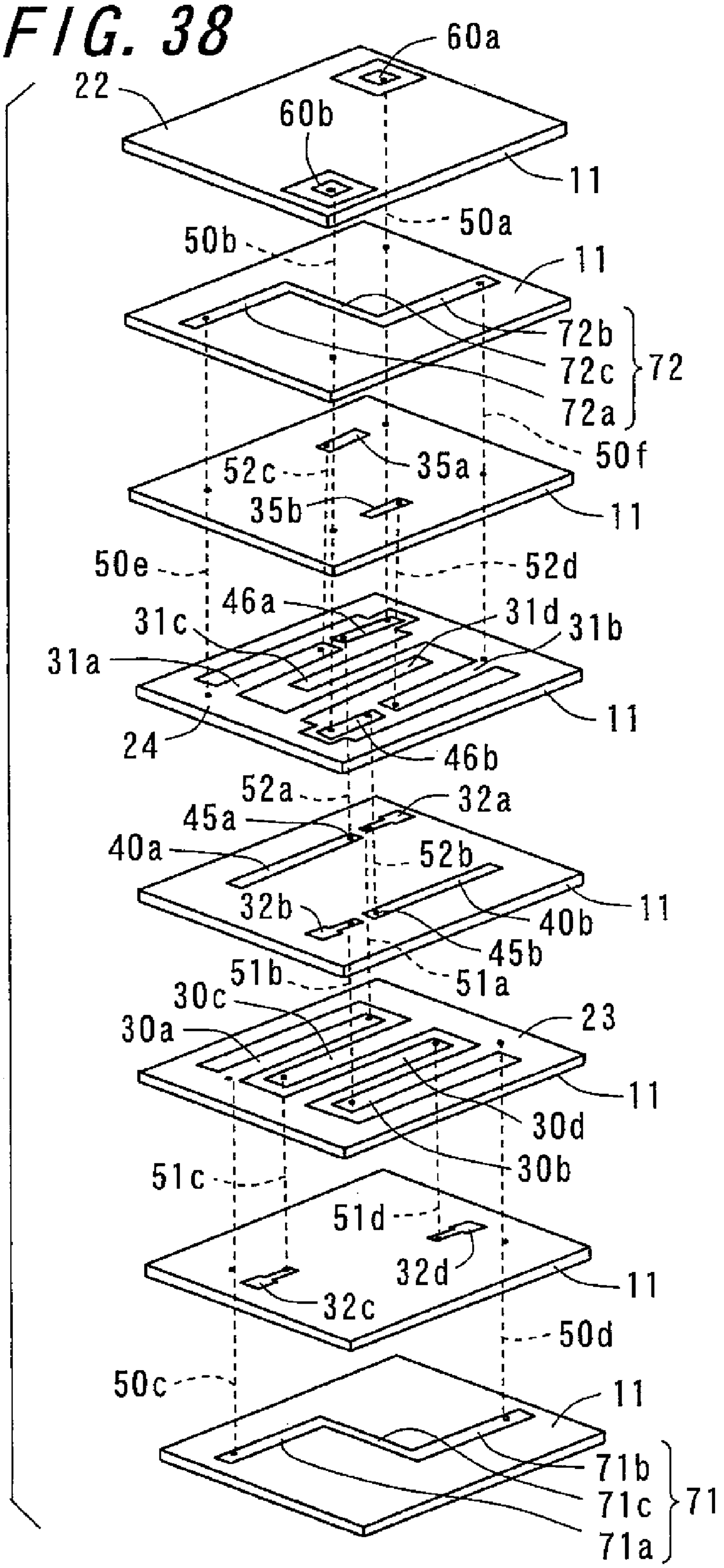
FIG. 38 is a schematic exploded perspective view of the bandpass filter shown in FIG. 37.
Figure 39:
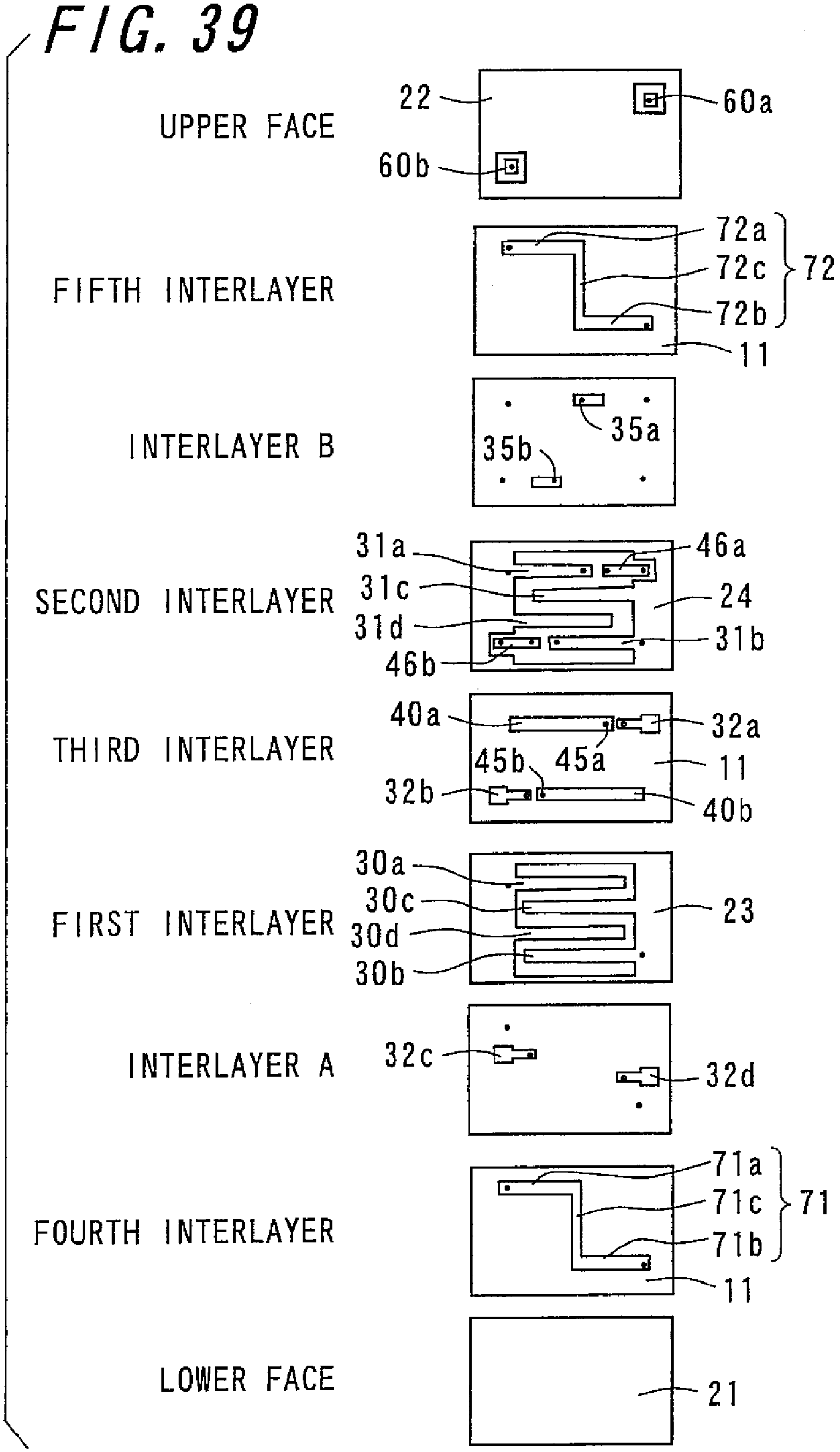
FIG. 39 is a plan view schematically showing upper and lower faces and interlayers of the bandpass filter shown in FIG. 37.
Figure 40:
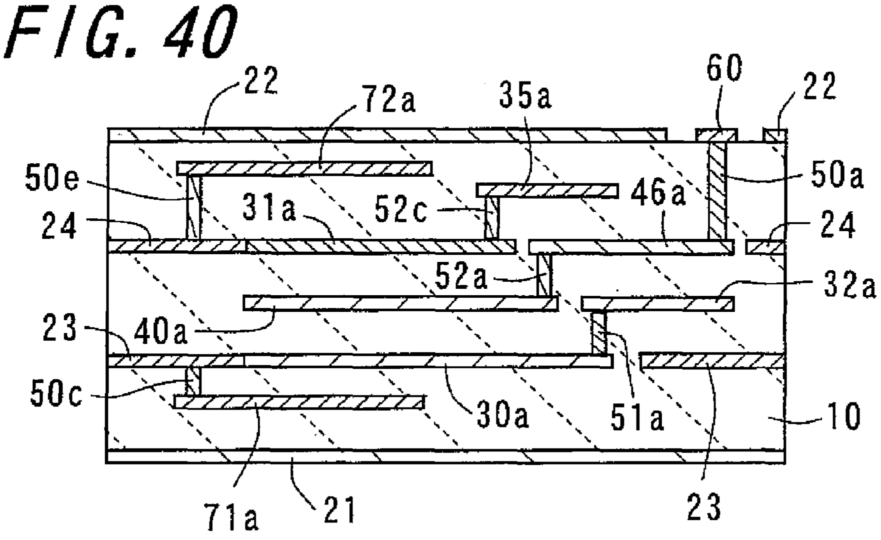
FIG. 40 is a sectional view of the bandpass filter taken along the line U-U' of FIG. 37.

FIG. 37 is an external perspective view schematically showing a bandpass filter in accordance with a thirteenth embodiment of the invention. FIG. 38 is a schematic exploded perspective view of the bandpass filter shown in FIG. 37. FIG. 39 is a plan view schematically showing upper and lower faces and interlayers of the bandpass filter shown in FIG. 37. FIG. 40 is a sectional view of the bandpass filter taken along the line U-U' of FIG. 37. Note that the following description deals with in what way this embodiment differs from the above-mentioned twelfth embodiment, and the constituent components thereof that play the same or corresponding roles as in the preceding embodiments will be denoted by the same reference numerals and overlapping descriptions will be omitted.

As shown in FIGS. 37 through 40, in the bandpass filter of this embodiment, on the interlayer B of the multilayer body 10 located between the second interlayer and the fifth interlayer, there are arranged a strip-like first resonant coupling auxiliary electrode 35*a* and a strip-like second resonant coupling auxiliary electrode 35*b*. The first resonant coupling auxiliary electrode 35*a* is so placed as to have a region facing the auxiliary input coupling electrode 46*a* and is connected via a through conductor 52*c* to the other end side of the input-stage second resonant electrode 31*a*. The second resonant coupling auxiliary electrode 35*b* is so placed as to have a region facing the auxiliary output coupling electrode 46*b* and is connected via a through conductor 52*d* to the other end side of the output-stage second resonant electrode 31*b*.

According to the bandpass filter of the present embodiment thereby constructed, strong electromagnetic-field coupling is established between the first resonant coupling auxiliary electrode 35*a* and the auxiliary input coupling electrode 46*a* in a broadside-coupled state, and the effect of this electromagnetic-field coupling is added to the electromagnetic-field coupling between the input-stage second resonant electrode 31*a* and the input coupling electrode 40*a*. Likewise, strong electromagnetic-field coupling is established between the second resonant coupling auxiliary electrode 35*b* and the auxiliary output coupling electrode 46*b* in a broadside-coupled state, and the effect of this electromagnetic-field coupling is added to the electromagnetic-field coupling between the output-stage second resonant electrode 31*b* and the output coupling electrode 40*b*. This makes it possible to achieve a further strengthening of the electromagnetic-field coupling between the input coupling electrode 40*a* and the input-stage second resonant electrode 31*a*, as well as the electromagnetic-field coupling between the output coupling electrode 40*b* and the output-stage second resonant electrode 31*b*.

Moreover, according to the bandpass filter of the present embodiment, the first resonant coupling auxiliary electrode 35*a* is connected to the other end side of the input-stage second resonant electrode 31*a* and is so formed as to extend therefrom in the opposite direction to one end side of the input-stage second resonant electrode 31*a*. Also, the second resonant coupling auxiliary electrode 35*b* is connected to the other end side of the output-stage second resonant electrode 31*b* and is so formed as to extend therefrom in the opposite direction to one end side of the output-stage second resonant electrode 31*b*. In this construction, a coupling body composed of the input-stage second resonant electrode 31*a* and the first resonant coupling auxiliary electrode 35*a* and the coupling body composed of the input coupling electrode 40*a* and the auxiliary input coupling electrode 46*a* are coupled to each other in an interdigital form as a whole. Also, a coupling body composed of the output-stage second resonant electrode 31*b* and the second resonant coupling auxiliary electrode 35*b* and the coupling body composed of the output coupling electrode 40*b* and the auxiliary output coupling electrode 46*b* are coupled to each other in an interdigital form as a whole. This makes it possible to establish stronger mutual electromagnetic-field coupling by virtue of the combination of the effects of magnetic field coupling and electric field coupling. Accordingly, where the pass band formed by the second resonant electrodes 31*a*, 31*b*, 31*c*, and 31*d* is concerned, even in an extremely wide pass band width, it is possible to obtain bandpass characteristics of achieving further flatness and loss reduction over the entire region of a wide pass band by lessening an increase in insertion loss at a frequency falling between the resonance frequencies in the respective resonant modes.

(Fourteenth Embodiment)

Figure 41:
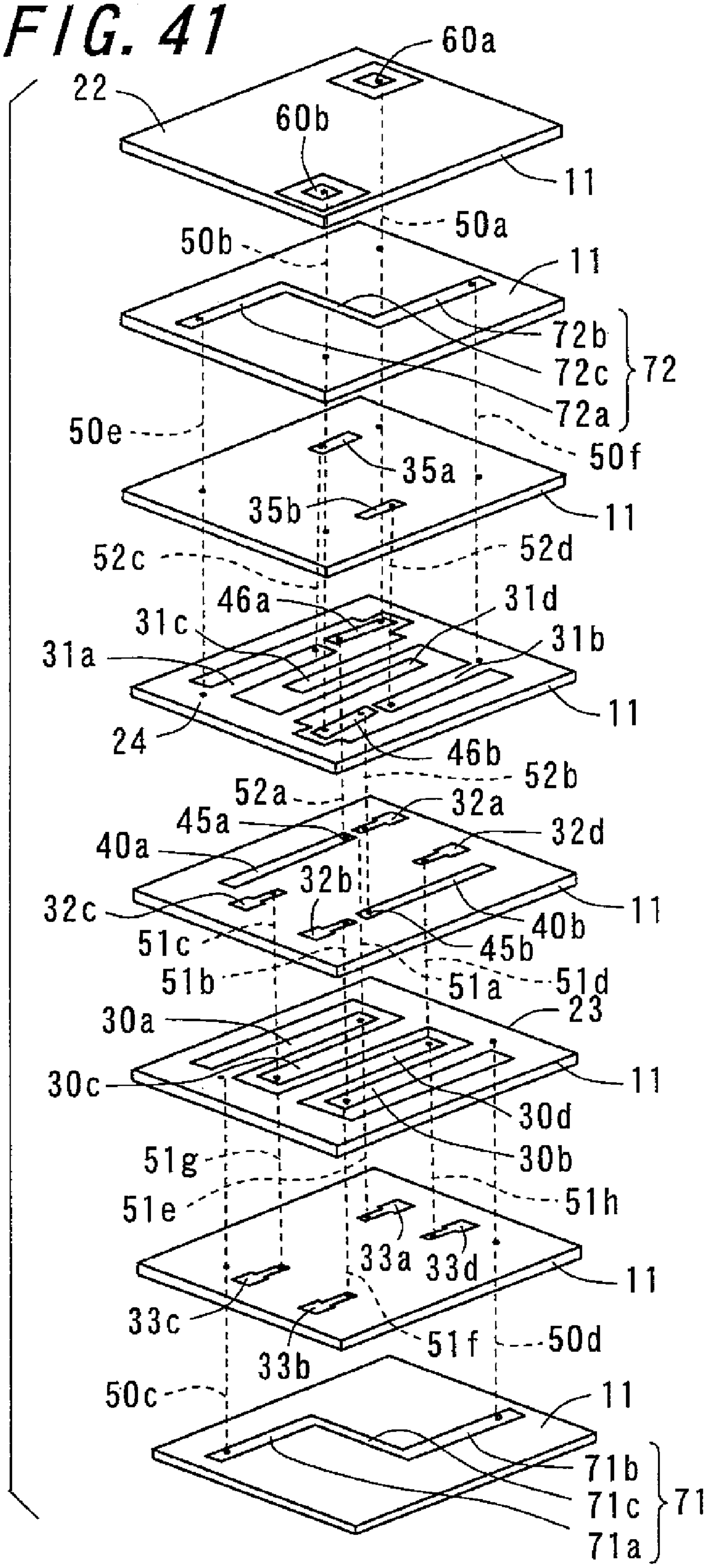
FIG. 41 is an exploded perspective view schematically showing a bandpass filter in accordance with a fourteenth embodiment of the invention.
Figure 42:
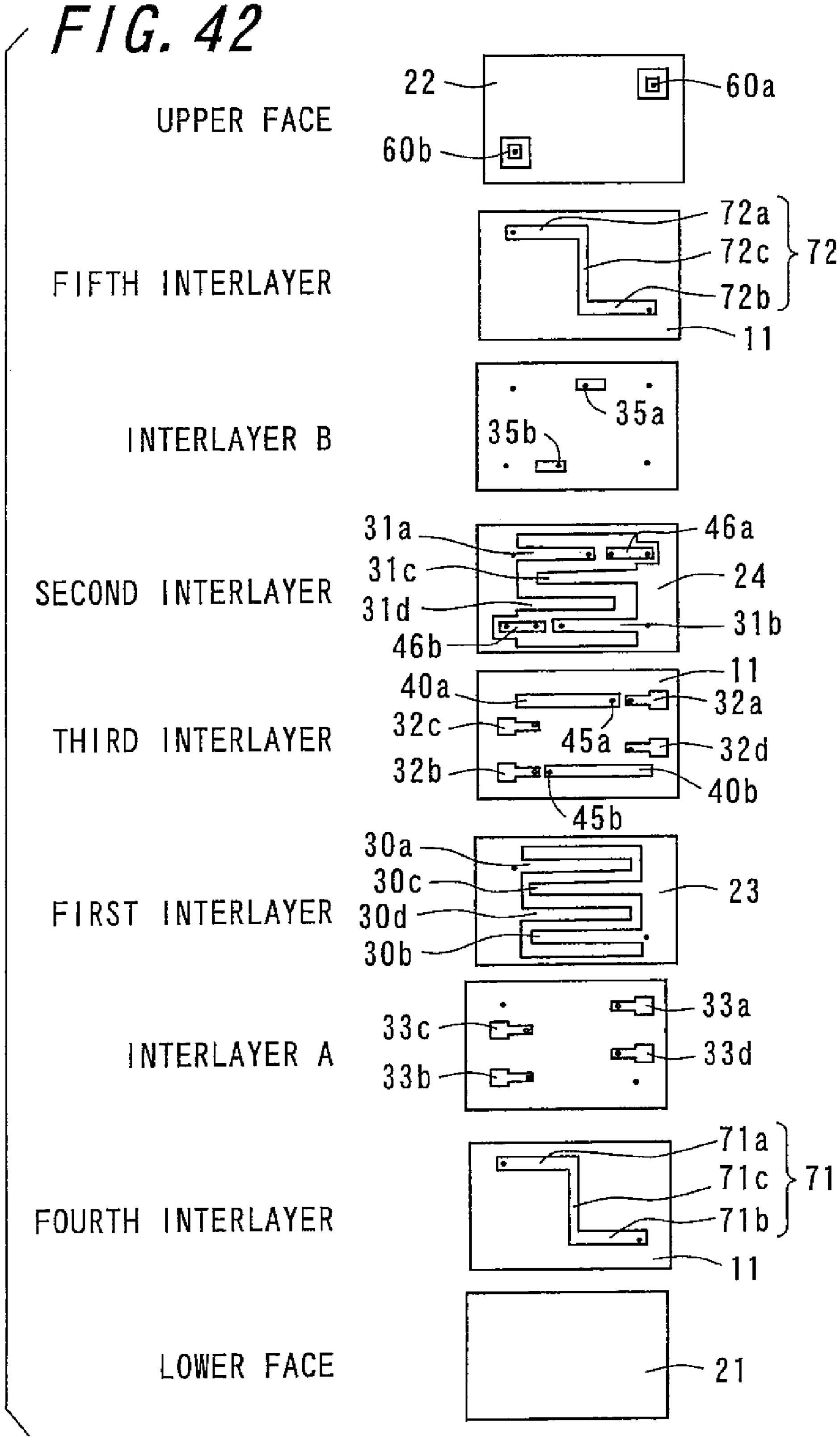
FIG. 42 is a plan view schematically showing upper and lower faces and interlayers of the bandpass filter shown in FIG. 41.

FIG. 41 is an exploded perspective view schematically showing a bandpass filter in accordance with a fourteenth embodiment of the invention. FIG. 42 is a plan view schematically showing upper and lower faces and interlayers of the bandpass filter shown in FIG. 41. Note that the following description deals with in what way this embodiment differs from the above-mentioned thirteenth embodiment, and the constituent components thereof that play the same or corresponding roles as in the preceding embodiments will be denoted by the same reference numerals and overlapping descriptions will be omitted.

In the bandpass filter of this embodiment, as shown in FIGS. 41 and 42, all of the auxiliary resonant electrodes 32*a*, 32*b*, 32*c*, and 32*d* are arranged on the third interlayer of the multilayer body 10. Moreover, on the interlayer A of the multilayer body 10 which is arranged on an opposite side of the third interlayer with the first interlayer interposed therebetween, there are arranged the second auxiliary resonant electrodes 33*a*, 33*b*, 33*c*, and 33*d* that are each so placed as to have a region facing the first annular ground electrode 23 and are connected to the other end sides of the first resonant electrodes 30*a*, 30*b*, 30*c*, and 30*d*, respectively, via through conductors 51*e*, 51*f*, 51*g*, and 51*h*, respectively.

According to the bandpass filter of the present embodiment thereby constructed, in the region where each of the second auxiliary resonant electrodes 33*a*, 33*b*, 33*c*, and 33*d* and the first annular ground electrode 23 face each other, electrostatic capacitance arises therebetween. Since the resultant electrostatic capacitance is added to the electrostatic capacitance between the ground potential and each of the first resonant electrodes 30*a*, 30*b*, 30*c*, and 30*d* connected with the second auxiliary resonant electrodes 33*a*, 33*b*, 33*c*, and 33*d*, respectively, it is possible to reduce the lengths of, respectively, the first resonant electrodes 30*a*, 30*b*, 30*c*, and 30*d*, and thereby obtain an even more compact bandpass filter.

(Fifteenth Embodiment)

Figure 43:
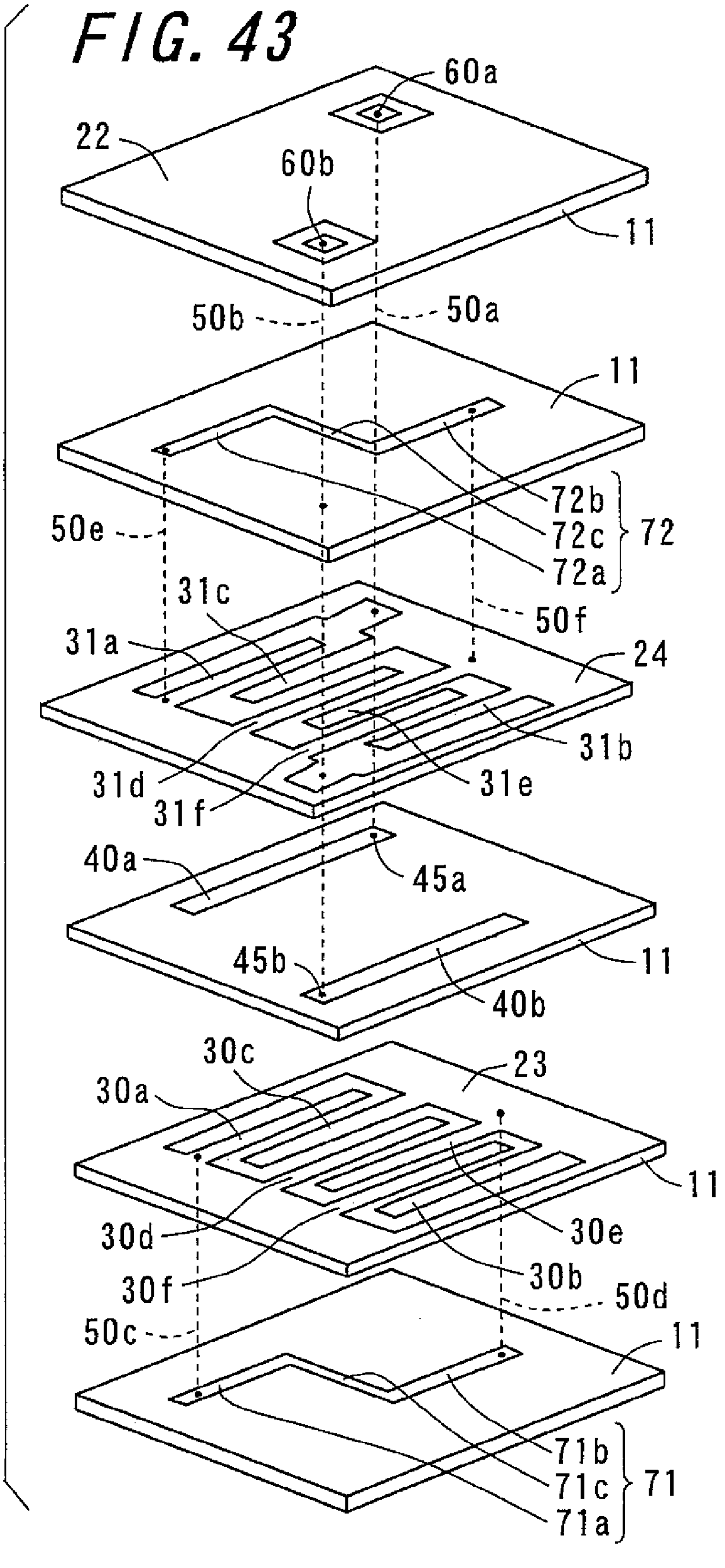
FIG. 43 is an exploded perspective view schematically showing a bandpass filter in accordance with a fifteenth embodiment of the invention.

FIG. 43 is an exploded perspective view schematically showing a bandpass filter in accordance with a fifteenth embodiment of the invention. Note that the following description deals with in what way this embodiment differs from the above-mentioned eleventh embodiment, and the constituent components thereof that play the same or corresponding roles as in the preceding embodiments will be denoted by the same reference numerals and overlapping descriptions will be omitted.

In the bandpass filter of this embodiment, as shown in FIG. 43, six pieces of first resonant electrodes 30*a*, 30*b*, 30*c*, 30*d*, 30*e*, and 30*f* are arranged on the first interlayer of the multilayer body 10, and six pieces of second resonant electrodes 31*a*, 31*b*, 31*c*, 31*d*, 31*e*, and 31*f* are arranged on the second interlayer.

Moreover, in the bandpass filter of the present embodiment, on the fourth interlayer of the multilayer body 10 is disposed the first resonant electrode coupling conductor 71 which has its one end connected to ground close to one end of the frontmost-stage first resonant electrode 30*a* constituting a first resonant electrode group composed of four adjoining first resonant electrodes 30*a*, 30*c*, 30*d*, and 30*e*, and has its other end connected to ground close to one end of the rearmost-stage first resonant electrode 30*e* constituting the first resonant electrode group, and also includes a region facing one end side of the frontmost-stage first resonant electrode 30*a* for electromagnetic-field coupling and a region facing one end side of the rearmost-stage first resonant electrode 30*e* for electromagnetic-field coupling. In addition, on the fifth interlayer of the multilayer body 10 is disposed the second resonant electrode coupling conductor 72 which has its one end connected to ground close to one end of the frontmost-stage second resonant electrode 31*a* constituting a second resonant electrode group composed of four adjoining second resonant electrodes 31*a*, 31*c*, 31*d*, and 31*e*, and has its other end connected to ground close to one end of the rearmost-stage second resonant electrode 31*e* constituting the second resonant electrode group, and also includes a region facing one end side of the frontmost-stage second resonant electrode 31*a* for electromagnetic-field coupling and a region facing one end side of the rearmost-stage second resonant electrode 31*e* for electromagnetic-field coupling.

According to the bandpass filter of the present embodiment thereby constructed, just like the bandpass filter of the above-mentioned eleventh embodiment of the invention, there arises a phase difference of 180° between a signal transmitted through the inductive coupling established between the frontmost-stage first resonant electrode 30*a* and the rearmost-stage first resonant electrode 30*e*, which constitute the first resonant electrode group composed of the four adjoining first resonant electrodes 30*a*, 30*c*, 30*d*, and 30*e*, via the first resonant electrode coupling conductor 71 and a signal transmitted through the capacitive coupling established between the adjacent first resonant electrodes, with consequent occurrence of a mutual cancellation phenomenon. Also, there arises a phase difference of 180° between a signal transmitted through the inductive coupling established between the frontmost-stage second resonant electrode 31*a* and the rearmost-stage second resonant electrode 31*e*, which constitute the second resonant electrode group composed of the four adjoining second resonant electrodes 31*a*, 31*c*, 31*d*, and 31*e*, via the second resonant electrode coupling conductor 72 and a signal transmitted through the capacitive coupling established between the adjacent second resonant electrodes, with consequent occurrence of a mutual cancellation phenomenon. Accordingly, in terms of the bandpass characteristics of the bandpass filter, an attenuation pole can be formed in the regions near both sides with respect to each of the two pass bands formed by the first resonant electrodes and the second resonant electrodes, respectively, where signals are barely transmitted.

(Sixteenth Embodiment)

Figure 44:
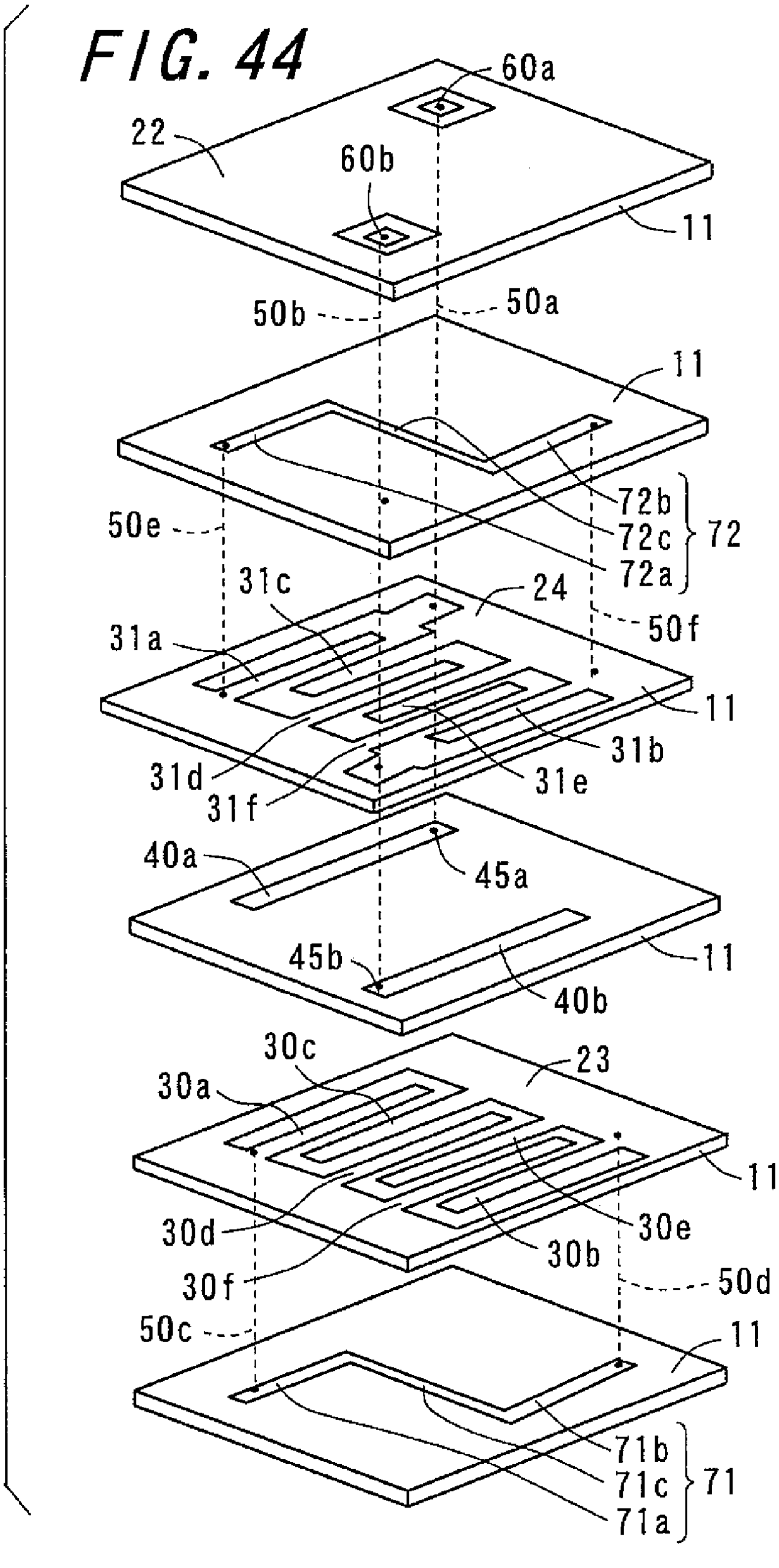
FIG. 44 is an exploded perspective view schematically showing a bandpass filter in accordance with a sixteenth embodiment of the invention.

FIG. 44 is an exploded perspective view schematically showing a bandpass filter in accordance with a sixteenth embodiment of the invention. Note that the following description deals with in what way this embodiment differs from the above-mentioned fifteenth embodiment, and the constituent components thereof that play the same or corresponding roles as in the preceding embodiments will be denoted by the same reference numerals and overlapping descriptions will be omitted.

In the bandpass filter of this embodiment, as shown in FIG. 44, on the fourth interlayer of the multilayer body 10 is disposed the first resonant electrode coupling conductor 71 which has its one end connected to ground close to one end of the frontmost-stage first resonant electrode 30*a* constituting a first resonant electrode group composed of six adjoining first resonant electrodes 30*a*, 30*b*, 30*c*, 30*d*, 30*e*, and 30*f*, and has its other end connected to ground close to one end of the rearmost-stage first resonant electrode 30*b* constituting the first resonant electrode group, and also includes a region facing one end side of the frontmost-stage first resonant electrode 30*a* for electromagnetic-field coupling and a region facing one end side of the rearmost-stage first resonant electrode 30*b* for electromagnetic-field coupling. In addition, on the fifth interlayer of the multilayer body 10 is disposed the second resonant electrode coupling conductor 72 which has its one end connected to ground close to one end of the frontmost-stage second resonant electrode 31*a* constituting a second resonant electrode group composed of six adjoining second resonant electrodes 31*a*, 31*b*, 31*c*, 31*d*, 31*e*, and 31*f*, and has its other end connected to ground close to one end of the rearmost-stage second resonant electrode 31*b* constituting the second resonant electrode group, and also includes a region facing one end side of the frontmost-stage second resonant electrode 31*a* for electromagnetic-field coupling and a region facing one end side of the rearmost-stage second resonant electrode 31*b* for electromagnetic-field coupling.

According to the bandpass filter of the present embodiment thereby constructed, there arises a phase difference of 180° between a signal transmitted through the inductive coupling established between the frontmost-stage first resonant electrode 30*a* and the rearmost-stage first resonant electrode 30*b*, which constitute the first resonant electrode group composed of the six adjoining first resonant electrodes 30*a*, 30*b*, 30*c*, 30*d*, 30*e*, and 30*f*, via the first resonant electrode coupling conductor 71 and a signal transmitted through the capacitive coupling established between the adjacent first resonant electrodes, with consequent occurrence of a mutual cancellation phenomenon. Also, there arises a phase difference of 180° between a signal transmitted through the inductive coupling, established between the frontmost-stage second resonant electrode 31*a* and the rearmost-stage second resonant electrode 31*b*, which constitute the second resonant electrode group composed of the six adjoining second resonant electrodes 31*a*, 31*b*, 31*c*, 31*d*, 31*e*, and 31*f*, via the second resonant electrode coupling conductor 72 and a signal transmitted through the capacitive coupling established between the adjacent second resonant electrodes, with consequent occurrence of a mutual cancellation phenomenon. Accordingly, in terms of the bandpass characteristics of the bandpass filter, an attenuation pole can be formed in the regions near both sides with respect to each of the two pass bands formed by the first resonant electrodes and the second resonant electrodes, respectively, where signals are barely transmitted.

In this way, the first resonant electrode group can be composed of four or more adjoining ones of the first resonant electrodes, and also the second resonant electrode group can be composed of four or more adjoining ones of the second resonant electrodes.

(Seventeenth Embodiment)

Figure 45:
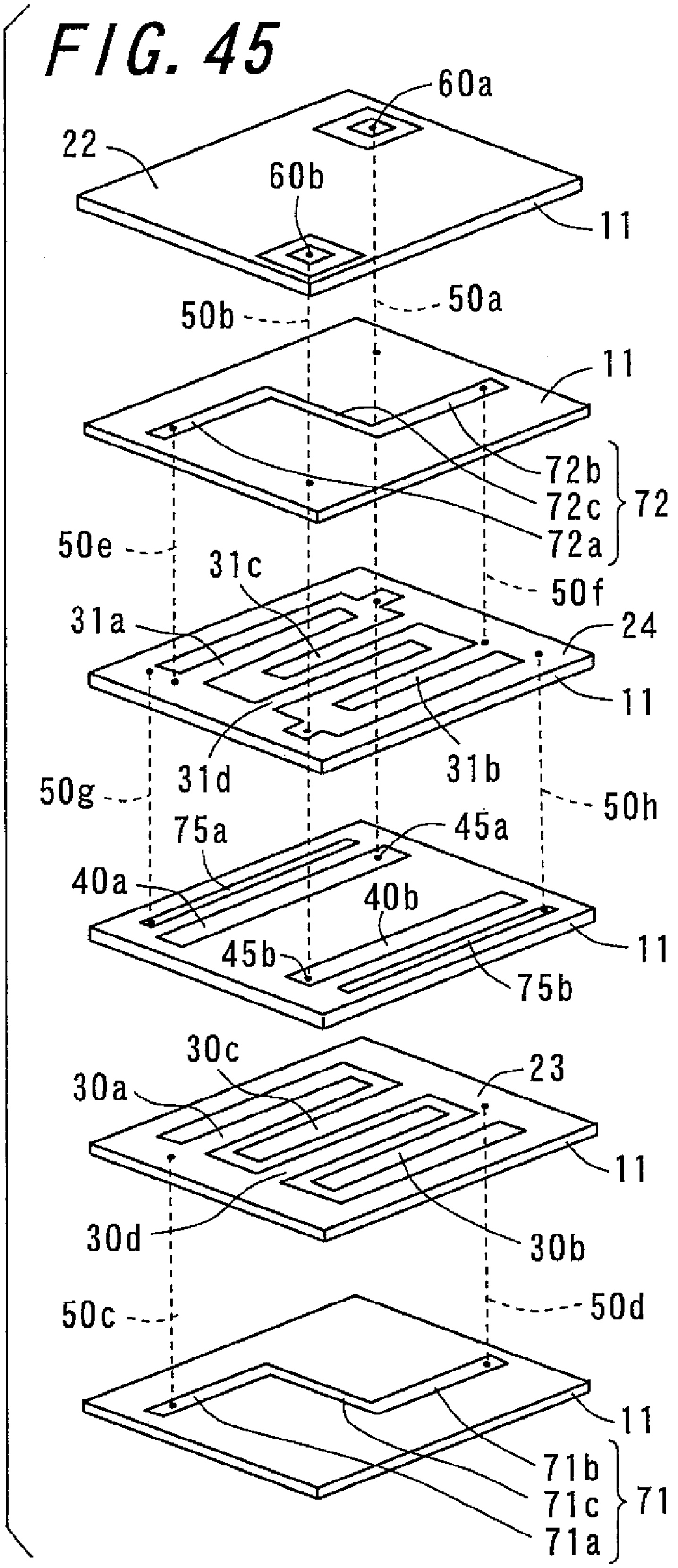
FIG. 45 is an exploded perspective view schematically showing a bandpass filter in accordance with a seventeenth embodiment of the invention.
Figure 46:
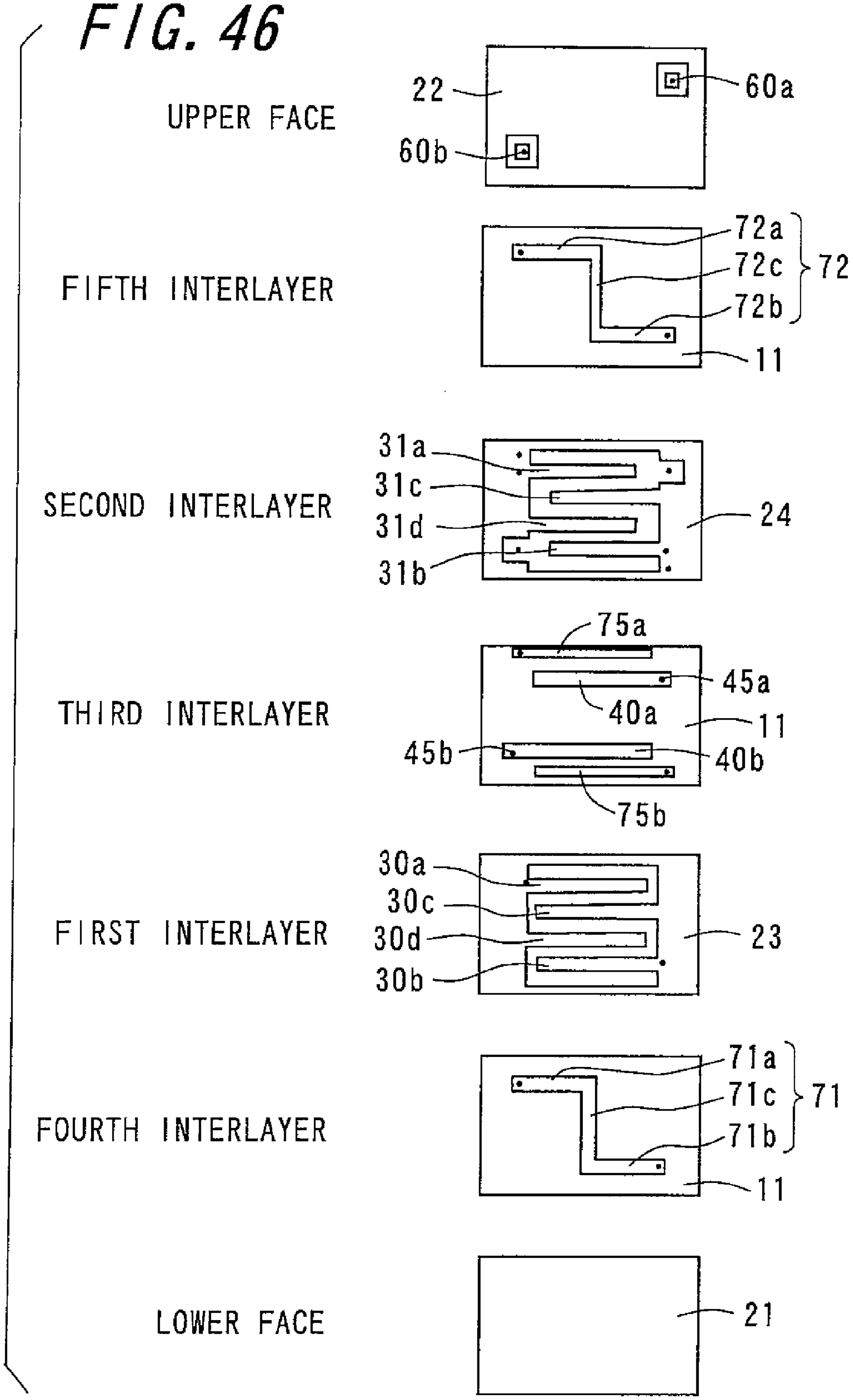
FIG. 46 is a plan view schematically showing, upper and lower faces and interlayers of the bandpass filter shown in FIG. 45.

FIG. 45 is an exploded perspective view schematically showing a bandpass filter in accordance with a seventeenth embodiment of the invention. FIG. 46 is a plan view schematically showing upper and lower faces and interlayers of the bandpass filter shown in FIG. 45. Note that the following description deals with in what way this embodiment differs from the above-mentioned eleventh embodiment, and the constituent components thereof that play the same or corresponding roles as in the preceding embodiments will be denoted by the same reference numerals and overlapping descriptions will be omitted.

In the bandpass filter of this embodiment, as shown in FIGS. 45 and 46, on the third interlayer of the multilayer body 10 are arranged a strip-like first reaction-type resonant electrode 75*a* and a strip-like second reaction-type resonant electrode 75*b*. The first reaction-type resonant electrode 75*a* is arranged on an opposite side of the output coupling electrode 40*b* with the input coupling electrode 40*a* interposed therebetween when viewed in a plane-wise direction, is located close to and substantially parallel to the input coupling electrode 40*a* for mutual electromagnetic-field coupling, and has its one end connected to ground via a through conductor 50*g* so as to serve as a quarter-wavelength resonator. The second reaction-type resonant electrode 75*b* is arranged on an opposite side of the input coupling electrode 40*a* with the output coupling electrode 40*b* interposed therebetween when viewed in the plane-wise direction, is located close to and substantially parallel to the output coupling electrode 40*b* for mutual electromagnetic-field coupling, and has its one end connected to ground via a through conductor 50*h* so as to serve as a quarter-wavelength resonator.

According to the bandpass filter of the present embodiment thereby constructed, since the first reaction-type resonant electrode 75*a* and the second reaction-type resonant electrode 75*b* serve as a reaction-type resonator, it follows that, in terms of the bandpass characteristics of the bandpass filter, an attenuation pole can be formed at their respective resonance frequencies and thus the attenuation can be augmented even further at each of the frequencies.

(Eighteenth Embodiment)

Figure 47:
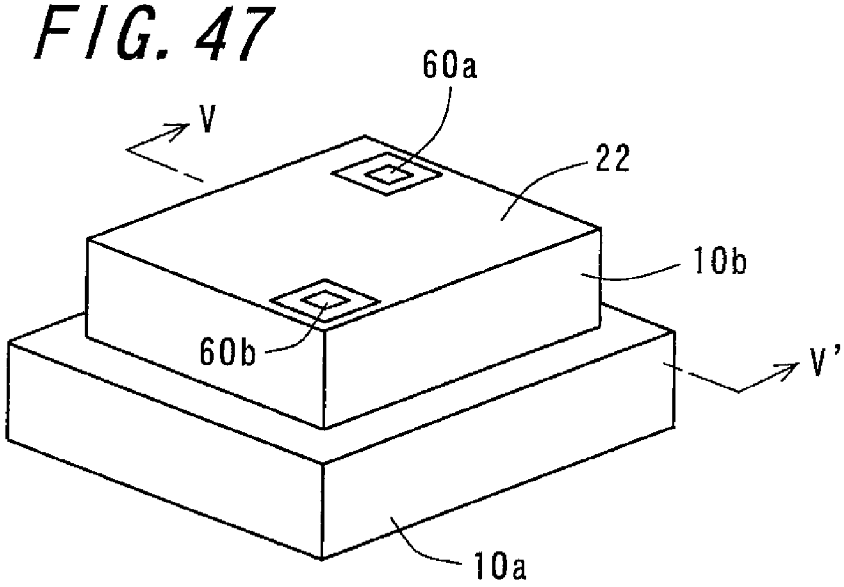
FIG. 47 is an external perspective view schematically showing a bandpass filter in accordance with an eighteenth embodiment of the invention.
Figure 48:
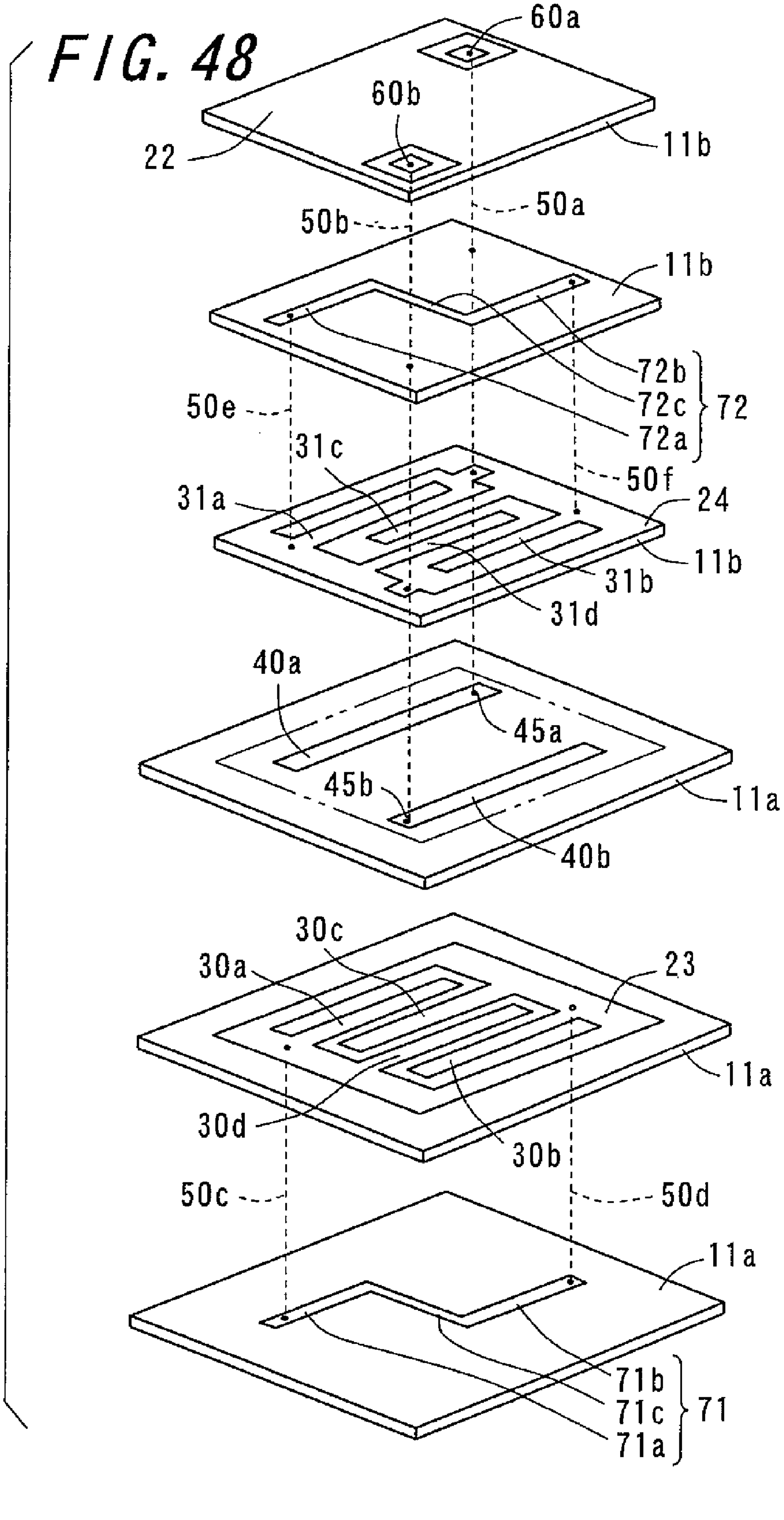
FIG. 48 is a schematic exploded perspective view of the bandpass filter shown in FIG. 47.
Figure 49:
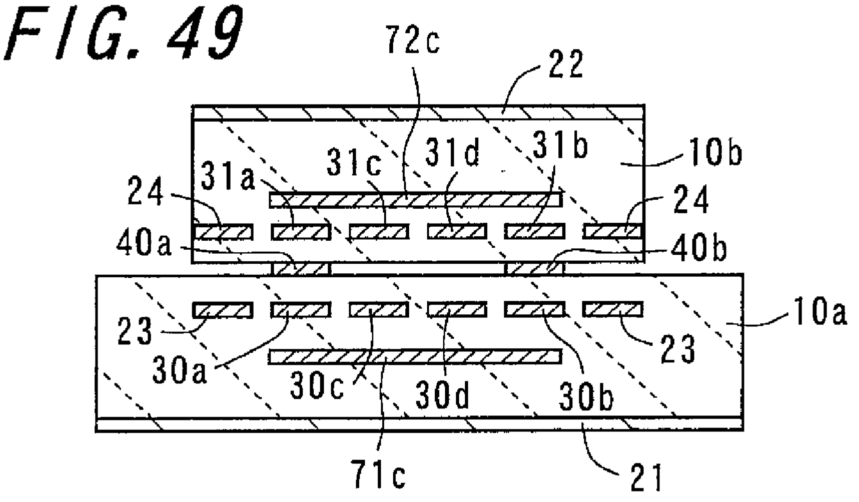
FIG. 49 is a sectional view of the bandpass filter taken along the line V-V' of FIG. 47.

FIG. 47 is an external perspective view schematically showing a bandpass filter in accordance with an eighteenth embodiment of the invention. FIG. 48 is a schematic exploded perspective view of the bandpass filter shown in FIG. 47. FIG. 49 is a sectional view of the bandpass filter taken along the line V-V' of FIG. 47. Note that the following description deals with in what way this embodiment differs from the above-mentioned eleventh embodiment, and the constituent components thereof that play the same or corresponding roles as in the preceding embodiments will be denoted by the same reference numerals and overlapping descriptions will be omitted.

In the bandpass filter of this embodiment, as shown in FIGS. 47 through 49, the multilayer body comprises the first multilayer body 10*a* and the second multilayer body 10*b* placed thereon. The first ground electrode 21 is disposed on the lower face of the first multilayer body 10*a*. The second ground electrode 22 is disposed on the upper face of the second multilayer body 10*b*. The first interlayer bearing the first resonant electrodes 30*a*, 30*b*, 30*c*, and 30*d* and the first annular ground electrode 23, and the fourth interlayer bearing the first resonant electrode coupling conductor 71 are located within the first multilayer body 10*a*. The second interlayer bearing the second resonant electrodes 31*a*, 31*b*, 31*c*, and 31*d* and the second annular ground electrode 24, and the fifth interlayer bearing the second resonant electrode coupling conductor 72 are located within the second multilayer body 10*b*. The third interlayer bearing the input coupling electrode 40*a* and the output coupling electrode 40*b* is located between the first multilayer body 10*a* and the second multilayer body 10*b*. Note that the first multilayer body 10*a* has a stack of a plurality of dielectric layers 11*a* on top of each other, and the second multilayer body 10*b* has a stack of a plurality of dielectric layers 11*b* on top of each other.

According to the bandpass filter of the present embodiment thereby constructed, the region bearing the first resonant electrodes 30*a*, 30*b*, 30*c*, and 30*d* and the region bearing the second resonant electrodes 31*a*, 31*b*, 31*c*, and 31*d* that differ in resonance frequency from each other, are separated into the first and second multilayer bodies 10*a* and 10*b*, by the third interlayer bearing the input coupling electrode 40*a* and the output coupling electrode 40*b* serving as a boundary. In this construction, by designing the dielectric layer constituting the first multilayer body 10*a* and the dielectric layer constituting the second multilayer body 10*b* to have different electrical characteristics, it is possible to obtain desired electrical characteristics with ease. For example, the dielectric constant of the dielectric layer 11*a* constituting the first multilayer body 10*a*, in which are arranged the first resonant electrodes 30*a*, 30*b*, 30*c*, and 30*d* that are made longer than the second resonant electrodes 31*a*, 31*b*, 31*c*, and 31*d* because of having lower resonance frequencies, is set to be higher than the dielectric constant of the dielectric layer 11*b* constituting the second multilayer body 10*b*. This makes it possible to reduce the lengths of, respectively, the first resonant electrodes 30*a*, 30*b*, 30*c*, and 30*d*, and thereby eliminate wasted space inside the bandpass filter with consequent miniaturization of the bandpass filter. Moreover, in the bandpass filter of the present embodiment, there is no need to establish electromagnetic-field coupling between the upper and lower electrode components separated by the third interlayer, which bears the input coupling electrode 40*a* and the output coupling electrode 40*b*, interposed therebetween. Since the third interlayer serves as a boundary to separate the first multilayer body 10*a* and the second multilayer body 10*b*, for example, even if the first multilayer body 10*a* and the second multilayer body 10*b* are positionally displaced with respect to each other, or an air layer exists at the boundary between the first multilayer body 10*a* and the second multilayer body 10*b*, it is possible to keep the risk of consequent deterioration in electrical characteristics to the minimum. Moreover, for example, in a case where the first multilayer body 10*a* is designed as a module substrate for mounting another electronic component or the like on the surface of the region thereof other than the region constituting the bandpass filter, by disposing part of the bandpass filter within the second multilayer body 10*b*, the thickness of the module substrate can be reduced. Accordingly, it is possible to obtain a bandpass filter-equipped substrate in which the module can be made smaller in thickness as a whole.

(Nineteenth Embodiment)

Figure 50:
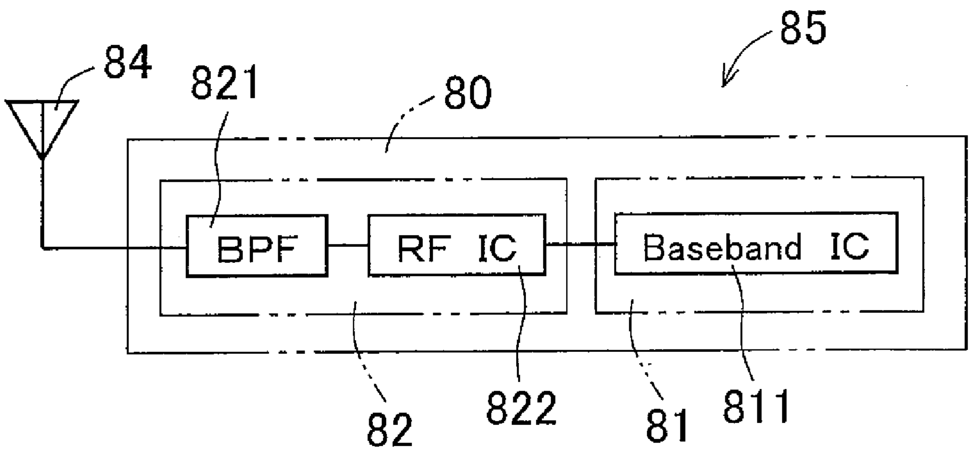
FIG. 50 is a block diagram showing an example of the configuration of a wireless communication module and a wireless communication apparatus which employ the bandpass filter, in accordance with a nineteenth embodiment of the invention.

FIG. 50 is a block diagram showing an example of the configuration of a wireless communication module 80 and a wireless communication apparatus 85 which employ the bandpass filter, in accordance with a nineteenth embodiment of the invention.

For example, the wireless communication module 80 of this embodiment comprises a baseband section 81 for processing a baseband signal and an RF section 82 connected to the baseband section 81, for processing an RF signal which is a consequence of baseband-signal modulation and an RF signal in an undemodulated state as well.

The RF section 82 includes a bandpass filter 821 which is any one of the bandpass filters of the first to eighteenth embodiments thus far described. In the RF section 82, of RF signals resulting from baseband-signal modulation or received RF signals, signals which lie outside the communication band are attenuated by the bandpass filter 821.

More specifically, in this construction, a baseband IC 811 is disposed in the baseband section 81, and, in the RF section 82, an RF IC 822 is so disposed as to lie between the bandpass filter 821 and the baseband section 81. Note that another circuit may be interposed between these circuits.

With the connection of an antenna 84 to the bandpass filter 821 of the wireless communication module 80, the construction of the wireless communication apparatus 85 for RF-signal transmission and reception in accordance with the present embodiment will be completed.

According to the wireless communication module 80 and the wireless communication apparatus 85 of the present embodiment which have any one of the bandpass filters of the first to fifth embodiments, since wave filtering is performed on transmitted signals and received signals with use of the bandpass filter 821 of the present embodiment that incurs little loss of signals passing over the entire region of the communication band, it is possible to reduce the extent of attenuation of transmitted signals and received signals passing through the bandpass filter 821 over the entire region of the communication band. Accordingly, enhancement in reception sensitivity can be achieved, and the degree of amplification of transmitted signals and received signals can be decreased with consequent reduction in power consumption in the amplifier circuit. Moreover, since wave filtering for two frequency bands can be conducted only by a single filter, it is possible to simplify the circuit configuration, as well as to reduce the number of the constituent components. This allows compact and high-performance wireless communication module 80 and wireless communication apparatus 85 that exhibit high reception sensitivity but consume less power to be attained.

According to the wireless communication module 80 and the wireless communication apparatus 85 of the present embodiment which have any one of the bandpass filters of the sixth to tenth embodiments, since wave filtering is performed on transmitted signals and received signals with use of the bandpass filter 821 of the present embodiment that incurs little loss of signals passing with satisfactory input-output impedance matching over the entire regions of two extremely wide communication bands, it is possible to reduce the extent of attenuation of transmitted signals and received signals passing through the bandpass filter 821. Accordingly, enhancement in reception sensitivity can be achieved, and the degree of amplification of transmitted signals and received signals can be decreased with consequent reduction in power consumption in the amplifier circuit. Moreover, since wave filtering for the two frequency bands can be conducted only by a single filter, it is possible to simplify the circuit configuration, as well as to reduce the number of the constituent components. This allows compact and high-performance wireless communication module 80 and wireless communication apparatus 85 that exhibit high reception sensitivity but consume less power to be attained.

According to the wireless communication module 80 and the wireless communication apparatus 85 of the present embodiment which have any one of the bandpass filters of the eleventh to eighteenth embodiments, wave filtering is performed on transmitted signals and received signals with use of the bandpass filter 821 of the present embodiment in which a loss of signals passing over the entire region of a wide pass band can be reduced and sufficient stopband attenuation can be ensured by virtue of the attenuation pole formed in the vicinity of the pass band. This makes it possible to reduce the extent of attenuation of received signals and transmitted signals passing through the bandpass filter 821, as well as to achieve noise reduction. Accordingly, enhancement in reception sensitivity can be achieved, and the degree of amplification of transmitted signals and received signals can be decreased with consequent reduction in power consumption in the amplifier circuit. This allows high-performance wireless communication module 80 and wireless communication apparatus 85 that exhibit high reception sensitivity but consume less power to be attained. Moreover, with the shared use of a single filter between two communication bands, it is possible to attain compact wireless communication module 80 and wireless communication apparatus 85 at low manufacturing cost.

In the bandpass filter embodying the invention, as the materials of construction of the dielectric layers 11, 11*a*, and 11*b*, for example, a resin material such as epoxy resin or a ceramic material such as dielectric ceramic can be used. For example, a glass-ceramic material is desirable for use that is formed of a dielectric ceramic material such as $BaTiO_3$, $Pb_4Fe_2Nb_2O_{12}$, and $TiO_2$ and a glass material such as $B_2O_3$, $SiO_2$, $Al_2O_3$, and ZnO, and can be fired at relatively low temperatures ranging from approximately 800° C. to 1200° C. Moreover, the thickness of the dielectric layer 11 is set to fall in a range of from approximately 0.01 to 0.1 mm, for example.

In the bandpass filter embodying the invention, as the materials of construction of various electrodes and through conductors as described hereinabove, for example, an electrically conductive material made predominantly of a Ag alloy such as Ag, Ag—Pd, and Ag—Pt, a Cu-base conductive material, a W-base conductive material, a Mo-base conductive material, a Pd-base conductive material, and the like are desirable for use. The thickness of each of the electrodes is set to fall in a range of from 0.001 to 0.2 mm, for example.

For example, the bandpass filter embodying the invention can be manufactured as follows. At first, a suitable organic solvent or the like is admixed in the powder of a raw ceramic material to prepare a slurry, and the slurry is shaped into ceramic green sheets by the doctor blade method. Next, the resultant ceramic green sheets are machined by a punching machine or the like to form through holes required for the formation of through conductors, and the through holes are filled with a conductor paste containing a conductor substance such as Ag, Ag—Pd, Au, and Cu. Moreover, a conductor paste similar to the conductor paste described just above is applied to the surfaces of the ceramic green sheets by the printing method thereby to form ceramic green sheets with the conductor paste. Then, these ceramic green sheets with the conductor paste are stacked on top of each other, are bonded together under pressure by using a hot pressing machine, and are fired at a peak temperature as high as approximately 800° C. to 1050° C. In this way, the bandpass filter can be manufactured. Note that, after the first multilayer body 10*a* and the second multilayer body 10*b* are formed separately, the second multilayer body 10*b* may be mounted on the upper face of the first multilayer body 10*a* by means of soldering or otherwise.

(Modified Embodiments)

The invention is not limited to the aforestated first to nineteenth embodiments and is thus susceptible of various changes and modifications without departing from the spirit and scope of the invention.

In the example herein presented by way of the second embodiment, the auxiliary resonant electrodes 32*a* and 32*b* are, just like the input coupling electrode 40*a* and the output coupling electrode 40*b*, arranged on the third interlayer of the multilayer body 10. Moreover, in the example herein presented by way of the third embodiment, the auxiliary resonant electrodes 32*a*, 32*b*, 32*c*, and 32*d* are, just like the input coupling electrode 40*a* and the output coupling electrode 40*b*, arranged on the third interlayer of the multilayer body 10. Alternatively, a pair of the input coupling electrode 40*a* and the output coupling electrode 40*b* and a group of the auxiliary resonant electrodes 32*a*, 32*b*, 32*c*, and 32*d* may be arranged on different interlayers of the multilayer body.

Further, in the example herein presented by way of the second embodiment, the auxiliary resonant electrodes 32*c* and 32*d* are arranged on the interlayer other than that bears the auxiliary resonant electrodes 32*a* and 32*b*. Alternatively, the auxiliary resonant electrodes 32*c* and 32*d* and the auxiliary resonant electrodes 32*a* and 32*b* may be arranged on the same interlayer.

Furthermore, in the examples herein presented by way of the second and fourth embodiments, the auxiliary input coupling electrode 41*a*, the auxiliary output coupling electrode 41*b*, and the second resonant electrodes 31*a*, 31*b*, 31*c*, and 31*d* are each arranged on the second interlayer of the multilayer body 10. Alternatively, a pair of the auxiliary input coupling electrode 41*a* and the auxiliary output coupling electrode 41*b* and a group of the second resonant electrodes 31*a*, 31*b*, 31*c*, and 31*d* may be arranged on different interlayers of the multilayer body.

Furthermore, while, in the examples herein presented by way of the first to eighteenth embodiments, on the lower face of the multilayer body 10 is disposed the first ground electrode 21, and on the upper face of the multilayer body 10 is disposed the second ground electrode 22, it is possible to dispose an extra dielectric layer under the first ground electrode 21, or dispose an extra dielectric layer on the second ground electrode 22.

Further, while, in the examples herein presented by way of the first to tenth embodiments, there are provided four pieces of the first resonant electrodes 30*a*, 30*b*, 30*c*, and 30*d* and four pieces of the second resonant electrodes 31*a*, 31*b*, 31*c*, and 31*d*, it is possible to change the number of the first and second resonant electrodes in accordance with a pass band width and an out-of-pass band attenuation to be required. In a case where the pass band width required is narrow or the out-of-pass band attenuation required is small, the number of the resonant electrodes may be reduced. By contrast, in a case where the pass band width required is wide or the out-of-pass band attenuation required is great, the number of the resonant electrodes may be increased. However, since the placement of an unduly large number of the resonant electrodes leads to an undesirable size increase and a higher loss within the pass band, it is preferable to set each of the number of the first resonant electrodes and the number of the second resonant electrodes at approximately ten or fewer.

Furthermore, while, in the examples herein presented by way of the first to eighteenth embodiments, the first resonant electrodes are equal in number to the second resonant electrodes, the number of the first resonant electrodes may be different from that of the second resonant electrodes. In a case where the number of the first resonant electrodes may be different from that of the second resonant electrodes, the first resonant electrodes and the second resonant electrodes may be so designed as to be different from each other in resonant electrode width and in electrode-to-electrode distance. Specifically, of the first resonant electrodes and the second resonant electrodes, the ones that are smaller in number may be designed to have a greater resonant electrode width and a longer electrode-to-electrode distance.

Furthermore, in the examples herein presented by way of the fifth and eighteenth embodiments, the bandpass filter is separated into the first multilayer body 10*a* and the second multilayer body 10*b* by the third interlayer serving as a boundary. Alternatively, as circumstances demand, the bandpass filter may be separated into the first multilayer body 10*a* and the second multilayer body 10*b* by an interlayer other than the third interlayer, and also, the bandpass filter may be separated into a large number of multilayer bodies.

For example, while, in the examples herein presented by way of the sixth to tenth embodiments, the input terminal electrode 60*a* and the output terminal electrode 60*b* are provided, they do not necessarily have to be provided in a case where the bandpass filter is formed in one region within the module substrate, and in the module substrate, the wiring conductor routed over the external circuit may be connected directly to the composite input coupling electrode 140*a* and the composite output coupling electrode 140*b*. In this case, a point of connection between the composite input coupling electrode 140*a* and the wiring conductor and a point of connection between the composite output coupling electrode 140*b* and the wiring conductor correspond to the electric signal input point 45*a* of the composite input coupling electrode 140*a* and the electric signal output point 45*b* of the composite output coupling electrode 140*b*, respectively. Moreover, in the module substrate, the wiring conductor routed over the external circuit may be connected directly to the auxiliary input coupling electrode 46*a* and the auxiliary output coupling electrode 46*b*.

Further, in the example herein presented by way of the seventh embodiment, the auxiliary resonant electrodes 32*a* and 32*b* are, just like the first input coupling electrode 141*a* and the first output coupling electrode 141*b*, arranged on the third interlayer of the multilayer body 10, and, in the examples herein presented by way of the eighth and ninth embodiments, the auxiliary resonant electrodes 32*a*, 32*b*, 32*c*, and 32*d* are, just like the first input coupling electrode 141*a* and the first output coupling electrode 141*b*, arranged on the third interlayer of the multilayer body 10. Alternatively, a pair of the first input coupling electrode 141*a* and the first output coupling electrode 141*b* and a group of the auxiliary resonant electrodes 32*a*, 32*b*, 32*c*, and 32*d* may be arranged on different interlayers of the multilayer body.

Further, in the examples herein presented by way of the seventh to ninth embodiments, the auxiliary input coupling electrode 46*a* and the auxiliary output coupling electrode 46*b* are, just like the second input coupling electrode 142*a* and the second output coupling electrode 142*b*, arranged on the fourth interlayer. Alternatively, a pair of the auxiliary input coupling electrode 46*a* and the auxiliary output coupling electrode 46*b* and a pair of the second input coupling electrode 142*a* and the second output coupling electrode 142*b* may be arranged on different interlayers of the multilayer body.

Furthermore, in the examples herein presented by way of the seventh to ninth embodiments, the auxiliary input coupling electrode 46*a* and the auxiliary output coupling electrode 46*b* are connected to the first input coupling electrode 141*a* and the first output coupling electrode 41*b*, respectively, via the through conductor 52*a* and the through conductor 52*b*, respectively. Alternatively, for example, the auxiliary input coupling electrode 46*a* may be connected directly to the second input coupling electrode 142*a*, and the auxiliary output coupling electrode 46*b* may be connected directly to the second output coupling electrode 142*b*.

Furthermore, in the example herein presented by way of the tenth embodiment, the bandpass filter is separate into the first multilayer body 10*a* and the second multilayer body 10*b* by the third interlayer serving as a boundary. Alternatively, the bandpass filter may be separated into the first multilayer body 10*a* and the second multilayer body 10*b* by the fourth interlayer serving as a boundary. even in this case, it is possible to obtain substantially the same effects. Moreover, as circumstances demand, the bandpass filter may be separated into the first multilayer body 10*a* and the second multilayer body 10*b* by another interlayer, and also, the bandpass filter may be separated into a large number of multilayer bodies.

For example, while, in the examples herein presented by way of the eleventh to eighteenth embodiments, both of the first resonant electrode coupling conductor 71 and the second resonant electrode coupling conductor 72 are provided, it is also possible to provide only one of the first resonant electrode coupling conductor 71 and the second resonant electrode coupling conductor 72. In the case of providing the first resonant electrode coupling conductor 71 alone, an attenuation pole can be formed in the regions near both sides with respect to the pass band formed by the first resonant electrodes. In the case of providing the second resonant electrode coupling conductor 72 alone, an attenuation pole can be formed in the regions near both sides with respect to the pass band formed by the second resonant electrodes.

Further, in the examples herein presented by way of the eleventh to eighteenth embodiments, the first resonant electrode coupling conductor 71 has its opposite ends connected to the first annular ground electrode 23 close to one end of the frontmost-stage first resonant electrode and the first annular ground electrode 23 close to one end of the rearmost-stage first resonant electrode, respectively, that constitute the first resonant electrode group via the through conductor 50*c* and the through conductor 50*d*, respectively. Moreover, the second resonant electrode coupling conductor 72 has its opposite ends connected to the second annular ground electrode 24 close to one end of the frontmost-stage second resonant electrode and the second annular ground electrode 24 close to one end of the rearmost-stage second resonant electrode, respectively, that constitute the second resonant electrode group via the through conductor 50*e* and the through conductor 50*f*, respectively. Alternatively, for example, the first resonant electrode coupling conductor 71 may be designed to have its opposite ends connected to the first ground electrode 21 via the through conductor 50*c* and the through conductor 50*d*, respectively, and also the second resonant electrode coupling conductor 72 may be designed to have its opposite ends connected to the second ground electrode 22 via the through conductor 50*e* and the through conductor 50*f*, respectively. Moreover, for example, it is possible to dispose an annular ground conductor around each of the first resonant electrode coupling conductor 71 and the second resonant electrode coupling conductor 72 and connect the opposite ends of the first resonant electrode coupling conductor 71 and those of the second resonant electrode coupling conductor 72 to their respective annular ground conductors. However, such an alternative method may be not so preferable when it is desired to bring the attenuation pole arising on both sides with respect to the pass band closer to the pass band.

Further, while, in the examples herein presented by way of the first to fifth embodiments and the eleventh to eighteenth embodiments, the input terminal electrode 60*a* and the output terminal electrode 60*b* are provided, they do not necessarily have to be provided in a case where the bandpass filter is formed in one region within the module substrate, and in the module substrate, the wiring conductor routed over the external circuit may be connected directly to the input coupling electrode 40*a* and the output coupling electrode 40*b*. In this case, a point of connection between the input coupling electrode 40*a* and the wiring conductor routed over the external circuit and a point of connection between the output coupling electrode 40*b* and the wiring conductor correspond to the electric signal input point 45*a* of the input coupling electrode 40*a* and the electric signal output point 45*b* of the output coupling electrode 40*b*, respectively. Moreover, in the module substrate, the wiring conductor routed over the external circuit may be connected directly to the auxiliary input coupling electrode 46*a* and the auxiliary output coupling electrode 46*b*.

Furthermore, in the examples herein presented by way of the twelfth and thirteenth embodiments, the auxiliary resonant electrodes 32*a* and 32*b* are, just like the input coupling electrode 40*a* and the output coupling electrode 40*b*, arranged on the third interlayer of the multilayer body 10, and, in the example herein presented by way of the fourteenth embodiment, the auxiliary resonant electrodes 32*a*, 32*b*, 32*c*, and 32*d* are, just like the input coupling electrode 40*a* and the output coupling electrode 40*b*, arranged on the third interlayer of the multilayer body 10. Alternatively, a pair of the input coupling electrode 40*a* and the output coupling electrode 40*b* and a group of the auxiliary resonant electrodes 32*a*, 32*b*, 32*c*, and 32*d* may be arranged on different interlayers of the multilayer body.

Furthermore, in the examples herein presented by way of the twelfth to fourteenth embodiments, the auxiliary input coupling electrode 46*a*, the auxiliary output coupling electrode 46*b*, and the second resonant electrodes 31*a*, 31*b*, 31*c*, and 31*d* are each arranged on the second interlayer of the multilayer body 10. Alternatively, a pair of the auxiliary input coupling electrode 46*a* and the auxiliary output coupling electrode 46*b* and a group of the second resonant electrodes 31*a*, 31*b*, 31*c*, and 31*d* may be arranged on different interlayers of the multilayer body.

Furthermore, while, in the examples herein presented by way of the eleventh to eighteenth embodiments, the number of the first resonant electrodes and the number of the second resonant electrodes are each set at four or six, it is possible to increase the number of the resonant electrodes in accordance with the pass band width and the out-of-pass band attenuation to be required. However, since the placement of an unduly large number of the resonant electrodes leads to an undesirable size increase and a higher loss within the pass band, it is preferable to set each of the number of the first resonant electrodes and the number of the second resonant electrodes at approximately ten or fewer.

Furthermore, in the aforestated eleventh to eighteenth embodiments, the sum of the resonant electrodes constituting the resonant electrode group needs to be an even number greater than or equal to four. For example, in a case where the sum of the resonant electrodes constituting the resonant electrode group is an odd number, even if inductive coupling can be established between the frontmost-stage resonant electrode and the rearmost-stage second resonant electrode of the resonant electrode group by the resonant electrode coupling conductor, inconveniently, the mutual cancellation phenomenon, which results from a phase difference of 180° between a signal transmitted through the inductive coupling established by the resonant electrode coupling conductor and a signal transmitted through the capacitive coupling established between the adjacent resonant electrodes, will occur only on the higher-frequency side with respect to the pass band for the bandpass filter. Therefore, in terms of the bandpass characteristics of the bandpass filter, an attenuation pole cannot be formed in each of the regions near both sides with respect to the pass band. Furthermore, in a case where the number of the resonant electrodes constituting the resonant electrode group is two, even if the resonant electrodes can be connected to each other by the resonant electrode coupling conductor, the consequent effect is only the formation of LC parallel resonant circuit based on the inductive coupling and capacitive coupling between the resonant electrodes. In the end, there is formed only one attenuation pole, and it is thus impossible to form an attenuation pole in each of the regions near both sides with respect to the pass band.

Furthermore, while, in the examples herein presented by way of, the first, second, fourth to seventh, ninth, and tenth embodiments, the first resonant electrodes 30*a*, 30*b*, 30*c*, and 30*d* are juxtaposed, with one ends as well as the other ends thereof displaced in relation to each other in a staggered manner for interdigital form coupling, and so are the second resonant electrodes 31*a*, 31*b*, 31*c*, and 31*d*, the invention is not so limited. That is, just like the third and eighth embodiments, the first resonant electrodes 30*a*, 30*b*, 30*c*, and 30*d*, as well as the second resonant electrodes 31*a*, 31*b*, 31*c*, and 31*d*, may be arranged with a combination of comb-line form coupling and interdigital form coupling. Moreover, the first resonant electrodes 30*a*, 30*b*, 30*c*, and 30*d*, as well as the second resonant electrodes 31*a*, 31*b*, 31*c*, and 31*d*, may be arranged with their one ends located on the same side so that all of the resonant electrodes make electromagnetic-field coupling with each other in a comb-line form. Note that, in the case of effecting electromagnetic-field coupling in a comb-line form, due consideration must be given to obtain electromagnetic-field coupling of a strength required. For example, the spacing between the resonators is made narrower compared to the case of effecting electromagnetic-field coupling in an interdigital form.

Furthermore, although the above description deals with the examples of the bandpass filter for use in the UWB, it is needless to say that the bandpass filter of the invention will find another applications in which wideband characteristics are required.

EXAMPLES

Now, the specific examples of the bandpass filter pursuant to the invention will be described.

Example 1

The electrical characteristics of the bandpass filter of the second embodiment shown in FIGS. 5 to 8 have been determined by calculation in finite element simulation.

The following are conditions for calculation: the first resonant electrodes 30*a*, 30*b*, 30*c*, and 30*d* are each 0.2 mm in width and 3.5 mm in length; the spacing between the first resonant electrode 30*a* and the first resonant electrode 30*c* and the spacing between the first resonant electrode 30*d* and the first resonant electrode 30*b* are each 0.27 mm; the spacing between the first resonant electrode 30*c* and the first resonant electrode 30*d* is 0.23 mm; the second resonant electrodes 31*a*, 31*b*, 31*c*, and 31*d* are each 0.23 mm in width and 2.9 mm in length; the spacing between the second resonant electrode 31*a* and the second resonant electrode 31*c* and the spacing between the second resonant electrode 31*d* and the second resonant electrode 31*b* are each 0.1 mm; the spacing between the second resonant electrode 31*c* and the second resonant electrode 31*d* is 0.12 mm; the input coupling electrode 40*a*, the auxiliary input coupling electrode 41*a*, the output coupling electrode 40*b*, and the auxiliary output coupling electrode 41*b* are each 0.26 mm in width; the auxiliary resonant electrode 32*a*, 32*b* is shaped by bonding together a rectangular portion of 0.45 mm in width and 0.34 mm in length spaced by 0.2 mm away from the other end of the first resonant electrode 30*a*, 30*b* and a rectangular portion of 0.2 mm in width and 0.5 mm in length extending therefrom in the direction of the first resonant electrode 30*a*, 30*b*; the auxiliary resonant electrode 32*c*, 32*d* is shaped by bonding together a rectangular portion of 0.5 mm in width and 0.35 mm in length spaced by 0.2 mm away from the other end of the first resonant electrode 30*c*, 30*d* and a rectangular portion of 0.2 mm in width and 0.5 mm in length extending therefrom in the direction of the first resonant electrode 30*c*, 30*d*; the input terminal electrode 60*a* and the output terminal electrode 60*b* each have the shape of a square 0.3 mm on a side, and the distance to the second ground electrode 22 is 0.2 mm; the outer dimension of each of the first ground electrode 21, the second ground electrode 22, the first annular ground electrode 23, and the second annular ground electrode 24 is 4 mm in width and 5 mm in length; the opening of the first annular ground electrode 23 is 3.4 mm in width and 3.65 mm in length; the opening of the second annular ground electrode 24 is 3.4 mm in width and 3.05 mm in length; the overall dimension of the bans-pass filter is 4 mm in width, 5 mm in length, and 0.975 mm in thickness, and the third interlayer is located at the center of the bans-pass filter in its thickness direction; where the first to third interlayers and the interlayer A are concerned, the spacing between the adjacent interlayers (the spacing between the electrodes placed on adjacent different interlayers) is 0.065 mm; the thickness of each of the electrodes is 0.01 mm; the diameter of each of the through conductors is 0.1 mm; and the specific dielectric constant of the dielectric layer 11 is 9.45.

Figure 51:
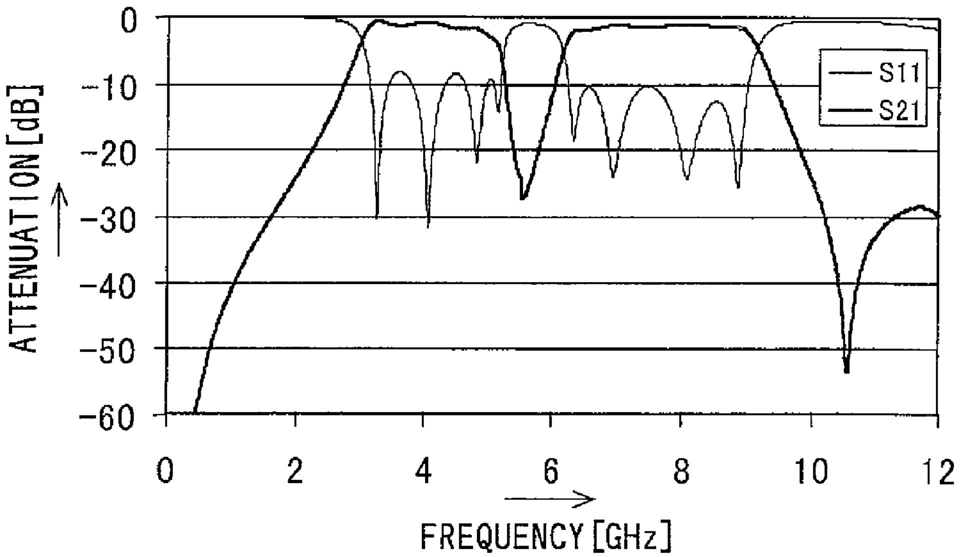
FIG. 51 is a graph showing a simulation result of electrical characteristics of the bandpass filter of the invention.

FIG. 51 is a graph showing the result of the simulation. In the graph, the abscissa axis represents frequencies and the ordinate axis represents attenuations, and the bandpass characteristics (S21) and the reflection characteristics (S11) of the bandpass filter ate indicated. According to the graph shown in FIG. 51, in each of two pass bands, it is possible to obtain the characteristics of achieving loss reduction over the entire region of an extremely wide pass band of approximately 40% to 50% in terms of fractional bandwidth, which is far in excess of the levels that are realizable by conventional quarter-wavelength resonator-using filters. It will be seen from this result that the bandpass filter of the invention succeeded in providing, in each of the two pass bands, excellent bandpass characteristics of achieving flatness and loss reduction over the entire region of a wide pass band, and thus the usefulness of the invention has been proven.

Example 2

The electrical characteristics of the bandpass filter of the seventh embodiment shown in FIGS. 19 to 22 have been determined by calculation in finite element simulation.

The following are conditions for calculation: the plurality of first resonant electrodes 30*a*, 30*b*, 30*c*, and 30*d* each have the shape of a rectangle which is 0.15 mm in width and 3.4 mm in length; the spacing between the first resonant electrode 30*a* and the first resonant electrode 30*c* and the spacing between the first resonant electrode 30*d* and the first resonant electrode 30*b* are each 0.20 mm; the spacing between the first resonant electrode 30*c* and the first resonant electrode 30*d* is 0.235 mm; the plurality of second resonant electrodes 31*a*, 31*b*, 31*c*, and 31*d* each have the shape of a rectangle which is 0.18 mm in width and 2.8 mm in length; the spacing between the second resonant electrode 31*a* and the second resonant electrode 31*c* and the spacing between the second resonant electrode 31*d* and the output-stage second resonant electrode 31*b* are each 0.16 mm; the spacing between the second resonant electrode 31*c* and the second resonant electrode 31*d* is 0.175 mm; the auxiliary resonant electrode 32*a*, 32*b*, 32*c*, 32*d* is shaped by bonding together a rectangular portion of 0.4 mm in width and 0.45 mm in length spaced by 0.2 mm away from the other end of the first resonant electrode 30*a*, 30*b*, 30*c*, 30*d* and a rectangular portion of 0.2 mm in width and 0.5 mm in length extending therefrom in the direction of the first resonant electrode 30*a*, 30*b*, 30*c*; the first input coupling electrode 141*a* and the first output coupling electrode 141*b* each have the shape of a rectangle which is 0.15 mm in width and 3.5 mm in length; the second input coupling electrode 142*a* and the second output coupling electrode 142*b* each have the shape of a rectangle which is 0.15 mm in width and 2.5 mm in length; the input-side connection conductor 143*a* and the input-side auxiliary connection conductor 144*a* are spaced by 0.1 mm away from the opposite ends, respectively, of the region where the first input coupling electrode 141*a* and the second input coupling electrode 142*a* face each other; the output-side connection conductor 143*b* and the output-side auxiliary connection conductor 144*b* are spaced by 0.1 mm away from the opposite ends, respectively, of the region where the first output coupling electrode 141*b* and the second output coupling electrode 142*b* face each other; the auxiliary input coupling electrode 46*a* and the auxiliary output coupling electrode 46*b* each have the shape of a rectangle which is 0.15 mm in width and 1.2 mm in length; the input terminal electrode 60*a* and the output terminal electrode 60*b* each have the shape of a square 0.3 mm on a side, and the distance to the second ground electrode 22 is 0.2 mm; the outer dimension of each of the first ground electrode 21, the second ground electrode 22, the first annular ground electrode 23, and the second annular ground electrode 24 is 3 mm in width and 5 mm in length; the opening of the first annular ground electrode 23 is 2.4 mm in width and 3.65 mm in length; the opening of the second annular ground electrode 24 is 2.4 mm in width and 2.85 mm in length; the overall dimension of the bans-pass filter is 3 mm in width, 5 mm in length, and 0.975 mm in thickness, and the third and fourth interlayers are located at the center of the bans-pass filter in its thickness direction; where the first to fourth interlayers and the interlayer A are concerned, the spacing between the adjacent interlayers (the spacing between the electrodes placed on adjacent different interlayers) is 0.065 mm; the thickness of each of the electrodes is 0.01 mm; the diameter of each of the through conductors is 0.1 mm; and the specific dielectric constant of the dielectric layer 11 is 9.45.

Figure 52:
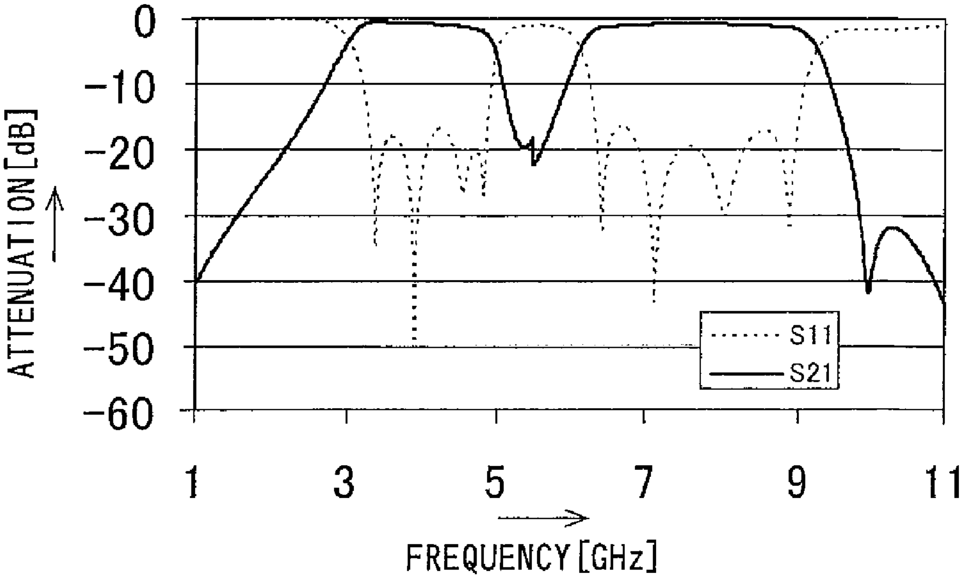
FIG. 52 is a graph showing a simulation result of electrical characteristics of the bandpass filter of the invention.

FIG. 52 is a graph showing the result of the simulation. In the graph, the abscissa axis represents frequencies and the ordinate axis represents attenuations, and the bandpass characteristics (S21) and the reflection characteristics (S11) of the bandpass filter are indicated.

In comparison with the graph shown in FIG. 51 for indicating the simulation result as to the electrical characteristics of the bandpass filter of the seventh embodiment shown in FIGS. 19 to 22, according to the graph shown in FIG. 52, in the entire regions of-two extremely wide pass bands ranging approximately from 40% to 50% in terms of fractional bandwidth, an attenuation of greater than −20 dB can be ensured in the characteristics S11, and input-output impedance matching can be achieved more excellently. This makes it possible to obtain bandpass characteristics of achieving further flatness and loss reduction with little increase in insertion loss even at a frequency falling between the resonance frequencies in the respective resonant modes of the pass band. It will be seen from this result that the bandpass filter of the invention succeeded in providing, in each of the two pass bands, excellent bandpass characteristics of achieving flatness and loss reduction with satisfactory input-output impedance matching over the entire region of a wide pass band, and thus the usefulness of the invention has been proven.

Example 3

The electrical characteristics of the bandpass filter of the twelfth embodiment shown in FIGS. 33 to 36 have been determined by calculation in finite element simulation.

The following are conditions for calculation: the plurality of first resonant electrodes 30*a*, 30*b*, 30*c*, and 30*d* each have the shape of a rectangle which is 0.15 mm in width and 3.5 mm in length; the spacing between the input-stage first resonant electrode 30*a* and the first resonant electrode 30*c* and the spacing between the first resonant electrode 30*d* and the output-stage first resonant electrode 30*b* are each 0.27 mm; the spacing between the first resonant electrode 30*c* and the first resonant electrode 30*d* is 0.18 mm; the plurality of second resonant electrodes 31*a*, 31*b*, 31*c*, and 31*d* each have the shape of a rectangle which is 0.2 mm in width and 2.5 mm in length; the spacing between the input-stage second resonant electrode 31*a* and the second resonant electrode 31*c* and the spacing between the second resonant electrode 31*d* and the output-stage second resonant electrode 31*b* are each 0.1 mm; the spacing between the second resonant electrode 31*c* and the second resonant electrode 31*d* is 0.1 mm; the input-stage auxiliary resonant electrode 32*a* is shaped by bonding together a rectangular portion of 0.45 mm in width and 0.41 mm in length spaced by 0.2 mm away from the other end of the input-stage first resonant electrode 30*a* and a rectangular portion of 0.2 mm in width and 0.42 mm, in length extending therefrom in the direction of the input-stage first resonant electrode 30*a*, and the output-stage auxiliary resonant electrode 32*b* is shaped by bonding together a rectangular portion of 0.45 mm in width and 0.41 mm in length spaced by 0.2 mm away from the other end of the output-stage first resonant electrode 30*b* and a rectangular portion of 0.2 mm in width and 0.42 mm in length extending therefrom in the direction of the output-stage first resonant electrode 30*b*; the auxiliary resonant electrode 32*c*, 32*d* is shaped by bonding together a rectangular portion of 0.5 mm in width and 0.42 mm in length spaced by 0.2 mm away from the other end of the first resonant electrode 30*c*, 30*d* and a rectangular portion of 0.2 mm in width and 0.5 mm in length extending therefrom in the direction of the first resonant electrode 30*c*, 30*d*; the resonant coupling auxiliary electrodes 35*a* and 35*b* each have the shape of a rectangle which is 0.2 mm in width and 0.42 mm in length; the input coupling electrode 40*a* and the output coupling electrode 40*b* each have the shape of a rectangle which is 0.24 mm in width and 3.1 mm in length; the auxiliary input coupling electrode 46*a* and the auxiliary output coupling electrode 46*b* each have the shape of a rectangle which is 0.24 mm in width and 1.1 mm in length; the first front-stage side coupling region 71*a* and the first rear-stage side coupling region 71*b* each have the shape of a rectangle which is 0.1 mm in width and 2.08 mm in length; the first connection region 71*c* has the shape of a rectangle which is 0.1 mm in width and 1.02 mm in length; the second front-stage side coupling region 72*a* and the second rear-stage side coupling region 72*b* each have the shape of a rectangle which is 0.2 mm in width and 1.78 mm in length; the second connection region 72*c* has the shape of a rectangle which is 0.1 mm in width and 0.7 mm in length; the input terminal electrode 60*a* and the output terminal electrode 60*b* each have the shape of a square 0.3 mm on a side, and the distance to the second ground electrode 22 is 0.2 mm; the outer dimension of each of the first ground electrode 21, the second ground electrode 22, the first annular ground electrode 23, and the second annular ground electrode 24 is 3 mm in width and 5 mm in length; the opening of the first annular ground electrode 23 is 2.4 mm in width and 3.65 mm in length; the opening of the second annular ground electrode 24 is 2.4 mm in width and 3.05 mm in length; the overall dimension of the bans-pass filter in a rectangular parallelepiped shape is 3 mm in width, 5 mm in length, and 0.975 mm in thickness, and the third interlayer is located at the center of the bans-pass filter in its thickness direction; where the first to third interlayers and the interlayer A are concerned, the spacing between the adjacent interlayers (the spacing between the electrodes placed on adjacent different interlayers) is 0.065 mm; the thickness of each of the electrodes is 0.01 mm; the diameter of each of the through conductors is 0.1 mm; and the specific dielectric constant of the dielectric layer 11 is 9.45.

Figure 53:
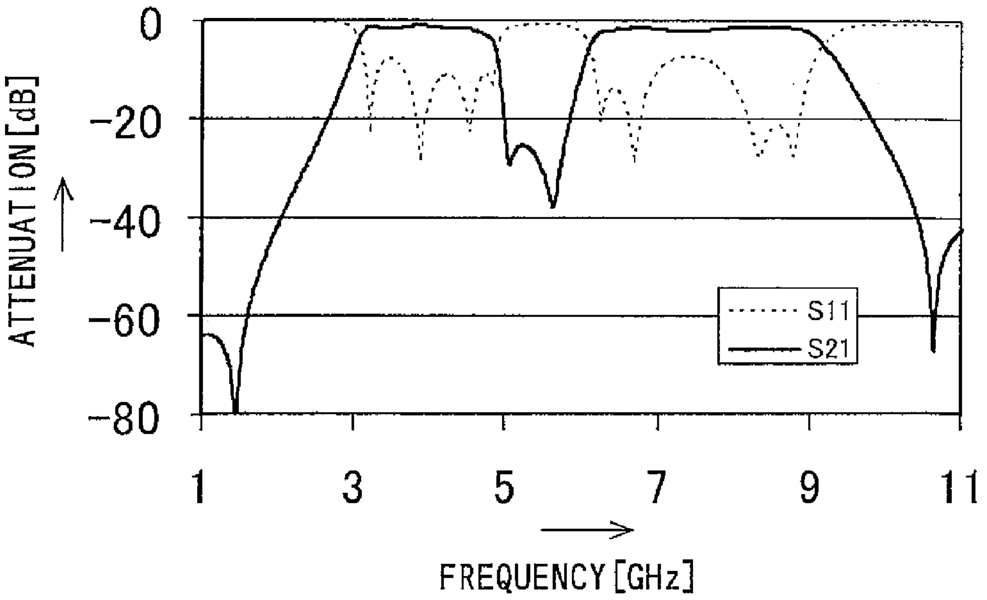
FIG. 53 is a graph showing a simulation result of electrical characteristics of the bandpass filter of the invention.

FIG. 53 is a graph showing the result of the simulation. In the graph, the abscissa axis represents frequencies and the ordinate axis represents attenuations, and the bandpass characteristics (S21) and the reflection characteristics (S11) of the bandpass filter are indicated. According to the graph shown in FIG. 53, in each of the two pass bands, it is possible to obtain excellent characteristics of achieving loss reduction over the entire region of an extremely wide pass band of approximately 40% to 50% in terms of fractional bandwidth while forming an attenuation pole in each of the regions near both sides with respect to the pass band so as to produce a sharp attenuation change in a region from the pass band to the stop band. It will be seen from this result that the bandpass filter of the invention succeeded in providing, in each of the two pass bands, excellent bandpass characteristics of achieving loss reduction over the entire region of a wide pass band while producing a sharp attenuation change in a region from the pass band to the stop band, and thus the usefulness of the invention has been proven.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

The invention claimed is:

1. A bandpass filter comprising:

a multilayer body having a stack of a plurality of dielectric layers on top of each other;

a first ground electrode which is disposed on a lower face of the multilayer body and is connected to a ground potential;

a second ground electrode which is disposed on an upper face of the multilayer body and is connected to a ground potential;

a plurality of strip-like first resonant electrodes which are arranged side by side on a first interlayer of the multilayer body for mutual electromagnetic-field coupling, with their one ends connected to a ground potential so as to serve as a quarter-wavelength resonator;

a plurality of strip-like second resonant electrodes which are arranged side by side on a second interlayer of the multilayer body different from the first interlayer for mutual electromagnetic-field coupling, with their one ends connected to a ground potential so as to serve as a quarter-wavelength resonator which resonates at a frequency higher than a frequency at which the first resonant electrode resonates;

a strip-like input coupling electrode which is disposed on a third interlayer of the multilayer body located between the first interlayer and the second interlayer, faces an input-stage first resonant electrode of the plurality of first resonant electrodes, over more than half of an entire longitudinal area thereof for electromagnetic-field coupling, faces an input-stage second resonant electrode of the plurality of second resonant electrodes, over more than half of an entire longitudinal area thereof for electromagnetic-field coupling, and has an electric signal input point for receiving input of an electric signal from an external circuit; and a strip-like output coupling electrode which is disposed on the third interlayer of the multilayer body, faces an output-stage first resonant electrode of the plurality of first resonant electrodes, over more than half of an entire longitudinal area thereof for electromagnetic-field coupling, faces an output-stage second resonant electrode of the plurality of second resonant electrodes, over more than half of an entire longitudinal area thereof for electromagnetic-field coupling, and has an electric signal output point for producing output of an electric signal toward the external circuit, the one end of the input-stage first resonant electrode and the one end of the input-stage second resonant electrode being located on a same side, the one end of the output-stage first resonant electrode and one end of the output-stage second resonant electrode being located on a same side, in the input coupling electrode as seen in its longitudinal direction, the electric signal input point being disposed at a part that lies nearer the other end of the input-stage first resonant electrode than a center of a part facing the input-stage first resonant electrode and also lies nearer the other end of the input-stage second resonant electrode than a center of a part facing the input-stage second resonant electrode, and in the output coupling electrode as seen in its longitudinal direction, the electric signal output point being disposed at a part that lies nearer the other end of the output-stage first resonant electrode than a center of a part facing the output-stage first resonant electrode and also lies nearer the other end of the output-stage second resonant electrode than a center of a part facing the output-stage second resonant electrode.

2. The bandpass filter of claim 1, wherein the plurality of first resonant electrodes are arranged side by side, with their one ends as well as the other ends displaced in relation to each other in a staggered manner, and wherein the plurality of second resonant electrodes are arranged side by side, with their one ends as well as the other ends displaced in relation to each other in a staggered manner.

3. The bandpass filter of claim 1, further comprising:

a first annular ground electrode which is formed in an annular shape on the first interlayer so as to surround the plurality of first resonant electrodes, is connected with the one ends of, respectively, the plurality of first resonant electrodes, and is connected to a ground potential; and a second annular ground electrode which is formed in an annular shape on the second interlayer so as to surround the plurality of second resonant electrodes, is connected with the one ends of, respectively, the plurality of second resonant electrodes, and is connected to a ground potential.

4. The bandpass filter of claim 3, further comprising:

auxiliary resonant electrodes arranged on an interlayer other than the first interlayer of the multilayer body in correspondence with the plurality of first resonant electrodes, respectively, of which each is so placed as to have a region facing the first annular ground electrode and a region facing the first resonant electrode, the region facing the first resonant electrode being connected to the other end side of the first resonant electrode by a first through conductor passing all the way through the dielectric layer located between the first resonant electrode-facing region and the first resonant electrode.

5. The bandpass filter of claim 4, wherein the auxiliary resonant electrode connected to the input-stage first resonant electrode and the auxiliary resonant electrode connected to the output-stage first resonant electrode are arranged on an interlayer located on the same side as the third interlayer with respect to the first interlayer of the multilayer body, the bandpass filter further comprising:

an auxiliary input coupling electrode disposed on an interlayer other than the first interlayer, the third interlayer, and the interlayer bearing the auxiliary resonant electrode connected to the input-stage first resonant electrode of the multilayer body, so as to have a region facing the auxiliary resonant electrode connected to the input-stage first resonant electrode and a region facing the input coupling electrode, the region facing the input coupling electrode being connected to a part of the input coupling electrode, as seen in its longitudinal direction, which lies nearer the other end of the input-stage first resonant electrode than the center of the part facing the input-stage first resonant electrode and also lies nearer the other end of the input-stage second resonant electrode than the center of the part facing the input-stage second resonant electrode, by a second through conductor passing all the way through the dielectric layer located between the input coupling electrode-facing region and the input coupling electrode; and an auxiliary output coupling electrode disposed on an interlayer other than the first interlayer, the third interlayer, and the interlayer bearing the auxiliary resonant electrode connected to the output-stage first resonant electrode of the multilayer body, so as to have a region facing the auxiliary resonant electrode connected to the output-stage first resonant electrode and a region facing the output coupling electrode, the region facing the output coupling electrode being connected to a part of the output coupling electrode, as seen in a longitudinal direction, which lies nearer the other end of the output-stage first resonant electrode than the center of the part facing the output-stage first resonant electrode and also lies nearer the other end of the output-stage second resonant electrode than the center of the part facing the output-stage second resonant electrode, by a third through conductor passing all the way through the dielectric layer located between the output coupling electrode-facing region and the output coupling electrode.

6. The bandpass filter of claim 5, further comprising:

an input-side auxiliary coupling resonant electrode disposed on an interlayer other than the second interlayer and the interlayer bearing the auxiliary input coupling electrode of the multilayer body, so as to have a region facing, the input-stage second resonant electrode and a region facing the auxiliary input coupling electrode, the region facing the input-stage second resonant electrode being connected to the other end side of the input-stage second resonant electrode by a fourth through conductor passing all the way through the dielectric layer located between the input-stage second resonant electrode-facing region and the input-stage second resonant electrode; and an output-side auxiliary coupling resonant electrode disposed on an interlayer other than the second interlayer and the interlayer bearing the auxiliary output coupling electrode of the multilayer body, so as to have a region facing, the output-stage second resonant electrode and a region facing the auxiliary output coupling electrode, the region facing the output-stage second resonant electrode being connected to the other end side of the output-stage second resonant electrode by a fifth through conductor passing all the way through the dielectric layer located between the output-stage second resonant electrode-facing region and the output-stage second resonant electrode.

7. The bandpass filter of claim 1, wherein the multilayer body comprises a first multilayer body and a second multilayer body placed thereon, and the first ground electrode is disposed on a lower face of the first multilayer body and the second ground electrode is disposed on an upper face of the second multilayer body, and wherein the first interlayer and the second interlayer are separately located in the first multilayer body and the second multilayer body, and the third interlayer is located between the first multilayer body and the second multilayer body.

8. A wireless communication module comprising an RF section including the bandpass filter of claim 1; a baseband section connected to the RF section.

9. A wireless communication apparatus comprising an RF section including the bandpass filter of claim 1; a baseband section connected to the RF section; and an antenna connected to the RF section.

10. A bandpass filter comprising:

a multilayer body having a stack of a plurality of dielectric layers on top of each other;

a first ground electrode disposed on a lower face of the multilayer body;

a second ground electrode disposed on an upper face of the multilayer body;

a plurality of strip-like first resonant electrodes which are arranged side by side on a first interlayer of the multilayer body for mutual electromagnetic-field coupling, with their one ends connected to ground so as to serve as a quarter-wavelength resonator;

a plurality of strip-like second resonant electrodes which are arranged side by side on a second interlayer of the multilayer body different from the first interlayer for mutual electromagnetic-field coupling, with their one ends connected to ground so as to serve as a quarter-wavelength resonator which resonates at a frequency higher than a frequency at which the first resonant electrode resonates;

a composite input coupling electrode including a strip-like first input coupling electrode which is disposed on a third interlayer of the multilayer body located between the first interlayer and the second interlayer, and faces an input-stage first resonant electrode of the plurality of first resonant electrodes, over more than half of an entire longitudinal area thereof; a strip-like second input coupling electrode which is disposed on a fourth interlayer of the multilayer body located between the second interlayer and the third interlayer, and faces an input-stage second resonant electrode of the plurality of second resonant electrodes, over more than half of an entire longitudinal area thereof; and an input-side connection conductor for providing connection between the first input coupling electrode and the second input coupling electrode, the composite input coupling electrode making electromagnetic-field coupling with the input-stage first resonant electrode and the input-stage second resonant electrode, and having an electric signal input point for receiving input of an electric signal from an external circuit; and a composite output coupling electrode including a strip-like first output coupling electrode which is disposed on the third interlayer of the multilayer body, and faces an output-stage first resonant electrode of the plurality of first resonant electrodes, over more than half of an entire longitudinal area thereof; a strip-like second output coupling electrode which is disposed on the fourth interlayer of the multilayer body, and faces an output-stage second resonant electrode of the plurality of second resonant electrodes, over more than half of an entire longitudinal area thereof; and an output-side connection conductor for providing connection between the first output coupling electrode and the second output coupling electrode, the composite output coupling electrode making electromagnetic-field coupling with the output-stage first resonant electrode and the output-stage second resonant electrode, and having an electric signal output point for producing output of an electric signal toward the external circuit, the one end of the input-stage first resonant electrode and the one end of the input-stage second resonant electrode being located on a same side, the one end of the output-stage first resonant electrode and the one end of the output-stage second resonant electrode being located on a same side, in the composite input coupling electrode as seen in its longitudinal direction, the electric signal input point and the input-side connection conductor being located at a part that lies nearer the other end of the input-stage first resonant electrode than a center of a part facing the input-stage first resonant electrode and also lies nearer the other end of the input-stage second resonant electrode than a center of a part facing the input-stage second resonant electrode, and in the composite output coupling electrode as seen in its longitudinal direction, the electric signal output point and the output-side connection conductor being located at a part that lies nearer the other end of the output-stage first resonant electrode than a center of a part facing the output-stage first resonant electrode and also lies nearer the other end of the output-stage second resonant electrode than a center of a part facing the output-stage second resonant electrode.

11. The bandpass filter of claim 10, further comprising:

a first annular ground electrode which is formed in an annular shape on the first interlayer so as to surround the plurality of first resonant electrodes and is connected with the one ends of, respectively, the plurality of first resonant electrodes; and a second annular ground electrode which is formed in an annular shape on the second interlayer so as to surround the plurality of second resonant electrodes and is connected with the one ends of, respectively, the plurality of second resonant electrodes.

12. he bandpass filter of claim 11, further comprising:

auxiliary resonant electrodes arranged on one or a plurality of interlayers other than the first interlayer of the multilayer body in correspondence with the plurality of first resonant electrodes, respectively, of which each is so placed as to have a region facing the first annular ground electrode and is connected to the other end side of the first resonant electrode by a through conductor.

13. he bandpass filter of claim 12, wherein, of the auxiliary resonant electrodes, an input-stage auxiliary resonant electrode connected to the input-stage first resonant electrode and an output-stage auxiliary resonant electrode connected to the output-stage first resonant electrode are arranged on one interlayer located on a same side as the third interlayer with respect to the first interlayer of the multilayer body, and wherein, on an interlayer other than the one interlayer and the first interlayer of the multilayer body, there are arranged:

an auxiliary input coupling electrode placed so as to have a region facing the input-stage auxiliary resonant electrode and connected to the electric signal input point of the composite input coupling electrode; and an auxiliary output coupling electrode placed so as to have a region facing the output-stage auxiliary resonant electrode and connected to the electric signal output point of the composite output coupling electrode.

14. The bandpass filter of claim 10, wherein the multilayer body comprises a first multilayer body and a second multilayer body placed thereon, and the first ground electrode is disposed on a lower face of the first multilayer body and the second ground electrode is disposed on an upper face of the second multilayer body, and wherein the first interlayer and the second interlayer are separately located in the first multilayer body and the second multilayer body, and the third interlayer or the fourth interlayer is located between the first multilayer body and the second multilayer body.

15. The bandpass filter of claim 10, wherein the plurality of first resonant electrodes are arranged side by side, with their one ends as well as the other ends displaced in relation to each other in a staggered manner, and wherein the plurality of second resonant electrodes are arranged side by side, with their one ends as well as the other ends displaced in relation to each other in a staggered manner.

16. The bandpass filter of claim 10, further comprising:

an input-side auxiliary connection conductor for providing connection between the first input coupling electrode and the second input coupling electrode, which is disposed on a side opposite from the first input-side connection conductor with respect to a center of a region where the first input coupling electrode and the second input coupling electrode face each other; and an output-side auxiliary connection conductor for providing connection between the first output coupling electrode and the second output coupling electrode, which is disposed on a side opposite from the first output-side connection conductor with respect to a center of a region where the first output coupling electrode and the second output coupling electrode face each other.

17. A wireless communication module comprising an RF section including the bandpass filter of claim 10; a baseband section connected to the RF section.

18. A wireless communication apparatus comprising an RF section including the bandpass filter of claim 10; a baseband section connected to the RF section; and an antenna connected to the RF section.

19. A bandpass filter comprising:

a multilayer body having a stack of a plurality of dielectric layers on top of each other;

a first ground electrode disposed on a lower face of the multilayer body;

a second ground electrode disposed on an upper face of the multilayer body;

four or more strip-like first resonant electrodes which are arranged side by side on a first interlayer of the multilayer body, with their one ends as well as the other ends displaced in relation to each other in a staggered manner, have their one ends connected to ground so as to serve as a quarter-wavelength resonator, and make electromagnetic-field coupling with each other;

four or more strip-like second resonant electrodes which are arranged side by side on a second interlayer of the multilayer body different from the first interlayer, with their one ends as well as the other ends displaced in relation to each other in a staggered manner, have their one ends connected to ground so as to serve as a quarter-wavelength resonator which resonates at a frequency higher than a frequency at which the first resonant electrode resonates, and make electromagnetic-field coupling with each other;

a strip-like input coupling electrode which is disposed on a third interlayer of the multilayer body located between the first interlayer and the second interlayer, faces an input-stage first resonant electrode of the four or more first resonant electrodes, over more than half of an entire longitudinal area thereof for electromagnetic-field coupling, faces an input-stage second resonant electrode of the four or more second resonant electrodes, over more than half of an entire longitudinal area thereof for electromagnetic-field coupling, and has an electric signal input point for receiving input of an electric signal from an external circuit;

a strip-like output coupling electrode which is disposed on the third interlayer of the multilayer body, faces an output-stage first resonant electrode of the four or more first resonant electrodes, over more than half of an entire longitudinal area thereof for electromagnetic-field coupling, faces an output-stage second resonant electrode of the four or more second resonant electrodes, over more than half of an entire longitudinal area thereof for electromagnetic-field coupling, and has an electric signal output point for producing output of an electric signal toward the external circuit; and a first resonant electrode coupling conductor which is disposed on a fourth interlayer of the multilayer body which is arranged on an opposite side of the third interlayer with the first interlayer interposed therebetween, has its one end connected to ground close to one end of a frontmost-stage first resonant electrode constituting a first resonant electrode group composed of adjoining first resonant electrodes, the sum of which is an even number greater than or equal to four, and has its other end connected to ground close to one end of a rearmost-stage first resonant electrode constituting the first resonant electrode group, and also includes a region facing the one end side of the frontmost-stage first resonant electrode for electromagnetic-field coupling and a region facing the one end side of the rearmost-stage first resonant electrode for electromagnetic-field coupling, the one end of the input-stage first resonant electrode and the one end of the input-stage second resonant electrode being located on a same side, the one end of the output-stage first resonant electrode and the one end of the output-stage second resonant electrode being located on a same side, in the input coupling electrode as seen in its longitudinal direction, the electric signal input point being disposed at a part that lies nearer the other end of the input-stage first resonant electrode than a center of a part facing the input-stage first resonant electrode and also lies nearer the other end of the input-stage second resonant electrode than a center of a part facing the input-stage second resonant electrode, and in the output coupling electrode as seen in its longitudinal direction, the electric signal output point being disposed at the part that lies nearer the other end of the output-stage first resonant electrode than a center of a part facing the output-stage first resonant electrode and also lies nearer the other end of the output-stage second resonant electrode than a center of the part facing the output-stage second resonant electrode.

20. A wireless communication module comprising an RF section including the bandpass filter of claim 19; a baseband section connected to the RF section.

21. A wireless communication apparatus comprising an RF section including the bandpass filter of claim 19; a baseband section connected to the RF section; and an antenna connected to the RF section.

22. bandpass filter comprising:

a multilayer body having a stack of a plurality of dielectric layers on top of each other;

a first ground electrode disposed on a lower face of the multilayer body;

a second ground electrode disposed on an upper face of the multilayer body;

four or more strip-like first resonant electrodes which are arranged side by side on a first interlayer of the multilayer body, with their one ends as well as the other ends displaced in relation to each other in a staggered manner, have their one ends connected to ground so as to serve as a quarter-wavelength resonator, and make electromagnetic-field coupling with each other;

four or more strip-like second resonant electrodes which are arranged side by side on a second interlayer of the multilayer body different from the first interlayer, with their one ends as well as the other ends displaced in relation to each other in a staggered manner, have their one ends connected to ground so as to serve as a quarter-wavelength resonator which resonates at a frequency higher than a frequency at which the first resonant electrode resonates, and make electromagnetic-field coupling with each other;

a strip-like input coupling electrode which is disposed on a third interlayer of the multilayer body located between .the first interlayer and the second interlayer, faces an input-stage first resonant electrode of the four or more first resonant electrodes, over more than half of an entire longitudinal area thereof for electromagnetic-field coupling, faces an input-stage second resonant electrode of the four or more second resonant electrodes, over more than half of an entire longitudinal area thereof for electromagnetic-field coupling, and has an electric signal input point for receiving input of an electric signal from an external circuit;

a strip-like output coupling electrode which is disposed on the third interlayer of the multilayer body, faces an output-stage first resonant electrode of the four or more first resonant electrodes, over more than half of an entire longitudinal area thereof for electromagnetic-field coupling, faces an output-stage second resonant electrode of the four or more second resonant electrodes, over more than half of an entire longitudinal area thereof for electromagnetic-field coupling, and has an electric signal output point for producing output of an electric signal toward the external circuit; and a second resonant electrode coupling conductor which is disposed on a fifth interlayer of the multilayer body which is arranged on an opposite side of the third interlayer with the second interlayer interposed therebetween, has its one end connected to ground close to one end of a frontmost-stage second resonant electrode constituting a second resonant electrode group composed of adjoining second resonant electrodes, the sum of which is an even number greater than or equal to four, and has its other end connected to ground close to one end of a rearmost-stage second resonant electrode constituting the second resonant electrode group, and also includes a region facing the one end side of the frontmost-stage second resonant electrode for electromagnetic-field coupling and a region facing the one end side of the rearmost-stage second resonant electrode for electromagnetic-field coupling, the one end of the input-stage first resonant electrode and the one end of the input-stage second resonant electrode being located on a same side, the one end of the output-stage first resonant electrode and the one end of the output-stage second resonant electrode being located on a same side, in the input coupling electrode as seen in its longitudinal direction, the electric signal input point being disposed at a part that lies nearer the other end of the input-stage first resonant electrode than a center of a part facing the input-stage first resonant electrode and also lies nearer the other end of the input-stage second resonant electrode than a center of a part facing the input-stage second resonant electrode, and in the output coupling electrode as seen in its longitudinal direction, the electric signal output point being disposed at a part that lies nearer the other end of the output-stage first resonant electrode than a center of a part facing the output-stage first resonant electrode and also lies nearer the other end of the output-stage second resonant electrode than a center of a part facing the output-stage second resonant electrode.

23. A wireless communication module comprising an RF section including the bandpass filter of claim 22; a baseband section connected to the RF section.

24. A wireless communication apparatus comprising an RF section including the bandpass filter of claim 22; a baseband section connected to the RF section; and an antenna connected to the RF section.

* * * * *